United States Patent
Yu et al.

(10) Patent No.: US 9,082,673 B2
(45) Date of Patent: Jul. 14, 2015

(54) PASSIVATED UPSTANDING NANOSTRUCTURES AND METHODS OF MAKING THE SAME

(75) Inventors: Young-June Yu, Cranbury, NJ (US); Munib Wober, Topsfield, MA (US)

(73) Assignee: ZENA TECHNOLOGIES, INC., Cambridge, MA (US)

( * ) Notice: Subject to any disclaimer, the term of this patent is extended or adjusted under 35 U.S.C. 154(b) by 0 days.

(21) Appl. No.: 13/106,851

(22) Filed: May 12, 2011

(65) Prior Publication Data

US 2011/0315988 A1 Dec. 29, 2011

Related U.S. Application Data

(63) Continuation-in-part of application No. 12/573,582, filed on Oct. 5, 2009, now Pat. No. 8,791,470, and a continuation-in-part of application No. 12/575,221, filed on Oct. 7, 2009, now Pat. No. 8,384,007, and a (Continued)

(51) Int. Cl.
*H01L 31/105* (2006.01)
*H01L 27/14* (2006.01)
*H01L 27/144* (2006.01)
*H01L 27/15* (2006.01)
*H01L 33/06* (2010.01)

(52) U.S. Cl.
CPC ............ *H01L 27/14* (2013.01); *H01L 27/1446* (2013.01); *H01L 31/105* (2013.01); *H01L 31/1055* (2013.01); *H01L 27/156* (2013.01); *H01L 33/06* (2013.01)

(58) Field of Classification Search
CPC .......................... H01L 31/105; H01L 31/1055

USPC .................. 257/82, 458, E31.047, E31.004, 257/E31.061, E31.062; 977/813
See application file for complete search history.

(56) References Cited

U.S. PATENT DOCUMENTS

| | | | |
|---|---|---|---|
| 1,918,848 | A | 4/1929 | Land |
| 3,903,427 | A | 9/1975 | Pack |
| 4,017,332 | A | 4/1977 | James |
| 4,316,048 | A | 2/1982 | Woodall |
| 4,357,415 | A | 11/1982 | Hartman |
| 4,387,265 | A | 6/1983 | Dalal |
| 4,400,221 | A | 8/1983 | Rahilly |
| 4,443,890 | A | 4/1984 | Eumurian |

(Continued)

FOREIGN PATENT DOCUMENTS

| | | |
|---|---|---|
| CN | 101459185 | 6/2009 |
| CN | 100568516 | 12/2009 |

(Continued)

OTHER PUBLICATIONS

International Preliminary Report on Patentability mailed Dec. 23, 2011, for PCT/US10/51435.

(Continued)

*Primary Examiner* — Robert Huber
(74) *Attorney, Agent, or Firm* — Pillsbury Winthrop Shaw Pittman LLP

(57) ABSTRACT

Described herein is a device comprising: a substrate; one or more of a nanostructure extending essentially perpendicularly from the substrate; wherein the nanostructure comprises a core of a doped semiconductor, an first layer disposed on the core, and a second layer of an opposite type from the core and disposed on the first layer.

12 Claims, 66 Drawing Sheets

Related U.S. Application Data continuation-in-part of application No. 12/633,323, filed on Dec. 8, 2009, now Pat. No. 8,735,797, and a continuation-in-part of application No. 12/633,318, filed on Dec. 8, 2009, now Pat. No. 8,519,379, and a continuation-in-part of application No. 12/633,313, filed on Dec. 8, 2009, and a continuation-in-part of application No. 12/633,305, filed on Dec. 8, 2009, now Pat. No. 8,299,472, and a continuation-in-part of application No. 12/982,269, filed on Dec. 30, 2010, and a continuation-in-part of application No. 12/966,573, filed on Dec. 13, 2010, now Pat. No. 8,866,065, and a continuation-in-part of application No. 12/967,880, filed on Dec. 14, 2010, now Pat. No. 8,748,799, and a continuation-in-part of application No. 12/974,499, filed on Dec. 21, 2010, now Pat. No. 8,507,840, and a continuation-in-part of application No. 12/945,492, filed on Nov. 12, 2010, and a continuation-in-part of application No. 13/047,392, filed on Mar. 14, 2011, now Pat. No. 8,835,831, and a continuation-in-part of application No. 13/048,635, filed on Mar. 15, 2011, now Pat. No. 8,835,905.

(56) References Cited

U.S. PATENT DOCUMENTS

| | | |
|---|---|---|
| 4,513,168 A | 4/1985 | Borden |
| 4,620,237 A | 10/1986 | Traino |
| 4,678,772 A | 7/1987 | Segal et al. |
| 4,827,335 A | 5/1989 | Saito |
| 4,846,556 A | 7/1989 | Haneda |
| 4,880,613 A | 11/1989 | Satoh |
| 4,896,941 A | 1/1990 | Hayashi |
| 4,950,625 A | 8/1990 | Nakashima |
| 4,971,928 A | 11/1990 | Fuller |
| 4,972,244 A | 11/1990 | Buffet |
| 5,071,490 A | 12/1991 | Yokota |
| 5,081,049 A | 1/1992 | Green |
| 5,096,520 A | 3/1992 | Faris |
| 5,124,543 A | 6/1992 | Kawashima |
| 5,247,349 A | 9/1993 | Olego |
| 5,272,518 A | 12/1993 | Vincent |
| 5,311,047 A | 5/1994 | Chang |
| 5,347,147 A | 9/1994 | Jones |
| 5,362,972 A | 11/1994 | Yazawa |
| 5,374,841 A | 12/1994 | Goodwin |
| 5,391,896 A | 2/1995 | Wanlass |
| 5,401,968 A | 3/1995 | Cox |
| 5,449,626 A | 9/1995 | Hezel |
| 5,468,652 A | 11/1995 | Gee |
| 5,602,661 A | 2/1997 | Schadt |
| 5,612,780 A | 3/1997 | Rickenbach |
| 5,671,914 A | 9/1997 | Kalkhoran |
| 5,696,863 A | 12/1997 | Kleinerman |
| 5,723,945 A | 3/1998 | Schermerhorn |
| 5,747,796 A | 5/1998 | Heard |
| 5,767,507 A | 6/1998 | Unlu |
| 5,798,535 A | 8/1998 | Huang |
| 5,844,290 A | 12/1998 | Furumiya |
| 5,853,446 A | 12/1998 | Carre |
| 5,857,053 A | 1/1999 | Kane |
| 5,877,492 A | 3/1999 | Fujieda |
| 5,880,495 A | 3/1999 | Chen |
| 5,885,881 A | 3/1999 | Ojha |
| 5,900,623 A | 5/1999 | Tsang et al. |
| 5,943,463 A | 8/1999 | Unuma |
| 5,968,528 A | 10/1999 | Deckner et al. |
| 6,033,582 A | 3/2000 | Lee |
| 6,037,243 A | 3/2000 | Ha et al. |
| 6,046,466 A | 4/2000 | Ishida et al. |
| 6,074,892 A | 6/2000 | Bowers et al. |
| 6,100,551 A | 8/2000 | Lee |
| 6,270,548 B1 | 8/2001 | Campbell |
| 6,301,420 B1 | 10/2001 | Greenaway |
| 6,326,649 B1 | 12/2001 | Chang |
| 6,388,243 B1 | 5/2002 | Berezin |
| 6,388,648 B1 | 5/2002 | Clifton |
| 6,407,439 B1 | 6/2002 | Hier |
| 6,459,034 B2 | 10/2002 | Muramoto et al. |
| 6,463,204 B1 | 10/2002 | Ati |
| 6,542,231 B1 | 4/2003 | Garrett |
| 6,563,995 B2 | 5/2003 | Kane |
| 6,566,723 B1 | 5/2003 | Vook |
| 6,680,216 B2 | 1/2004 | Kwasnick et al. |
| 6,709,929 B2 | 3/2004 | Zhang |
| 6,720,594 B2 | 4/2004 | Rahn |
| 6,771,314 B1 | 8/2004 | Bawolek |
| 6,805,139 B1 | 10/2004 | Savas |
| 6,812,473 B1 | 11/2004 | Amemiya |
| 6,904,187 B2 | 6/2005 | Fischer et al. |
| 6,927,145 B1 | 8/2005 | Yang |
| 6,960,526 B1 | 11/2005 | Shah |
| 6,967,120 B2 | 11/2005 | Jang |
| 6,969,899 B2 | 11/2005 | Yaung |
| 6,987,258 B2 | 1/2006 | Mates |
| 6,996,147 B2 | 2/2006 | Majumdar |
| 7,052,927 B1 | 5/2006 | Fletcher |
| 7,064,372 B2 | 6/2006 | Duan |
| 7,105,428 B2 | 9/2006 | Pan |
| 7,106,938 B2 | 9/2006 | Baek et al. |
| 7,109,517 B2 | 9/2006 | Zaidi |
| 7,153,720 B2 | 12/2006 | Augusto |
| 7,163,659 B2 | 1/2007 | Stasiak |
| 7,192,533 B2 | 3/2007 | Bakkers |
| 7,208,783 B2 | 4/2007 | Palsule |
| 7,230,286 B2 | 6/2007 | Cohen |
| 7,235,475 B2 | 6/2007 | Kamins |
| 7,241,434 B2 | 7/2007 | Anthony |
| 7,253,017 B1 | 8/2007 | Roscheisen |
| 7,254,151 B2 | 8/2007 | Lieber |
| 7,262,400 B2 | 8/2007 | Yaung |
| 7,265,328 B2 | 9/2007 | Mouli |
| 7,272,287 B2 | 9/2007 | Bise |
| 7,285,812 B2 | 10/2007 | Tang et al. |
| 7,306,963 B2 | 12/2007 | Linden |
| 7,307,327 B2 | 12/2007 | Bahl |
| 7,311,889 B2 | 12/2007 | Awano |
| 7,330,404 B2 | 2/2008 | Peng |
| 7,335,962 B2 | 2/2008 | Mouli |
| 7,336,860 B2 | 2/2008 | Cyr |
| 7,358,583 B2 | 4/2008 | Reznik |
| 7,381,966 B2 | 6/2008 | Starikov |
| 7,388,147 B2 | 6/2008 | Mulligan |
| 7,416,911 B2 | 8/2008 | Heath et al. |
| 7,446,025 B2 | 11/2008 | Cohen |
| 7,462,774 B2 | 12/2008 | Roscheisen |
| 7,471,428 B2 | 12/2008 | Ohara |
| 7,491,269 B2 | 2/2009 | Legagneux |
| 7,507,293 B2 | 3/2009 | Li |
| 7,521,322 B2 | 4/2009 | Tang et al. |
| 7,524,694 B2 | 4/2009 | Adkisson |
| 7,582,857 B2 | 9/2009 | Gruev |
| 7,598,482 B1 | 10/2009 | Verhulst |
| 7,622,367 B1 | 11/2009 | Nuzzo |
| 7,626,685 B2 | 12/2009 | Jin |
| 7,646,138 B2 | 1/2010 | Williams |
| 7,646,943 B1 | 1/2010 | Wober |
| 7,647,695 B2 | 1/2010 | MacNutt |
| 7,649,665 B2 | 1/2010 | Kempa et al. |
| 7,655,860 B2 | 2/2010 | Parsons |
| 7,663,202 B2 | 2/2010 | Wang et al. |
| 7,692,860 B2 | 4/2010 | Sato et al. |
| 7,704,806 B2 | 4/2010 | Chae |
| 7,713,779 B2 | 5/2010 | Firon |
| 7,719,678 B2 | 5/2010 | Kamins |
| 7,719,688 B2 | 5/2010 | Kamins |
| 7,732,769 B2 | 6/2010 | Snider |
| 7,732,839 B2 | 6/2010 | Sebe |
| 7,736,954 B2 | 6/2010 | Hussain |
| 7,740,824 B2 | 6/2010 | Godfried |
| 7,888,155 B2 | 2/2011 | Chen |
| 7,902,540 B2 | 3/2011 | Cohen |

(56) References Cited

U.S. PATENT DOCUMENTS

| | | |
|---|---|---|
| 7,948,555 B2 | 5/2011 | Kwon et al. |
| 8,030,729 B2 | 10/2011 | Quitoriano |
| 8,035,184 B1 | 10/2011 | Dutta et al. |
| 8,049,203 B2 | 11/2011 | Samuelson |
| 8,063,450 B2 | 11/2011 | Wernersson et al. |
| 8,067,299 B2 | 11/2011 | Samuelson |
| 8,084,728 B2 | 12/2011 | Tsang |
| 8,093,675 B2 | 1/2012 | Tsunemi et al. |
| 8,118,170 B2 | 2/2012 | Sato |
| 8,143,658 B2 | 3/2012 | Samuelson |
| 8,154,127 B1 | 4/2012 | Kamins |
| 8,193,524 B2 | 6/2012 | Bjoerk |
| 8,208,776 B2 | 6/2012 | Tokushima |
| 8,212,138 B2 | 7/2012 | Landis |
| 8,222,705 B2 | 7/2012 | Ogino |
| 8,242,353 B2 | 8/2012 | Karg |
| 8,269,985 B2 | 9/2012 | Wober |
| 8,274,039 B2 | 9/2012 | Wober |
| 8,299,472 B2 | 10/2012 | Yu et al. |
| 8,330,090 B2 | 12/2012 | Agarwal |
| 8,384,007 B2 | 2/2013 | Yu et al. |
| 8,455,857 B2 | 6/2013 | Samuelson |
| 8,471,190 B2 | 6/2013 | Wober |
| 8,546,742 B2 | 10/2013 | Wober |
| 8,835,831 B2 | 9/2014 | Yu et al. |
| 2002/0003201 A1 | 1/2002 | Yu |
| 2002/0020846 A1 | 2/2002 | Pi et al. |
| 2002/0021879 A1 | 2/2002 | Lee |
| 2002/0071468 A1 | 6/2002 | Sandstrom |
| 2002/0104821 A1 | 8/2002 | Bazylenko |
| 2002/0109082 A1 | 8/2002 | Nakayama |
| 2002/0117675 A1 | 8/2002 | Mascarenhas |
| 2002/0130311 A1 | 9/2002 | Lieber |
| 2002/0172820 A1 | 11/2002 | Majumdar |
| 2003/0003300 A1 | 1/2003 | Korgel |
| 2003/0006363 A1 | 1/2003 | Campbell |
| 2003/0077907 A1 | 4/2003 | Kao et al. |
| 2003/0089899 A1 | 5/2003 | Lieber |
| 2003/0103744 A1 | 6/2003 | Koyama |
| 2003/0132480 A1 | 7/2003 | Chau |
| 2003/0160176 A1 | 8/2003 | Vispute |
| 2003/0189202 A1 | 10/2003 | Li |
| 2003/0227090 A1 | 12/2003 | Okabe |
| 2004/0021062 A1 | 2/2004 | Zaidi |
| 2004/0026684 A1 | 2/2004 | Empedocles |
| 2004/0058058 A1 | 3/2004 | Shchegolikhin |
| 2004/0065362 A1 | 4/2004 | Watabe |
| 2004/0075464 A1 | 4/2004 | Samuelson |
| 2004/0095658 A1 | 5/2004 | Buretea et al. |
| 2004/0109666 A1 | 6/2004 | Kim |
| 2004/0114847 A1 | 6/2004 | Fischer et al. |
| 2004/0118337 A1 | 6/2004 | Mizutani |
| 2004/0118377 A1 | 6/2004 | Bloms |
| 2004/0122328 A1 | 6/2004 | Wang |
| 2004/0124366 A1 | 7/2004 | Zeng |
| 2004/0155247 A1 | 8/2004 | Benthien |
| 2004/0156610 A1 | 8/2004 | Charlton et al. |
| 2004/0180461 A1 | 9/2004 | Yaung |
| 2004/0213307 A1 | 10/2004 | Lieber |
| 2004/0217086 A1 | 11/2004 | Kawashima |
| 2004/0223681 A1 | 11/2004 | Block |
| 2004/0241965 A1 | 12/2004 | Merritt |
| 2004/0252957 A1 | 12/2004 | Schmidt et al. |
| 2004/0261840 A1 | 12/2004 | Schmit |
| 2005/0009224 A1 | 1/2005 | Yang |
| 2005/0035381 A1 | 2/2005 | Holm |
| 2005/0082676 A1 | 4/2005 | Andry |
| 2005/0087601 A1 | 4/2005 | Gerst, III |
| 2005/0095699 A1 | 5/2005 | Miyauchi et al. |
| 2005/0109388 A1 | 5/2005 | Murakami |
| 2005/0116271 A1 | 6/2005 | Kato |
| 2005/0133476 A1 | 6/2005 | Islam |
| 2005/0161662 A1 | 7/2005 | Majumdar et al. |
| 2005/0164514 A1 | 7/2005 | Rauf |
| 2005/0190453 A1 | 9/2005 | Dobashi |
| 2005/0201704 A1 | 9/2005 | Ellwood |
| 2005/0218468 A1 | 10/2005 | Owen |
| 2005/0224707 A1 | 10/2005 | Guedj |
| 2005/0242409 A1 | 11/2005 | Yang |
| 2005/0284517 A1 | 12/2005 | Shinohara |
| 2006/0011362 A1 | 1/2006 | Tao |
| 2006/0027071 A1 | 2/2006 | Barnett |
| 2006/0038990 A1 | 2/2006 | Habib et al. |
| 2006/0113622 A1 | 6/2006 | Adkisson |
| 2006/0115230 A1 | 6/2006 | Komoguchi et al. |
| 2006/0121371 A1 | 6/2006 | Wu |
| 2006/0146323 A1 | 7/2006 | Bratkovski |
| 2006/0162766 A1 | 7/2006 | Gee |
| 2006/0180197 A1 | 8/2006 | Gui |
| 2006/0257071 A1 | 11/2006 | Bise |
| 2006/0260674 A1 | 11/2006 | Tran |
| 2006/0273262 A1 | 12/2006 | Sayag |
| 2006/0273389 A1 | 12/2006 | Cohen |
| 2006/0284118 A1 | 12/2006 | Asmussen |
| 2007/0012980 A1 | 1/2007 | Duan |
| 2007/0012985 A1 | 1/2007 | Stumbo |
| 2007/0023799 A1 | 2/2007 | Boettiger |
| 2007/0025504 A1 | 2/2007 | Tumer |
| 2007/0029545 A1 | 2/2007 | Striakhilev |
| 2007/0052050 A1 | 3/2007 | Dierickx |
| 2007/0076481 A1 | 4/2007 | Tennant |
| 2007/0082255 A1 | 4/2007 | Sun |
| 2007/0099292 A1 | 5/2007 | Miller |
| 2007/0104441 A1 | 5/2007 | Ahn et al. |
| 2007/0107773 A1 | 5/2007 | Fork |
| 2007/0108371 A1 | 5/2007 | Stevens |
| 2007/0114622 A1 | 5/2007 | Adkisson |
| 2007/0120254 A1 | 5/2007 | Hurkx et al. |
| 2007/0126037 A1 | 6/2007 | Ikeda |
| 2007/0137697 A1 | 6/2007 | Kempa |
| 2007/0138376 A1 | 6/2007 | Naughton |
| 2007/0138380 A1 | 6/2007 | Adkisson |
| 2007/0138459 A1 | 6/2007 | Wong |
| 2007/0139740 A1 | 6/2007 | Igura |
| 2007/0140638 A1 | 6/2007 | Yang |
| 2007/0145512 A1 | 6/2007 | Rhodes |
| 2007/0148599 A1 | 6/2007 | True |
| 2007/0152248 A1 | 7/2007 | Choi |
| 2007/0155025 A1 | 7/2007 | Zhang |
| 2007/0164270 A1 | 7/2007 | Majumdar |
| 2007/0170418 A1 | 7/2007 | Bowers |
| 2007/0172623 A1 | 7/2007 | Kresse |
| 2007/0187787 A1 | 8/2007 | Ackerson |
| 2007/0196239 A1 | 8/2007 | Vink |
| 2007/0200054 A1 | 8/2007 | Reznik |
| 2007/0205483 A1 | 9/2007 | Williams |
| 2007/0217754 A1 | 9/2007 | Sasaki |
| 2007/0228421 A1 | 10/2007 | Shioya et al. |
| 2007/0238265 A1 | 10/2007 | Kurashina |
| 2007/0238285 A1 | 10/2007 | Borden |
| 2007/0241260 A1 | 10/2007 | Jaeger |
| 2007/0246689 A1 | 10/2007 | Ge |
| 2007/0248958 A1 | 10/2007 | Jovanovich |
| 2007/0272828 A1 | 11/2007 | Xu |
| 2007/0278500 A1 | 12/2007 | Lin |
| 2007/0285378 A1 | 12/2007 | Lankhorst |
| 2007/0290193 A1 | 12/2007 | Tucker |
| 2007/0290265 A1 | 12/2007 | Augusto |
| 2008/0001498 A1 | 1/2008 | Muller |
| 2008/0006319 A1 | 1/2008 | Bettge |
| 2008/0029701 A1 | 2/2008 | Onozawa |
| 2008/0036038 A1 | 2/2008 | Hersee |
| 2008/0044984 A1 | 2/2008 | Hsieh |
| 2008/0047601 A1 | 2/2008 | Nag |
| 2008/0047604 A1* | 2/2008 | Korevaar et al. .............. 136/258 |
| 2008/0055451 A1 | 3/2008 | Kanbe |
| 2008/0073742 A1 | 3/2008 | Adkisson |
| 2008/0079022 A1 | 4/2008 | Yamamoto |
| 2008/0079076 A1 | 4/2008 | Sheen |
| 2008/0083963 A1 | 4/2008 | Hsu et al. |
| 2008/0088014 A1 | 4/2008 | Adkisson |
| 2008/0090401 A1 | 4/2008 | Bratkovski |
| 2008/0092938 A1 | 4/2008 | Majumdar |
| 2008/0096308 A1 | 4/2008 | Santori |

(56) References Cited

U.S. PATENT DOCUMENTS

| | | |
|---|---|---|
| 2008/0108170 A1 | 5/2008 | Adkisson |
| 2008/0116537 A1 | 5/2008 | Adkisson |
| 2008/0128760 A1 | 6/2008 | Jun |
| 2008/0145965 A1 | 6/2008 | Reznik |
| 2008/0149914 A1 | 6/2008 | Samuelson et al. |
| 2008/0149944 A1 | 6/2008 | Samuelson |
| 2008/0157253 A1 | 7/2008 | Starikov |
| 2008/0166883 A1 | 7/2008 | Liu et al. |
| 2008/0169017 A1 | 7/2008 | Korevaar |
| 2008/0169019 A1 | 7/2008 | Korevaar |
| 2008/0173615 A1 | 7/2008 | Kim |
| 2008/0178924 A1 | 7/2008 | Kempa |
| 2008/0188029 A1 | 8/2008 | Rhodes |
| 2008/0191278 A1 | 8/2008 | Maekawa |
| 2008/0191298 A1 | 8/2008 | Lin |
| 2008/0211945 A1 | 9/2008 | Hong |
| 2008/0218740 A1 | 9/2008 | Williams |
| 2008/0224115 A1 | 9/2008 | Bakkers |
| 2008/0225140 A1 | 9/2008 | Raynor |
| 2008/0233280 A1 | 9/2008 | Blanchet |
| 2008/0237568 A1 | 10/2008 | Kobayashi |
| 2008/0246020 A1 | 10/2008 | Kawashima |
| 2008/0246123 A1 | 10/2008 | Kamins |
| 2008/0248304 A1 | 10/2008 | Hanrath |
| 2008/0251780 A1 | 10/2008 | Li |
| 2008/0258747 A1 | 10/2008 | Kluth |
| 2008/0260225 A1 | 10/2008 | Szu |
| 2008/0264478 A1 | 10/2008 | Ahn |
| 2008/0266556 A1 | 10/2008 | Kamins |
| 2008/0271783 A1 | 11/2008 | Murakami |
| 2008/0277646 A1 | 11/2008 | Kim et al. |
| 2008/0283728 A1 | 11/2008 | Inoue |
| 2008/0283883 A1 | 11/2008 | Shim |
| 2008/0297281 A1 | 12/2008 | Ayazi |
| 2008/0311693 A1 | 12/2008 | Maxwell |
| 2008/0311712 A1 | 12/2008 | Anwar et al. |
| 2009/0001498 A1 | 1/2009 | Wang |
| 2009/0020150 A1 | 1/2009 | Atwater |
| 2009/0032687 A1 | 2/2009 | Lapstun |
| 2009/0046362 A1 | 2/2009 | Guo |
| 2009/0046749 A1 | 2/2009 | Mizuuchi |
| 2009/0050204 A1 | 2/2009 | Habib |
| 2009/0057650 A1 | 3/2009 | Lieber |
| 2009/0072145 A1 | 3/2009 | Peczalski et al. |
| 2009/0120498 A1 | 5/2009 | Yamazaki |
| 2009/0121136 A1 | 5/2009 | Gruss et al. |
| 2009/0127442 A1 | 5/2009 | Lee |
| 2009/0146198 A1 | 6/2009 | Joe |
| 2009/0151782 A1 | 6/2009 | Ko |
| 2009/0152664 A1 | 6/2009 | Klem |
| 2009/0153961 A1 | 6/2009 | Murakami et al. |
| 2009/0165844 A1 | 7/2009 | Dutta |
| 2009/0173976 A1 | 7/2009 | Augusto |
| 2009/0179225 A1 | 7/2009 | Fertig et al. |
| 2009/0179289 A1 | 7/2009 | Park |
| 2009/0188552 A1 | 7/2009 | Wang |
| 2009/0189144 A1 | 7/2009 | Quitoriano |
| 2009/0189145 A1 | 7/2009 | Wang et al. |
| 2009/0194160 A1 | 8/2009 | Chin |
| 2009/0199597 A1 | 8/2009 | Danley |
| 2009/0201400 A1 | 8/2009 | Zhang et al. |
| 2009/0206405 A1 | 8/2009 | Doyle |
| 2009/0224245 A1 | 9/2009 | Umezaki |
| 2009/0224349 A1 | 9/2009 | Gambino |
| 2009/0230039 A1 | 9/2009 | Hoenig et al. |
| 2009/0233445 A1 | 9/2009 | Lee |
| 2009/0242018 A1 | 10/2009 | Ahn |
| 2009/0243016 A1 | 10/2009 | Kawahara et al. |
| 2009/0244514 A1 | 10/2009 | Jin |
| 2009/0260687 A1 | 10/2009 | Park |
| 2009/0261438 A1 | 10/2009 | Choi |
| 2009/0266418 A1 | 10/2009 | Hu et al. |
| 2009/0266974 A1 | 10/2009 | Verhulst |
| 2009/0272423 A1 | 11/2009 | Niira |
| 2009/0278998 A1 | 11/2009 | El-Ghoroury et al. |
| 2009/0289320 A1 | 11/2009 | Cohen |
| 2009/0305454 A1 | 12/2009 | Cohen |
| 2010/0006817 A1 | 1/2010 | Ohlsson et al. |
| 2010/0019252 A1 | 1/2010 | Bratkovski et al. |
| 2010/0019296 A1 | 1/2010 | Cha |
| 2010/0019355 A1 | 1/2010 | Kamins |
| 2010/0025710 A1 | 2/2010 | Yamada |
| 2010/0078055 A1 | 4/2010 | Vidu |
| 2010/0090341 A1 | 4/2010 | Wan |
| 2010/0101633 A1 | 4/2010 | Park |
| 2010/0104494 A1 | 4/2010 | Meng |
| 2010/0110433 A1 | 5/2010 | Nedelcu et al. |
| 2010/0116976 A1 | 5/2010 | Wober |
| 2010/0126573 A1 | 5/2010 | Youtsey |
| 2010/0127153 A1 | 5/2010 | Agarwal |
| 2010/0132779 A1 | 6/2010 | Hong |
| 2010/0133986 A1 | 6/2010 | Kim et al. |
| 2010/0136721 A1 | 6/2010 | Song |
| 2010/0148221 A1 | 6/2010 | Yu |
| 2010/0163714 A1 | 7/2010 | Wober |
| 2010/0163941 A1 | 7/2010 | Jung |
| 2010/0178018 A1 | 7/2010 | Augusto |
| 2010/0186809 A1 | 7/2010 | Samuelson et al. |
| 2010/0187404 A1 | 7/2010 | Klem |
| 2010/0200065 A1 | 8/2010 | Choi |
| 2010/0207103 A1 | 8/2010 | Farrow |
| 2010/0218816 A1 | 9/2010 | Guha |
| 2010/0229939 A1 | 9/2010 | Shen |
| 2010/0230653 A1 | 9/2010 | Chen |
| 2010/0237454 A1 | 9/2010 | Fujisawa |
| 2010/0244108 A1 | 9/2010 | Kohnke et al. |
| 2010/0244169 A1 | 9/2010 | Maeda et al. |
| 2010/0249877 A1 | 9/2010 | Naughton |
| 2010/0258184 A1 | 10/2010 | Laughlin |
| 2010/0276572 A1 | 11/2010 | Iwabuchi |
| 2010/0277607 A1 | 11/2010 | Choi |
| 2010/0282314 A1 | 11/2010 | Coakley |
| 2010/0295019 A1 | 11/2010 | Wang et al. |
| 2010/0302440 A1 | 12/2010 | Wober |
| 2010/0304061 A1 | 12/2010 | Ye et al. |
| 2010/0308214 A1 | 12/2010 | Wober |
| 2010/0313952 A1 | 12/2010 | Coakley |
| 2010/0319763 A1 | 12/2010 | Park |
| 2010/0320444 A1 | 12/2010 | Dutta |
| 2011/0018424 A1 | 1/2011 | Takada |
| 2011/0036396 A1 | 2/2011 | Jayaraman |
| 2011/0037133 A1 | 2/2011 | Su et al. |
| 2011/0050042 A1 | 3/2011 | Choi et al. |
| 2011/0080508 A1 | 4/2011 | Katsuno et al. |
| 2011/0084212 A1 | 4/2011 | Clark |
| 2011/0127490 A1 | 6/2011 | Mi |
| 2011/0133060 A1 | 6/2011 | Yu et al. |
| 2011/0133160 A1 | 6/2011 | Yu et al. |
| 2011/0135814 A1 | 6/2011 | Miyauchi et al. |
| 2011/0139176 A1 | 6/2011 | Cheung et al. |
| 2011/0146771 A1 | 6/2011 | Chuang et al. |
| 2011/0147870 A1 | 6/2011 | Ang et al. |
| 2011/0180894 A1 | 7/2011 | Samuelson |
| 2011/0195577 A1 | 8/2011 | Kushibiki et al. |
| 2011/0226937 A1 | 9/2011 | Yu et al. |
| 2011/0248315 A1 | 10/2011 | Nam |
| 2011/0249219 A1 | 10/2011 | Evans |
| 2011/0249322 A1 | 10/2011 | Wang |
| 2011/0253982 A1 | 10/2011 | Wang et al. |
| 2011/0272014 A1* | 11/2011 | Mathai et al. ............... 136/255 |
| 2011/0297214 A1 | 12/2011 | Kim |
| 2011/0309237 A1 | 12/2011 | Seo et al. |
| 2011/0309240 A1 | 12/2011 | Yu |
| 2011/0309331 A1 | 12/2011 | Yu |
| 2011/0315988 A1 | 12/2011 | Yu et al. |
| 2011/0316106 A1 | 12/2011 | Kim |
| 2012/0009714 A1 | 1/2012 | Mouli |
| 2012/0014837 A1 | 1/2012 | Fehr et al. |
| 2012/0029328 A1 | 2/2012 | Shimizu |
| 2012/0075513 A1 | 3/2012 | Chipman et al. |
| 2012/0153124 A1 | 6/2012 | Yu |
| 2012/0196383 A1 | 8/2012 | Nitkowski et al. |
| 2012/0196401 A1 | 8/2012 | Graham |
| 2012/0240999 A1 | 9/2012 | Yoshida |

(56) References Cited

U.S. PATENT DOCUMENTS

| | | |
|---|---|---|
| 2012/0258563 A1 | 10/2012 | Ogino |
| 2012/0298843 A1 | 11/2012 | Yu |
| 2012/0318336 A1 | 12/2012 | Hekmatshoar-Tabari et al. |
| 2012/0322164 A1 | 12/2012 | Lal |
| 2013/0000704 A1 | 1/2013 | Fogel |
| 2013/0020620 A1 | 1/2013 | Wober |
| 2013/0038710 A1 | 2/2013 | Platzer |
| 2013/0112256 A1 | 5/2013 | Yu |
| 2013/0174904 A1 | 7/2013 | Yamasaki |
| 2013/0220406 A1 | 8/2013 | Day |
| 2014/0045209 A1 | 2/2014 | Chou |

FOREIGN PATENT DOCUMENTS

| | | |
|---|---|---|
| CN | 101675522 | 3/2010 |
| EP | 0809303 B1 | 9/2006 |
| GB | 2348399 A | 4/2000 |
| JP | 359013708 A | 1/1984 |
| JP | 59198413708 | 1/1984 |
| JP | 2000324396 | 11/2000 |
| JP | 2002151715 | 5/2002 |
| JP | 2005252210 | 9/2005 |
| JP | 2007134562 | 5/2007 |
| JP | 2007152548 | 6/2007 |
| JP | 2007520877 | 7/2007 |
| JP | 2007201091 | 8/2007 |
| JP | 2007317961 | 12/2007 |
| JP | 2008288585 | 11/2008 |
| JP | 2009506546 | 2/2009 |
| TW | I228782 | 3/2005 |
| TW | 200742115 | 4/2007 |
| TW | 200810100 | 2/2008 |
| TW | 200845402 | 11/2008 |
| TW | 200915551 | 4/2009 |
| WO | 8603347 | 6/1986 |
| WO | 0002379 | 1/2000 |
| WO | 03107439 A1 | 12/2003 |
| WO | 2005064337 | 7/2005 |
| WO | 2008069565 | 6/2008 |
| WO | 2008079076 | 7/2008 |
| WO | 2008131313 | 10/2008 |
| WO | 2008135905 | 11/2008 |
| WO | 2008135905 A3 | 11/2008 |
| WO | 2008143727 | 11/2008 |
| WO | 2009116018 | 9/2009 |
| WO | 2009137241 | 11/2009 |
| WO | 2010019887 | 2/2010 |
| WO | 2010039631 | 4/2010 |
| WO | 2011074457 | 6/2011 |
| WO | 2011074459 | 6/2011 |

OTHER PUBLICATIONS

International Search Report and Written Opinion for PCT International Patent Application No. PCT/US2011/060348, mailed Mar. 9, 2012.
International Search Report and Written Opinion for PCT International Patent Application No. PCT/US2011/064635, mailed Apr. 13, 2012.
International Search Report and Written Opinion for PCT International Patent Application No. PCT/US2011/066097, mailed Mar. 12, 2012.
International Search Report and Written Opinion for PCT International Patent Application No. PCT/US2011/067712, mailed May 3, 2012.
International Preliminary Report and Written Opinion re PCT/US2010/059491, mailed Jun. 21, 2012.
International Search Report and Written Opinion re PCT/US2011/57325, mailed Jun. 22, 2012.
International Preliminary Report and Written Opinion re PCT/US2010/059468, mailed Jun. 21, 2012.
International Preliminary Report and Written Opinion re PCT/US2010/059504, mailed Jun. 21, 2012.
International Preliminary Report and Written Opinion re PCT/US2010/059496, mailed Jun. 21, 2012.
U.S. Office Action for U.S. Appl. No. 12/573,582, dated Jun. 28, 2012.
William Shockley and H. Queisser, Detailed Balance Limit of Efficiency of p-n. Junction Solar Cells, J. of Appl. Physics, Mar. 1961, 32(3).
International Preliminary Report on Patentability for PCT International Application No. PCT/US2010/035722, mailed Nov. 3, 2011.
U.S. Office Action for U.S. Appl. No. 13/494,661, notification date Nov. 7, 2012.
U.S. Office Action for U.S. Appl. No. 13/048,635, mailed Jun. 6, 2013, 24 pages.
U.S. Office Action for U.S. Appl. No. 12/966,535, mailed Jun. 14, 2013, 22 pages.
U.S. Office Action for U.S. Appl. No. 13/966,573, dated Aug. 6, 2013, 13 pages.
U.S. Office Action for U.S. Appl. No. 12/966,514, dated Aug. 15, 2013, 17 pages.
U.S. Office Action for U.S. Appl. No. 12/633,313, dated Aug. 1, 2013, 20 pages.
International Preliminary Search Report on Patentability of PCT/US201-057325, mailed May 2, 2013.
Taiwanese Office Action of Taiwan Patent Application No. 099116881, issued Jul. 18, 2013 (8 pages).
Canadian Office Action of Canadian Application No. 3,676,376, dated Oct. 11, 2013.
Catrysse, et al., An Integrated Color Pixel in 0.18pm CMOS Technology, Proceedings IEDM 2001, pp. 559-562.
Choi et al., Optimization of sidewall roughness in silica waveguides to reduce propagation losses, May 2001, Lasers and Electro-Optics, 2001. CLEO '01. Technical Digest. Summaries of papers presented at the Conference on, pp. 175-176.
Geyer et al., Model for the Mass Transport during Metal-Assisted Chemical Etching with Contiguous Metal Films as Catalysts, J. Phys. Chem. C 2012, 116, 13446-13451.
Hopkins, Addressing sidewall roughness using dry etching silicon and Si02, Jul. 1, 2004, ElectroIQ, vol. 47, Issue 7.
Mei-Ling Kuo et al. "Realization of a near-perfect antireflection coating for silicon solar energy utilization" (Nov. 1, 2008, vol. 33, No. 21, Optics Letters).
Mukhopadhyay, When PDMS Isn't the Best, American Chemical Society, May 1, 2007.
Seo, et. al., "Multicolored vertical silicon nanowires," Nano Letters, vol. 11 issue 4, pp. 1851-1856, 2010.
U.S. Final Office Action for U.S. Appl. No. 12/966,514, mailed Mar. 19, 2013, 50 pages.
U.S. Final Office Action for U.S. Appl. No. 13/494,661, mailed Mar. 7, 2013, 10 pages.
Office Action issued on Jan. 28, 2014 in Taiwanese Application No. 100146327.
Office Action issued on Mar. 17, 2014 in Korean Application No. 10-2013-7018243.
U.S. Office Action for U.S. Appl. No. 12/910,664, mailed Feb. 26, 2014.
U.S. Office Action for U.S. Appl. No. 12/966,514, mailed Feb. 25, 2014.
U.S. Office Action for U.S. Appl. No. 12/945,492 mailed May 13, 2014.
U.S. Office Action for U.S. Appl. No. 12/966,514 mailed Sep. 23, 2014.
Berstein et al., "Modern Physics", Chapter 14, Section 6, pp. 420-421, 2000, Prentice-Hall, Inc.
University of California San Diego, Class ECE 183 Lab 1, 2013.
U.S. Office Action for U.S. Appl. No. 12/633,313 mailed Aug. 1, 2014.
U.S. Office Action for U.S. Appl. No. 13/693,207 mailed Oct. 9, 2014.
Deptuch et al., Vertically Integrated Circuits at Fermilab, IEEE Transactions on Nuclear Science, Aug. 2010, vol. 54, Issue 4, pp. 2178-2186.

(56) References Cited

OTHER PUBLICATIONS

Gadelrab et al., The Source-Gated Amorphous Silicon Photo-Transistor, IEEE Transactions on Electron Devices, Oct. 1997, vol. 44, No. 10, pp. 1789-1794.

Guillaumée, et al., Polarization Sensitive Silicon Photodiodes Using Nanostructured Metallic Grids, Applied Physics Letters 94, 2009.

Junger, et. al., Polarization- and wavelength-sensitive sub-wavelength structures fabricated in the metal layers of deep submicron CMOS processes, Proc. of SPIE, vol. 7712, 2010.

Lin et al., Reducing Dark Current in a High-Speed Si-Based Interdigitated Trench-Electrode MSM Photodetector, IEEE Transactions on Electron Devices, May 2003, vol. 50, No. 5, pp. 1306-1313.

Loose et al., CMOS Detector Technology, Scientific Detector Workshop, Sicily, 2005, Experimental Astronomy, vol. 19, Issue 1-3, pp. 111-134.

Sarkar et. al., Integrated polarization-analyzing CMOS image sensor for detecting incoming light ray direction, Sensors Application Symposium (SAS) p. 194-199, 1010 IEEE, 2010.

Ye et al., Fabrication Techniques of High Aspect Ratio Vertical Lightpipes Using a Dielectric Photo Mask, SPIE, Proceedings, Feb. 2010, vol. 7591.

CMOS image sensor pixel microlens array optimization using FDTD Solutions, http://www.lumerical_com/ fdtd_microlens/cmos_image_sensor_pixel_microlens.php, pp. 1-2, Jun. 25, 2008.

"CMOS image sensor pixel optical efficiency and optical crosstalk optimization using FDTD Solutions" www.lumerical.com/fdtd_microlens/cmos_image_sensor_pixel_microlens.php, Mar. 19, 2009.

Adler, Nanowire Lawns Make for Sheets of Image Sensors, NewScientist.com, Jul. 28, 2008.

Babinec et al., High-Flux, Low-Power Diamond Nanowire Single-Photon Source Arrays: An Enabling Material for Optical and Quantum Computing and Cryptography, obtained on Jul. 22, 2010 at URL: <http://otd.harvard.edu/technologies/tech.php?case=3702>.

Baillie et al., 'Zero-space microlenses for CMOS image sensors: optical modeling and lithographic process development', Publication Date May 2004, http://adsabs.harvard.edu/abs/2004SPIE.5377.. 953B, pp. 1-2.vbTab.

Barclay et al., Chip-Based Microcavities Coupled to NV Centers in Single Crystal Diamond, Applied Physics Letters, Nov. 12, 2009, vol. 95, Issue 19.

Brouri et al., Photon Antibunching in the Flurescence of Individual Colored Centers in Diamond, Optics Letters, Sep. 1, 2000, vol. 25, Issue 17.

Chung, Sung-Wook et al. Silicon Nanowire Devices. Applied Physics Letters, vol., 76, No. 15 (Apr. 10, 2000), pp. 2068-2070.

Ekroll, On the Nature of Simultaneous Color Contrast, Dissertation, University of Kiel, 2005.

Fan et al., Large-Scale, Heterogeneous Integration of Nanowire Arrays for Image Sensor Circuitry, Proceedings of the National Academy of Sciences (PNAS) of the United States of America, Aug. 12, 2008, vol. 105, No. 32.

Fang et al., Fabrication of Slantingly-Aligned Silicon Nanowire Arrays for Solar Cell Applications, Nanotechnology, 2008, vol. 19, No. 25.

Furumiya, et al. "High-sensitivity and no-crosstalk pixel technology for embedded CMOS image sensor"; IEEE Electron Device Letters, vol. 48, No. 10, Oct. 2001.

Gambino et al., 'CMOS Imager with Copper Wiring and Lightpipe,' Electron Devices Meeting, 2006. IEDM '06, International Publication Date: Dec. 11-13, 2006, pp. 1-4.

Garnett et al., Light Trapping in Silicon Nanowire Solar Cells, Nanoletters, Jan. 28, 2010, vol. 10, No. 3, pp. 1082-1087.

Ge et al., Orientation-Controlled Growth of Single-Crystal Silicon-Nanowire Arrays, Advanced Materials, Jan. 18, 2005, vol. 17, No. 1, pp. 56-61.

Hanrath et al., Nucleation and Growth of Germanium Nanowires Seeded by Organic Monolayer-Coated Gold Nanocrystals, J. Am. Chem. Soc., Feb. 20, 2002, vol. 124, No. 7, pp. 1424-1429.

Hanrath et al., Supercritical Fluid-Liquid-Solid (SFLS) Synthesis of Si and Ge Nanowires Seeded by Colloidal Metal Nanocrystals, Advanced Materials, Mar. 4, 2003, vol. 15, No. 5, pp. 437-440.

Hochbaum et al., Controlled Growth of Si Nanowire Arrays for Device Integration, Nano Letters, Mar. 2005, vol. 5, No. 3, pp. 457-460.

Holmes et al., Control of Thickness and Orientation of Solution-Grown Silicon Nanowires, Science, Feb. 25, 2000, vol. 287, No. 5457, pp. 1471-1473.

International Preliminary Report on Patentability for PCT International Patent Application No. PCT/U62009/055963, mailed Mar. 17, 2011.

International Search Report and Written Opinion for PCT International Application No. PCT/US2010/035722, mailed Jul. 20, 2010.

International Search Report and Written Opinion for PCT International Application No. PCT/US2010/035726, mailed Jul. 21, 2010.

International Search Report and Written Opinion for PCT International Application No. PCT/US2010/057227, mailed Jan. 26, 2011.

International Search Report and Written Opinion for PCT International Patent Application No. PCT/US2009/055963, mailed Oct. 15, 2009.vbTab.

International Search Report and Written Opinion for PCT International Patent Application No. PCT/US2010/035727, mailed Sep. 27, 2010.

International Search Report and Written Opinion for PCT International Patent Application No. PCT/US2010/051435, mailed Dec. 3, 2010.

International Search Report and Written Opinion for PCT International Patent Application No. PCT/US2010/059468, mailed Feb. 11, 2011.

International Search Report and Written Opinion for PCT International Patent Application No. PCT/US2010/059491, mailed Feb. 9, 2011.

International Search Report and Written Opinion for PCT International Patent Application No. PCT/US2010/059501, mailed Feb. 15, 2011.

International Search Report and Written Opinion for PCT International Patent Application No. PCT/US2010/059504, mailed Apr. 7, 2011.

Jin-Kon Kim; 'New Functional Nanomaterials Based on Block Copolymers' http://www.ziu.edu.cn/adver/subjectizyhd/jz0707061313.html, Jun. 4, 2009.

Juan et al., High Aspect Ratio Polymide Etching Using an Oxygen Plasma Generated by Electron Cyclotron Resonance Source, Journal of Vacuum Science and Technology, Jan./Feb. 1994, vol. 12, No. 1., pp. 422-426.

Kalkofen et al., Atomic Layer Deposition of Boron Oxide As Dopant Source for Shallow Doping of Silicon, Meeting Abstract 943, 217th ECS Meeting, MA2010-01, Apr. 25-30, 2010, Vancouver Canada, EI-Advanced Gate Stack, Source / Drain, and Channel Engineering for Si-Based CMOS 6: New Materials, Processes, and Equipment.

Kane, Why Nanowires Make Great Photodetectors, EurekAlert.com article, Apr. 25, 2007.

Kempa, Thomas J. et al. Single and Tandem Axial p-i-n Nanowire Photovoltaic Devices. Nano Letters. 2008, vol. 8, No. 10, 3456-3460.

Kim et al., Electronic Structure of Vertically Aligned Mn-Doped CoFe2O4 Nanowires and Their Application as Humidity Sensors and Photodetectors, Journal of Physical Chemistry C, Apr. 7, 2009.

Law, et al., 'Semiconductor Nanowires and Nanotubes'; Annu. Rev. Mater. Res. 2004, 34:83-122.

Lee et al., Vertical Pillar-Superlattice Array and Graphene Hybrid Light Emitting Diodes, Nano Letters, 2010, vol. 10, pages 2783-2788.

Lin et al., Fabrication of Nanowire Anisotropic Conductive Film for Ultra-fine Pitch Flip Chip Interconnection, Electronic Components and Technology Conference, Jun. 20, 2005, 55th Proceedings, pp. 66-70.

Loncar et al., Diamond Nanotechnology, SPIE Newsroom, May 18, 2010, obtained at url: <http://spie.org/x40194.xml?ArticleID=x40194>.

Lu et al., Growth of Single Crystal Silicon Nanowires in Supercritical Solution from Tethered Gold Particles on a Silicon Substrate, NanoLetters, Jan. 2003, vol. 3, No. 1, pp. 93-99.

(56) References Cited

OTHER PUBLICATIONS

Lugstein et al., Ga/Au Alloy Catalyst for Single Crystal Silicon-Nanowire Epitaxy, Applied Physics Letters, Jan. 8, 2007, vol. 90, No. 2, pp. 023109-1-023109-3.
Madou, Properties and Growth of Silicon, Including Crystalline Silicon, Fundamentals of Microfabrication, 2nd Ed., CRC Press, 2002, pp. 125-204.
Makarova et al., Fabrication of High Density, High-Aspect-Ratio Polyimide Nanofilters, Journal of Vacuum Science and Technology, Nov./Dec. 2009, vol. 27, No. 6., pp. 2585-2587.
Morales et al., A Laser Ablation Method for the Synthesis of Crystalline Semiconductor Nanowires, Science, Jan. 9, 1998, vol. 279, pp. 208-211.
N.L. Dmitruk, et al.; 'Modeling and Measurement of Optical Response of 1D Array of Metallic Nanowires for Sensing and Detection Application'; 26th International Conference on Microelectronics (MIEL 2008), Nis, Serbia, May 11-14, 2008.
Nguyen et al., Deep Reactive Ion etching of Polyimide for Microfluidic Applications, Journal of the Korean Physical Society, Sep. 2007, vol. 51, No. 3, pp. 984-988.
Ozgur Yavuzcetin, et al.; 'Index-tuned Anti-reflective Coating using a Nanostructured Metamaterial'; http://www.umass.edu/research/rld/bioportal/vuewtech.php?tid=40, Jun. 4, 2009.
Pain et al., A Back-Illuminated Megapixel CMOS Image Sensor, IEEE Workshop on Charge-Coupled Devices and Advanced Image Sensors, Karuizawa, Japan, Jun. 9-11, 2005, Jet Propulsion Laboratory, National Aeronautics and Space Administration, Pasadena California.
Parraga et al., Color and Luminance Information in Natural Scenes, Journal of Optical Society of America A, Optics, Image, Science and Vision, Jun. 1998, vol. 15, No. 6.
Reynard Corporation; 'Anti-Reflection Coatings (AR)', http://www.reynardcorp.com/coating_anti_reflection.php, Jun. 4, 2009.
Rosfjord et al., Nanowire Single-Photon Detector with an Integrated Optical Cavity and Anti-Reflection Coating, Optics Express: The International Electronic Journal of Optics, Jan. 23, 2006, vol. 14, No. 2, pp. 527-534.
Rugani, First All-Nanowire Sensor, Technology Review, Aug. 13, 2008, Published by MIT.
Rutter, Diamond-Based Nanowire Devices Advance Quantum Science, SEAS Communications, Feb. 14, 2010, obtained at url:<http://news.harvard.edu/gazette/story/2010/02/digging-deep-into-diamonds/>.
Schmidt et al., Realization of a Silicon Nanowire Vertical Surround-Gate Field-Effect Effect Transistor, Small, Jan. 2006, vol. 2, No. 1, pp. 85-88.
Shimizu et al., Homoepitaxial Growth of Vertical Si Nanowires on Si(100) Substrate using Anodic Aluminum Oxide Template, (abstract only), Materials Research Society, 2007.
Song et al., Vertically Standing Ge Nanowires on GaAs(110) Substrates, Nanotechnology 19, Feb. 21, 2008.
T. H. Hsu, et al. 'Light Guide for Pixel Crosstalk Improvement in Deep Submicron CMOS Image Sensor'; IEEE Electron Device Letters, vol. 25, No. 1, Jan. 2004.
Thelander et al., Nanowire-Based One-Dimensional Electronics, Materials Today, Oct. 2006, vol. 9, No. 10, pp. 28-35.
Trentler, Timothy J. et al. Solution-Liquid-Solid Growth of Cyrstalline III-V Semiconductors: An Analogy to Vapor Liquid-Solid Growth. vol. 270(5243), Dec. 15, 1995, pp. 1791-1794.
Tseng, et al. 'Crosstalk improvement technology applicable to 0.14 μm CMOS image sensor'; IEEE International Electron Devices Meeting, Dec. 13-15, 2004; IEDM Technical Digest, pp. 997-1000. vbTab.
Verheijen, Marcel A. et al. Growth Kinetics of Heterostructured GaP-GaAs Nanowires. J. Am. Chem. Soc. 2006, 128, 1353-1359.
Wagner, R.S. and Ellis, W.C. Vapor-Liquid-Solid Mechanism of Single Crystal Growth. Applied Physics Letters. vol. 4, No. 5 (Mar. 1, 1964), pp. 89-90.
Wang, Introduction to Nanotechnology—Where Opportunities arise & Great Future Being Built from Small Things.
Wong et al., Lateral Nanoconcentrator Nanowire Multijunction Photovoltaic Cells, GCEP Progress report, Apr. 20, 2009, pp. 1-18.
Zhang et al., Ultrahigh Responsivity Visible and Infrared Detection Using Silicon Nanowire Phototransistors, Nanoletters, May 14, 2010, vol. 10, No. 6, pp. 2117-2120.
International Search Report and Written Opinion for PCT International Patent Application No. PCT/US2010/051446, mailed Jan. 3, 2011.
International Search Report and Written Opinion for PCT International Patent Application No. PCT/US2009/063592, mailed Jan. 13, 2010.
Baomin Wang and Paul W. Leu, Nanotechology 23 (2012) 194003, 7 pages.
Sangmoo Jeon, et al., Nano Lett. 2012, 12, 2971-2976.
Sangmoo Jeong et al., J. Vac. Sci. Technol. A 30(6), Nov./Dec. 2012.
Sarkar et. al., Integrated polarization-analyzing CMOS image sensor for detecting incoming light ray direction, Sensors Application Symposium (SAS), Mar. 29, 2012, p. 194-199, 1010 IEEE.
Jin-Kon Kim; 'New Functional Nanomaterials Based on Block Copolymers' http://www.ziu.edu.cn/adver/subjectizyhd/jz0707061313.html, Jul. 7, 2011.
Ozgur Yavuzcetin, et al.; 'Index-tuned Anti-reflective Coating using a Nanostructured Metamaterial'; http://www.umass.edu/research/rld/bioportal/vuewlech.php?tid=40, Feb. 28, 2007.
Reynard Corporation; 'Anti-Reflection Coatings (AR)', http://www.reynardcorp.com/coating_anti_reflection.php, undated, Jun. 4, 2009.
Shimizu et al., Homoepitaxial Growth of Vertical Si Nanowires on Si(100) Substrate using Anodic Aluminum Oxide Template, (abstract only), Materials Research Society, Fall 2007.
Wang, Introduction to Nanotechnology—Where Opportunities arise & Great Future Being Built from Small Things, Fall 2008.
U.S. Office Action for U.S. Appl. No. 12/982,269 mailed Jun. 11, 2014.
U.S. Office Action for U.S. Appl. No. 13/556,041 mailed Jun. 12, 2014.
Office Action issued on Oct. 29, 2014 in Korean Application No. 10-2013-7020107.
U.S. Office Action for U.S. Appl. No. 13/925,429 mailed Nov. 4, 2014.
Corrected Notice of Allowability issued on Oct. 14, 2014 in U.S. Appl. No. 12/966,535.
U.S. Office Action for U.S. Appl. No. 14/274,448 mailed Dec. 5, 2014.
U.S. Office Action for U.S. Appl. No. 13/543,307 mailed Dec. 24, 2014.
International Search Report and Written Opinion for International Application No. PCT/US2014/056558 mailed Dec. 12, 2014.
Office Action issued on Nov. 11, 2014 in Taiwanese Application No. 098129911.
International Search Report and Written Opinion for International Application No. PCT/US2014/050544 mailed Jan. 9, 2015.
Notice of Allowance issued on Dec. 1, 2014 in U.S. Appl. No. 12/910,664.
Office Action for U.S. Appl. No. 12/966,514 mailed Mar. 10, 2015.
Office Action for U.S. Appl. No. 13/963,847 mailed Mar. 12, 2015.
Office Action issued on Jan. 16, 2015 in Chinese Application No. 201180054442.9.
Office Action issued Feb. 23, 2015 in U.S. Appl. No. 13/925,429.
Office Action issued on Mar. 4, 2015 in U.S. Appl. No. 13/556,041.
Office Action issued on Jun. 19, 2014 in Taiwanese Application No. 099133891.
Office Action for U.S. Appl. No. 14/281,108 mailed Apr. 6, 2015.
Office Action for U.S. Appl. No. 14/450,812 mailed Apr. 1, 2015.
Office Action for U.S. Appl. No. 12/633,313 mailed Apr. 9, 2015.
Philipp, H.R. et al., "Optical Constants of Silicon in the Region 1 to 10 ev", Physical Review, vol. 120, No. 1, pp. 37-38.
Notice of Allowance issued Jan. 30, 2015 in U.S. Appl. No. 14/487,375.
Office Action for U.S. Appl. No. 12/982,269, mailed Jan. 15, 2015.
Office Action for U.S. Appl. No. 12,945,492 mailed Jan. 16, 2015.
Office Action for U.S. Appl. No. 13/288,131 mailed Apr. 17, 2015.

(56) References Cited

OTHER PUBLICATIONS

Kim, Y.S. et al., "ITO/AU/ITO multilayer thin films for transparent conducting electrode applications", Applied Surface Science, vol. 254 (2007), pp. 1524-1527.
Phillip, H.R. et al., "Optical Constants of Silicon in the Region 1 to 10 ev", Physical Review, vol. 120, No. 1, pp. 37-38.
Office Action for U.S. Appl. No. 13/543,307 mailed Apr. 17, 2015.
Office Action issued Mar. 19, 2015 in Chinese Application No. 201180065814.8.
Office Action for U.S. Appl. No. 13/693,207 mailed May 7, 2015.
Office Action issued on Mar. 18, 2015 in Chinese Application No. 201180066970.6.
Office Action issued Apr. 3, 2015 in Chinese Application No. 201180051048.X.

* cited by examiner

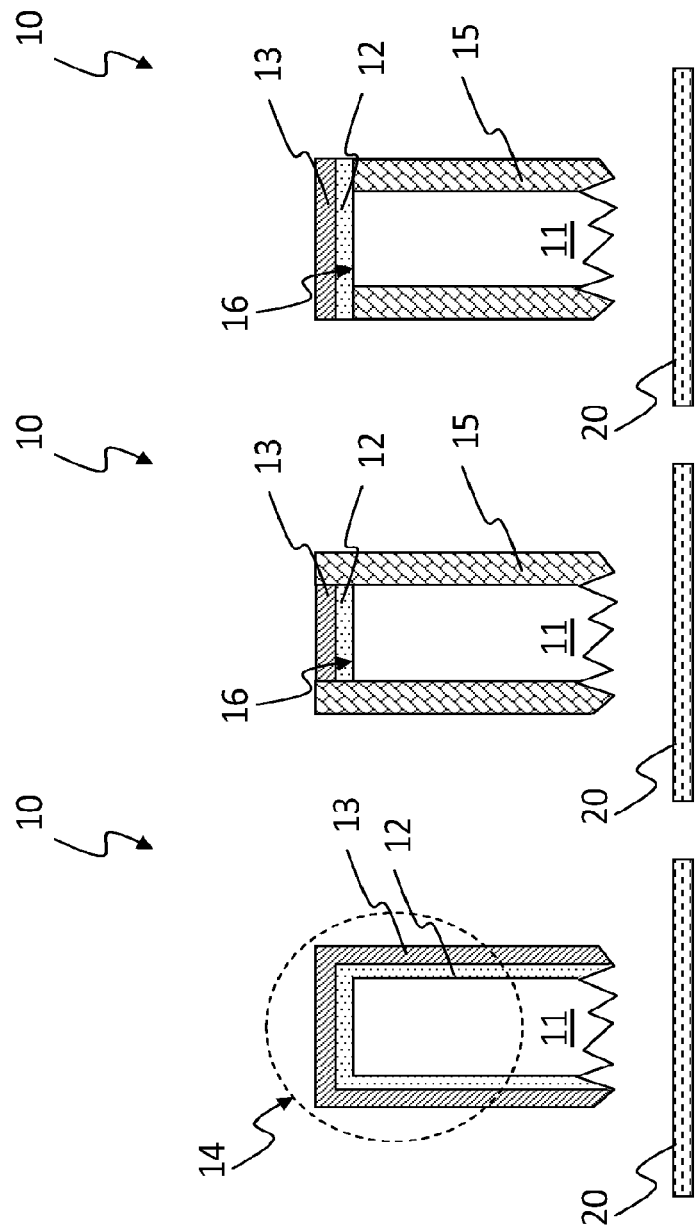

PASSIVATED UPSTANDING NANOSTRUCTURES AND METHODS OF MAKING THE SAME

CROSS-REFERENCE TO RELATED APPLICATIONS

This application is a continuation-in-part of and claims the benefit of the earlier filing date of co-pending U.S. patent application Ser. Nos. 12/573,582, 12/575,221, 12/633,323, 12/633,318, 12/633,313, 12/633,305, 12/982,269, 12/966,573, 12/967,880, 12/974,499, 12/945,492, 13/047,392, and 13/048,635, the entire contents of each of which are incorporated herein by reference.

This application is related to U.S. patent application Ser. Nos. 61/266,064, 61/357,429, 61/360,421, 12/204,686 (granted as U.S. Pat. No. 7,646,943), 12/270,233, 12/472,264, 12/472,271, 12/478,598, 12/633,297, 12/621,497, 12/648,942, 12/910,664, 12/966,514, and 12/966,535, and the disclosures each of which are hereby incorporated by reference in their entirety.

BACKGROUND

Semiconductor surface is often a source of defects that adversely affect the electric, optical and chemical properties of the semiconductor. A suitable passivation technique eliminates the defects or prevent the adverse effects of the defects.

SUMMARY

Described herein is a device comprising: a substrate; one or more of a nanostructure extending essentially perpendicularly from the substrate; wherein the nanostructure comprises a core of a doped semiconductor, an intrinsic amorphous semiconductor layer disposed on the core, and a heavily doped amorphous semiconductor layer of an opposite type from the core and disposed on the intrinsic amorphous semiconductor layer.

Also described herein is a device comprising: a substrate; one or more of a nanostructure extending essentially perpendicularly from the substrate; wherein the nanostructure comprises a core and a passivation layer, the passivation layer comprising an amorphous material, configured to passivate at least a surface of the core and configured to form a p-i-n junction with the core.

BRIEF DESCRIPTION OF THE FIGURES

FIGS. 1A-1C each show a partial cross-sectional view of a nanostructure.

DETAILED DESCRIPTION

Figure 2A:
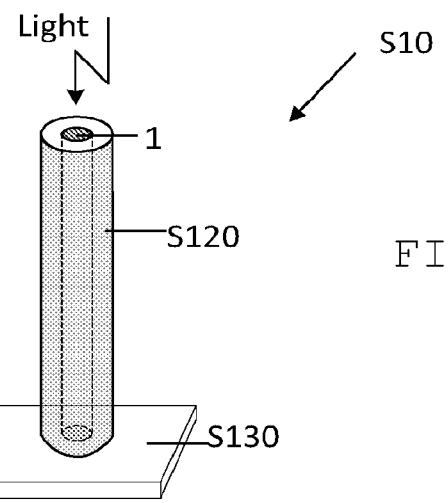
FIG. 2A shows a nanostructure on a substrate.

The terms "passivation" and "passivate" as used herein means a process of eliminating dangling bonds (i.e., unsatisfied valence on immobilized atoms). The term "image sensor" as used herein means a device that converts an optical image to an electric signal. The term "color image sensor" as used herein means an image sensor capable of converting an optical image in the visible spectrum (i.e. a color image) to an electric signal. The term "transparent" as used herein means a transmittance of at least 70%. The term "polarized light" as used herein means light with polarization. "Linear polarization" as used herein means the electric field of light is confined to a given plane along the direction of propagation of the light. "Circular polarization" as used herein means the electric field of light does not change strength but only changes direction in a rotary type manner. "Elliptical polarization" as used herein means electric field of light describes an ellipse in any fixed plane intersecting, and normal to, the direction of propagation of the light. The term "photovoltaic device" as used herein means a device that can generate electrical power by converting light such as solar radiation into electricity. That the structures are single crystalline as used herein means that the crystal lattice of the entire structures is continuous and unbroken throughout the entire structures, with no grain boundaries therein. An electrically conductive material can be a material with essentially zero band gap. The electrical conductivity of an electrically conductive material is generally above 103 S/cm. A semiconductor can be a material with a finite band gap up to about 3 eV and general has an electrical conductivity in the range of 103 to 10-8 S/cm. An electrically insulating material can be a material with a band gap greater than about 3 eV and generally has an electrical conductivity below 10-8 S/cm. The term "structures essentially perpendicular to the substrate" as used herein means that angles between the structures and the substrate is greater than zero, preferably greater than 5°, more preferably are from 85° to 90°. The term "recess" as used herein means a hollow space in the substrate and is open to a space outside the substrate. A group III-V compound material as used herein means a compound consisting of a group III element and a group V element. A group III element can be B, Al, Ga, In, TI, Sc, Y, the lanthanide series of elements and the actinide series of elements. A group V element can be V, Nb, Ta, Db, N, P, As, Sb and Bi. A group II-VI compound material as used herein means a compound consisting of a group II element and a group VI element. A group II element can be Be, Mg, Ca, Sr, Ba and Ra. A group VI element can be Cr, Mo, W, Sg, O, S, Se, Te, and Po. A quaternary material is a compound consisting of four elements. The term "mesh" as used herein means a web-like pattern or construction. The term "overhanging portion" as used herein means a portion of the structures that project over the sidewall of the recesses. The term "contour of a top surface of the structures" as used herein means the edge of the top surface of the structures. The term "electrode" as used herein means a conductor used to establish electrical contact with the photovoltaic device. The term "continuous" as used herein means having no gaps, holes, or breaks. The term "p-i-n junction" as used herein means a structure of a lightly doped or intrinsic semiconductor region sandwiched between a p-type semiconductor region and an n-type semiconductor region. The p-type and n-type regions can be heavily doped for Ohmic contacts. The term "p-n junction" as used herein means a structure with a p-type semiconductor region and an n-type semiconductor region in contact with each other. The term "gate electrode" as used herein means an electrode operable to control electrical current flow by a voltage applied on the gate electrode. The term "nanopillar" as used herein means a structure that has a size constrained to at most 1000 nm in two dimensions and unconstrained in the other dimension. The term "nanopillar" can also mean a structure that has a size constrained to at most 10 microns in two dimensions and unconstrained in the other dimension. The term "gate line" as used herein means an electrode or a conductor line operable to transmit an electrical signal to the gate electrodes. The term "multiplexer" as used herein means a device that performs multiplexing; it selects one of many analog or digital input signals and forwards the selected input into a single line. An analog-to-digital converter (abbreviated ADC, A/D or A to D) is a device that converts a continuous quantity to a discrete digital number. A digital-to-analog converter (DAC or D-to-A) is a device that converts a digital (usually binary) code to an analog signal (current, voltage, or electric charge). The term "foreoptics" as used herein means optical components (e.g., lenses, mirrors) placed in an optical path before the image sensor.

An intrinsic semiconductor, also called an undoped semiconductor or i-type semiconductor, is a substantially pure semiconductor without any significant dopant species present. A heavily doped semiconductor is a semiconductor with such a high doping level that the semiconductor starts to behave electrically more like a metal than as a semiconductor. A lightly doped semiconductor is a doped semiconductor but not have a doping level as high as a heavily doped semiconductor. In a lightly doped semiconductor, dopant atoms create individual doping levels that can often be considered as localized states that can donate electrons or holes by thermal promotion (or an optical transition) to the conduction or valence bands respectively. At high enough impurity concentrations (i.e. heavily doped) the individual impurity atoms may become close enough neighbors that their doping levels merge into an impurity band and the behavior of such a system ceases to show the typical traits of a semiconductor, e.g. its increase in conductivity with temperature. A "single crystalline" semiconductor as used herein means that the crystal lattice of the semiconductor is continuous and unbroken, with no grain boundaries therein. A semiconductor being "multi-crystalline" as used herein means that the semiconductor comprises grains of crystals separated by grain boundaries. A semiconductor being "amorphous" as used herein means that the semiconductor has a disordered atomic structure.

FIGS. 1A-1C each show a partial cross-sectional view of a nanostructure 1 extending essentially perpendicularly from a substrate 20.

As shown in a partial cross-sectional view of FIG. 1A, a nanostructure 1, according to an embodiment, extends essentially perpendicularly from a substrate 20 and comprises a core 11 of a doped semiconductor material, an intrinsic amorphous semiconductor layer 12 disposed isotropically over at least an end portion 14 away from the substrate 20, and a heavily doped amorphous semiconductor layer 13 of an opposite type from the core 11 and disposed isotropically over at least a portion of the intrinsic amorphous semiconductor layer 12.

As shown in a partial cross-sectional view of FIG. 1B, a nanostructure 1, according to an embodiment, extends essentially perpendicularly from a substrate 20 and comprises a core 11 of a doped semiconductor material, an intrinsic amorphous semiconductor layer 12 disposed on an end surface 16 away from the substrate 20, and a heavily doped amorphous semiconductor layer 13 of an opposite type from the core 11 and disposed on the intrinsic amorphous semiconductor layer 12. Preferably, the intrinsic amorphous semiconductor layer 12 and the heavily doped amorphous semiconductor layer 13 are coextensive with the core 11 in at least a direction parallel to the substrate 20. Preferably, sidewalls of the core 11 are at least partially covered by an electrically insulating layer 15.

As shown in a partial cross-sectional view of FIG. 1C, a nanostructure 1, according to an embodiment, extends essentially perpendicularly from a substrate 20 and comprises a core 11 of a doped semiconductor material, an intrinsic amorphous semiconductor layer 12 disposed on an end surface 16 away from the substrate 20, and a heavily doped amorphous semiconductor layer 13 of an opposite type from the core 11 and disposed on the intrinsic amorphous semiconductor layer 12. Preferably, sidewalls of the core 11 are at least partially covered by an electrically insulating layer 15. Preferably, the intrinsic amorphous semiconductor layer 12 and the heavily doped amorphous semiconductor layer 13 are coextensive with the electrically insulating layer 15 in at least a direction parallel to the substrate 20.

The substrate 20 can comprise any suitable material: semiconductor (e.g., silicon), insulator (e.g., glass), metal (e.g., gold). The substrate 20 can comprise any suitable electronic components such as transistors, interconnects, vias, diodes, amplifiers, etc.

The core 11 can comprise any suitable doped semiconductor material, such as doped silicon, doped germanium, doped III-V group compound semiconductor (e.g., gallium arsenide, gallium nitride, etc.), doped II-VI group compound semiconductor (e.g., cadmium selenide, cadmium sulfide, cadmium telluride, zinc oxide, zinc selenide, etc.), or doped quaternary semiconductor (e.g., copper indium gallium selenide). The core 11 is preferably substantially crystalline semiconductor material. The core 11 is preferably lightly doped. The core 11 can comprise a p-n junction or a p-i-n junction therein.

The intrinsic amorphous semiconductor layer 12 can comprise any suitable intrinsic amorphous semiconductor material, such as intrinsic amorphous silicon, intrinsic amorphous germanium, intrinsic amorphous III-V or II-VI group compound semiconductor. The intrinsic amorphous semiconductor layer 12 preferably has a thickness of about 2 nm to about 100 nm, more preferably about 2 nm to about 30 nm. The intrinsic amorphous semiconductor layer 12 is configured to passivate at least a surface of the core 11. The intrinsic amorphous semiconductor layer 12 can be deposited by any suitable method such as atomic layer deposition (ALD) or chemical vapor deposition (CVD).

The heavily doped amorphous semiconductor layer 13 can comprise any suitable heavily doped amorphous semiconductor material, such as heavily doped amorphous silicon, heavily doped amorphous germanium, heavily doped amorphous III-V or II-VI group compound semiconductor. The heavily doped amorphous semiconductor layer 13 being an opposite type from the core 11 means that if the core is p-type, the heavily doped amorphous semiconductor layer 13 is n-type and that if the core is n-type, the heavily doped amorphous semiconductor layer 13 is p-type. The heavily doped amorphous semiconductor layer 13 preferably has a thickness of at least about 10 nm, for example, from about 10 nm to about 200 nm. The heavily doped amorphous semiconductor layer 13 can be deposited by any suitable method such as atomic layer deposition (ALD) or chemical vapor deposition (CVD).

The heavily doped amorphous semiconductor layer 13, the intrinsic amorphous semiconductor layer 12 and the core 11 form a p-i-n junction.

The electrically insulating layer 15 can comprise any suitable material, such as $HfO_2$, $SiO_2$, $Al_2O_3$, $Si_3N_4$, etc.

The nanostructure 1 can be a nanowire or a nanoslab. The term "nanowire" used herein means a structure whose dimension in a direction perpendicular to the substrate (hereafter referred to as the "normal direction") is substantially greater than dimensions of the structure in any direction perpendicular to the normal direction (hereafter referred to as a "transverse direction") and the dimensions in the transverse directions are less than 1000 nm. The term "nanoslab" used herein means a structure whose dimensions in the normal direction and in the transverse direction are substantially greater than a dimension of the structure in a direction perpendicular to both the normal direction and the transverse direction (hereafter referred to as the "thickness direction") and the dimension in the thickness direction is less than 1000 nm. A nanoslab can have any suitable shape in a cross-section parallel to the substrate, such as a rectangle, an ellipse, convex-convex (i.e. like a double-convex lens), concave-concave (i.e. like a double-concave lens), plano-convex (i.e. like a plano-convex lens), plano-concave (i.e. like a plano-concave lens).

According to an embodiment, the nanostructure 1 is configured as a solar blind ultra violet (SBUV) detector. The SBUV region is the range of wavelengths in which the earth atmosphere absorbs essentially all UV radiation from the sun to the earth. For example, the wavelength region of 300 nm to 200 nm is within the SBUV region. A device that detects radiation only in the SBUV region and rejects visible and infrared radiation is called an SBUV detector or an SBUV sensor.

Sunlight does not interfere or blind a SBUV detector of the embodiments herein. Therefore, the SBUV detector of the embodiments herein is particularly useful for detecting manmade radiation sources that emit in the SBUV region and enjoys a very low false alarm rate. Such manmade radiation sources can include exhaust plumes of shoulder launched surface to air missiles (SLSAM), fire and flame, or any other UV emitting source including hydrogen flames. An SBUV detector of the embodiments herein can function at all lightning conditions including full daylight, without interference from the solar radiation and with very high signal to background ratio.

According to an embodiment, the SBUV detector comprises a substrate having a plurality of regions defined thereon (hereafter referred to as "pixels"). In each pixel, the SBUV detector comprises a plurality of nanostructures 1 extending essentially perpendicularly from the substrate. The nanostructures 1 in the SBUV detector are nanowires. The plurality of nanostructures 1 can be equally or unequally spaced from each other, arranged in a regular array or in random. The plurality of nanostructures 1 are configured to react only to radiations in the SBUV region and not to react to radiations outside the SBUV region. Here, the term "react" is meant to broadly encompass absorbing, reflecting, coupling to, detecting, interacting with, converting to electrical signals, etc.

FIG. 2A shows one of the plurality of nanostructures 1 (a nanowire in the SBUV) on an SBUV S10. For brevity, only one nanostructure 1 is shown but the SBUV S10 can comprise a plurality of nanostructures 1, such as more than 1000, or more than 1000000. The nanostructures 1 extend essentially perpendicularly from a substrate S130. Each of the nanostructures 1 preferably comprises a cladding S120 surrounding the nanostructures 1. The substrate S130 is preferably a metal. The nanostructures 1 preferably have higher refractive index than the cladding S120. The term "cladding" or "clad" as used herein means a layer of substance surrounding the nanostructures 1.

Figure 2B:
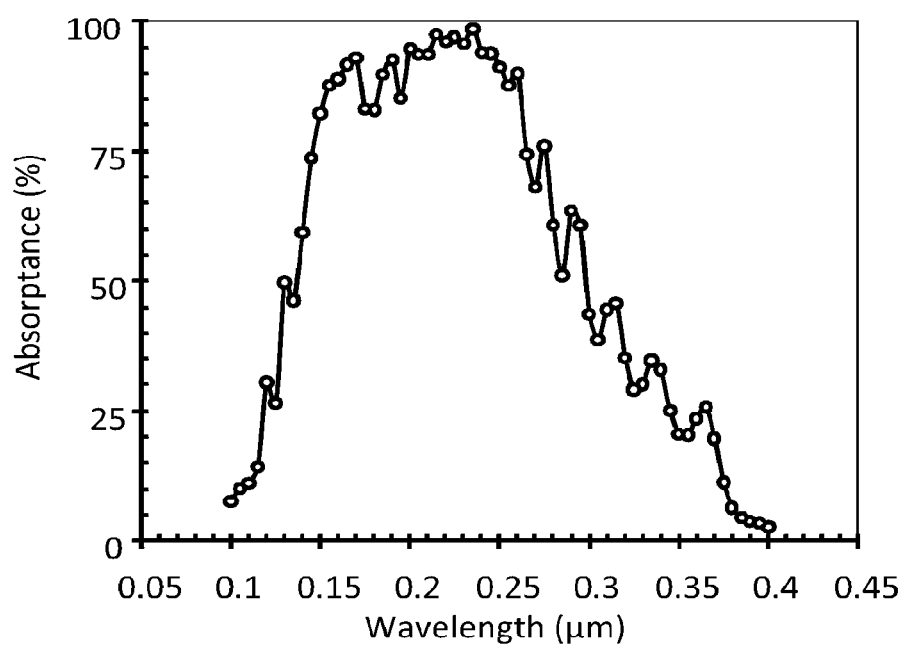
FIG. 2B shows simulated absorptance of the nanostructure of FIG. 2A.
Figure 2C:
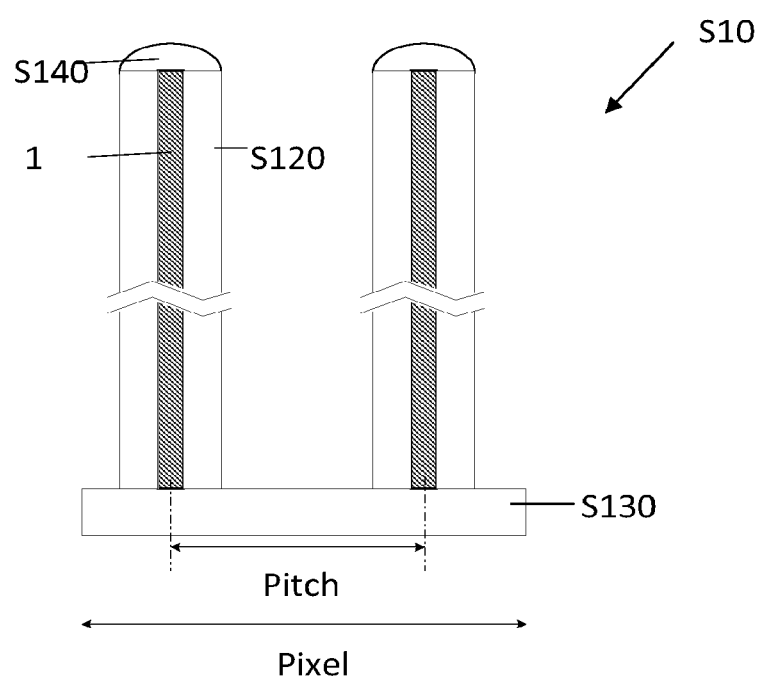
FIG. 2C shows optional couplers on the nanostructure.

FIG. 2B shows simulated absorptance of the SBUV detector S10 of UV light with wavelengths between 100 and 400 nm, incident in the normal direction. FIG. 2B clearly shows that absorptance of the SBUV detector S10 of UV light with wavelengths between 140 and 290 nm is greater than 50% and absorptance of UV light drops quickly to almost zero outside wavelength region of 140-290 nm. FIG. 2B indicate that the SBUV detector S10 indeed only reacts to radiations in the SBUV region. As shown in FIG. 2C, each of the nanostructures 1 can further comprise a coupler S140 disposed on an end of the nanostructures 1 away from the substrate S130 (hereafter referred to as the "receiving end"). The term "coupler" as used herein means a layer effective to guide light into the nanostructures 1.

According to an embodiment, the nanostructures 1 are nanowires and have a diameter of from about 5 nm to about 30 nm, preferably about 20 nm. According to an embodiment, the nanostructures 1 have a diameter of from about 5 nm to about 150 nm. The cladding S130 has a thickness of about 10 nm to about 200 nm, preferably about 30 nm. Pitch of the nanostructures 1 (i.e. center-to-center distance of one of the plurality of nanowires to a nearest neighbor thereof) is from about 0.2 µm to about 2 µm. Height (i.e. dimension in the normal direction) of the nanostructures 1 is from about 0.1 µm to about 5 µm. Each pixel can have one or more nanostructures 1.

Figure 3A:
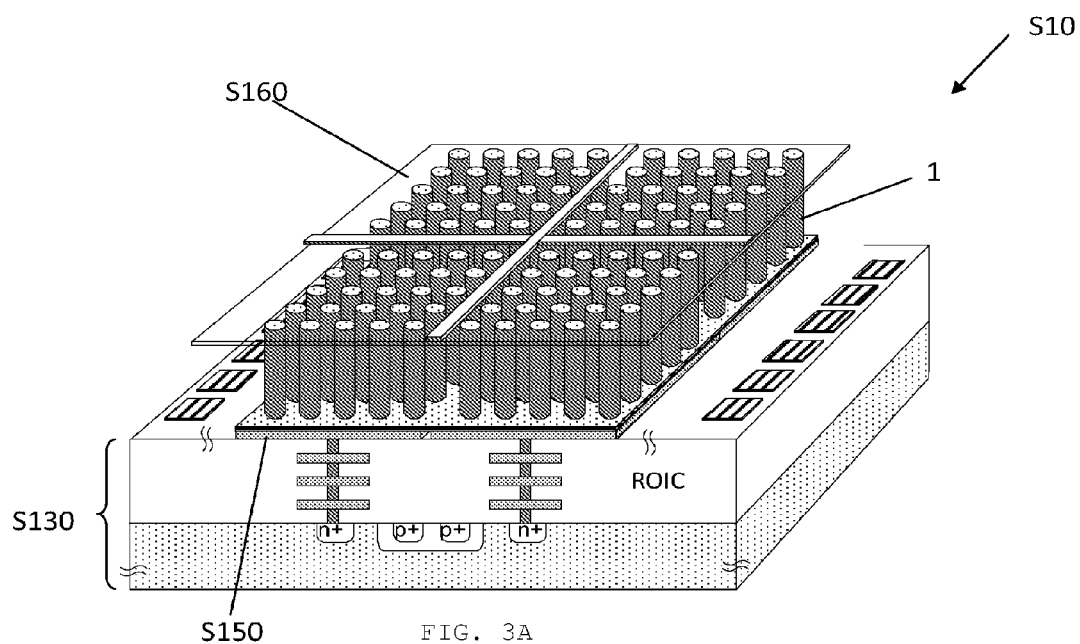
FIGS. 3A and 3B show a perspective view and a top view of an image sensor according an embodiment.
Figure 3B:
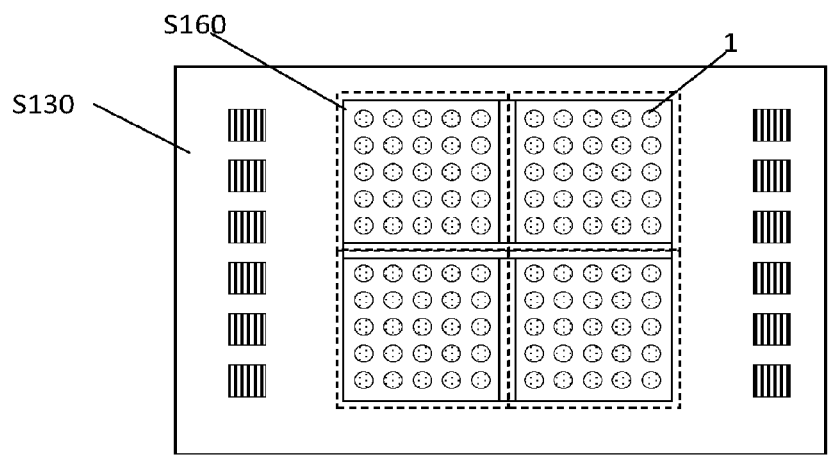

FIG. 3A and FIG. 3B shows a perspective view and a top view, respectively, of the SBUV detector S10. For brevity, only four pixels (regions enclosed by dotted rectangles) are shown. The nanostructures 1 preferably detect UV radiation in the SBUV region by converting it to an electrical signal. For example, each nanostructure 1 can comprise a photodiode (such as an avalanche photodiode) or form a photodiode (such as an avalanche photodiode) with the substrate S130. The SBUV detector S10 can further comprise electrical components configured to detect the electrical signal from the nanostructures 1, for example, Readout Integrated Circuits (ROIC) in the substrate S130, an electrode S150 disposed between and electrically connected to all the nanostructures 1 on each pixel, a common electrode S160 disposed on and electrically connected to the receiving ends of all the nanostructures 110 in the entire SBUV detector S10. Preferably, the SBUV detector S10 can detect electrical signals from the nanostructures 1 in different pixels separately.

Figure 4:
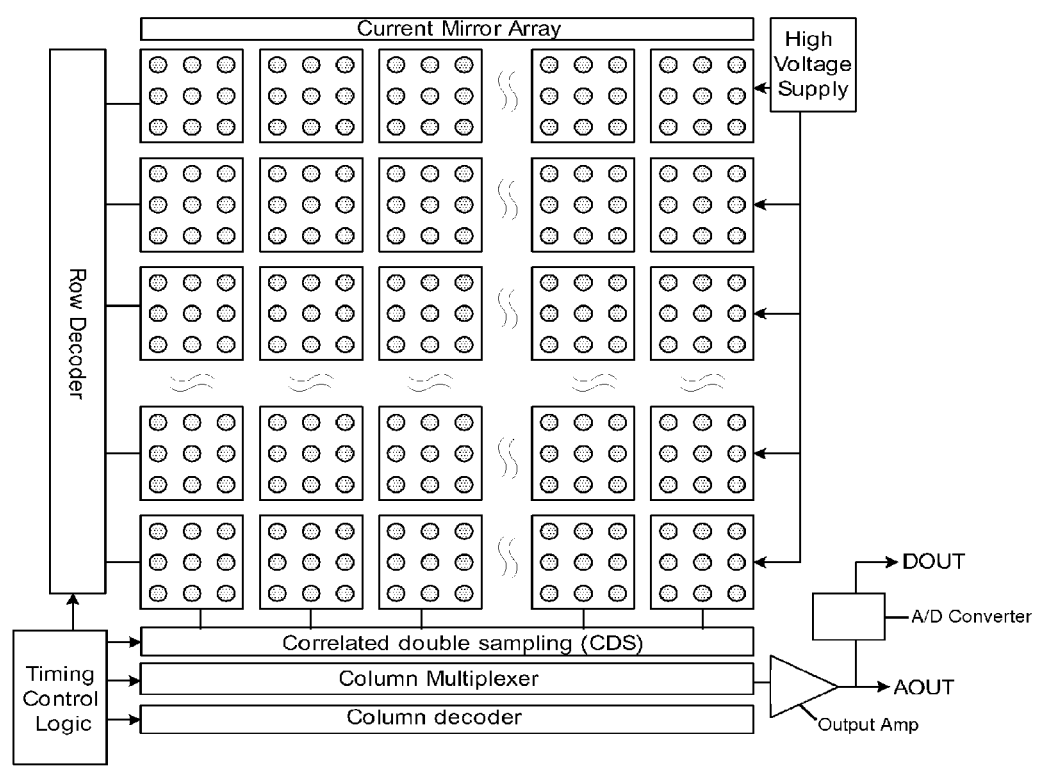
FIG. 4 shows a block diagram of a solar-blind image sensor.

According to one embodiment as shown in FIG. 4, the SBUV detector S10 can be integrated with electronic circuitry into a solar-blind image sensor. The electronic circuitry can include address decoders, a correlated double sampling circuit (CDS), a signal processor, a multiplexor and a high voltage supply (e.g. a DC high voltage supply capable of supplying at least 50 V, 100 V, 200 V or higher) for driving the nanostructures 1. The electronic circuitry is functional to detect the electrical signal generated by the nanostructures 1.

Figure 5:
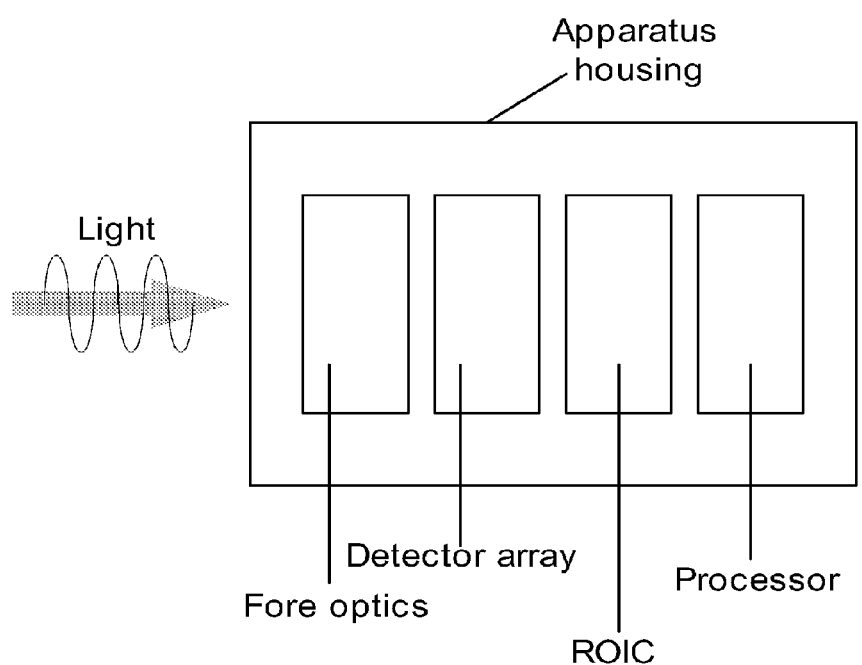
FIG. 5 shows a schematic of the SBUV detector being used as fore optics.

The SBUV detector S10 can also be used as fore optics in a light detector apparatus as shown in the schematic in FIG. 5.

Polarization is a property of certain types of waves that describes the orientation of their oscillations. Electromagnetic waves including visible light can exhibit polarization. By convention, the polarization of light is described by specifying the orientation of the light's electric field at a point in space over one period of the oscillation. When light travels in free space, in most cases it propagates as a transverse wave, i.e. the polarization is perpendicular to the light's direction of travel. In this case, the electric field may be oriented in a single direction (linear polarization), or it may rotate as the wave travels (circular or elliptical polarization). In the latter cases, the oscillations can rotate either towards the right or towards the left in the direction of travel. Depending on which rotation is present in a given wave it is called the wave's chirality or handedness. Polarization of fully polarized light can be represented by a Jones vector. The x and y components of the complex amplitude of the electric field of light travel along z-direction, $E_x(t)$ and $E_y(t)$, are represented as $$\begin{pmatrix} E_x(t) \\ E_y(t) \end{pmatrix} = E_0 \begin{pmatrix} E_{0x} e^{i(kz-\omega t + \phi_x)} \\ E_{0y} e^{i(kz-\omega t + \phi_x)} \end{pmatrix} = E_0 e^{i(kz-\omega t)} \begin{pmatrix} E_{0x} e^{i\phi_x} \\ E_{0y} e^{i\phi_y} \end{pmatrix} \cdot \begin{pmatrix} E_{0x} e^{i\phi_x} \\ E_{0y} e^{i\phi_y} \end{pmatrix}$$

is the Jones vector. Polarization of light with any polarization, including unpolarized, partially polarized, and fully polarized light, can be described by the Stokes parameters, which are four mutually independent parameters.

A device that can detect polarization of light, or even measure the light's Jones vector or Stokes parameters can be useful in many applications.

According to an embodiment, the device comprises a substrate having a plurality of regions defined thereon (hereafter referred to as "subpixels"; a group of related "subpixels" may be referred to as a "pixel"). In each subpixel, the device comprises a plurality of nanostructures 1 being nanoslabs. The plurality of nanostructures 1 can be equally or unequally spaced from each other. The plurality of nanostructures 1 in different subpixels are functional to react differently to light with a same polarization. Here, the term "react" is meant to broadly encompass absorbing, reflecting, coupling to, detecting, interacting with, converting to electrical signals, etc. The plurality of nanostructures 1 in a first subpixel extends in a first transverse direction; the plurality of nanostructures 1 in a second subpixel extends in a second transverse direction, wherein the first and second pixels are adjacent and the first transverse direction is different from the second transverse direction.

Figure 6:
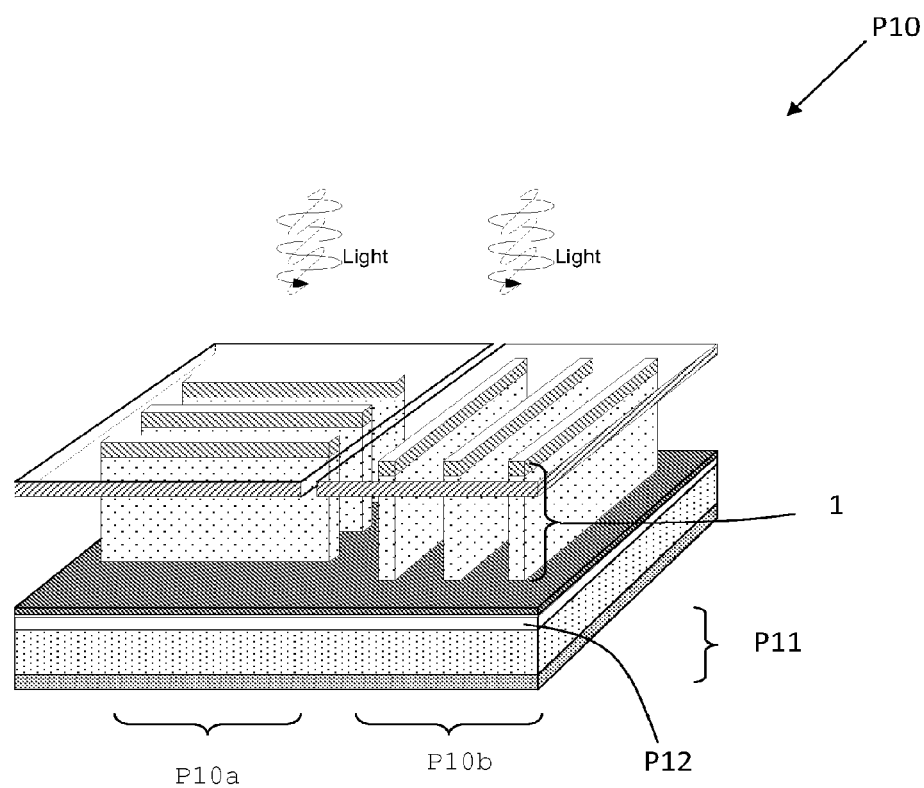
FIG. 6 is a perspective view of the device according one embodiment.

FIG. 6 shows a device P10 according to one embodiment. For brevity, two subpixels P10a and P10b of a substrate P110 are illustrated. The device P10, however, can comprise a plurality of pixels such as more than 100, more than 1000, more than 1000000. The subpixels preferably have a pitch of about 1 micron to 100 microns (more preferably 5 microns). In each of the subpixels P10a and P10b, the device P10 comprises a plurality of nanostructures 1 (e.g. at least 2 features), respectively. The nanostructures 1 in the subpixel P10a and the nanostructures 1 in the subpixel P10b extend in different transverse directions. The nanostructures 1 preferably have a pitch (i.e. spacing between adjacent features 100 in the thickness direction thereof) of about 0.5 to 5 microns (further preferably about 1 micron), a height (i.e. dimension in the normal direction) of about 0.3 to 10 microns (further preferably about 5 micron) and an aspect ratio (i.e. ratio of a dimension in the transverse direction to a dimension in the thickness direction) of at least 4:1, preferably at least 10:1. Each of the nanostructures 1 forms a p-i-n diode with the substrate P110, the p-i-n diode being functional to convert at least a portion of light impinged thereon to an electrical signal. The device P10 preferably further comprises electrical components configured to detect the electrical signal from the nanostructures 1, for example, a transparent electrode disposed on each subpixel and electrically connected to all nanostructures 1 therein. The transparent electrode on each subpixel preferably is separate from the transparent electrode on adjacent subpixels. A reflective material can be deposited on areas of the substrate P110 between the nanostructures 1. The substrate P110 can have a thickness in the normal direction of about 5 to 700 microns (preferably 120 microns).

Figure 7:
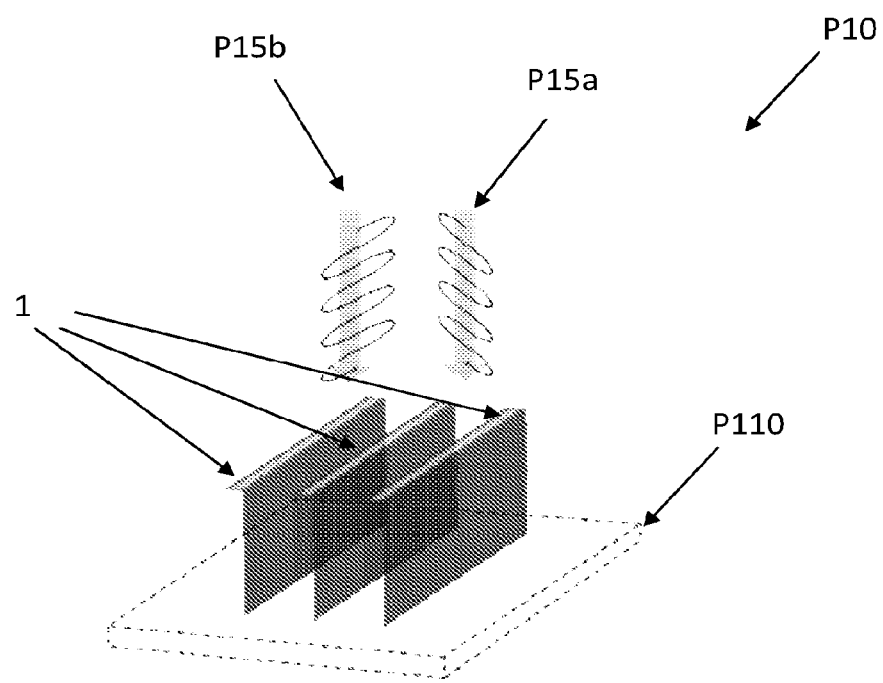
FIG. 7 shows a schematic of nanostructures in one subpixel when light with different polarization impinges thereon.

FIG. 7 shows a schematic of the nanostructures 1 in one subpixel when light with different polarization impinges thereon. For light P15a with a wavelength of about 400 nm and a linear polarization essentially in the thickness direction of the nanostructures 1, the absorptance of the nanostructures 1 is about 35%. In contrast, for light P15b with the same wavelength as light P15a and a linear polarization essentially in the transverse direction of the nanostructures 1, the absorptance of the nanostructures 1 is about 95%.

Figure 8:
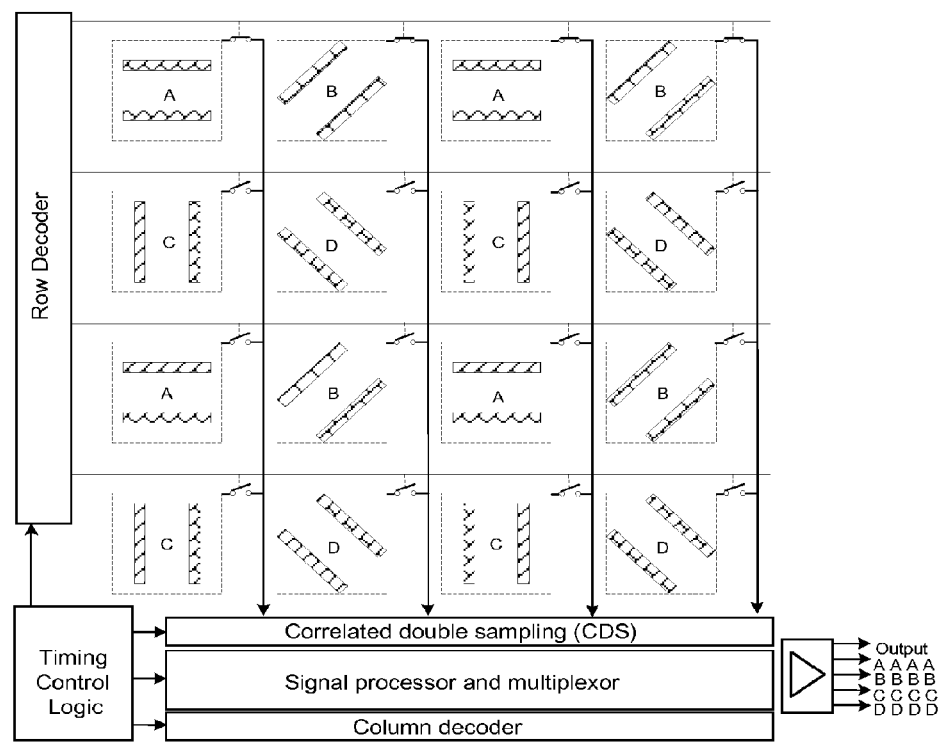
FIG. 8 shows a polarization detector array.

According to one embodiment as shown in FIG. 8, the device P10 can be integrated with electronic circuitry into a polarization detector array. The electronic circuitry can include address decoders in both directions of the detector array, a correlated double sampling circuit (CDS), a signal processor, a multiplexor. The electronic circuitry is functional to detect the electrical signal converted by the nanostructures 100 from at least a portion of light impinged thereon. The electric circuitry can be further functional to calculate an interpolation of electrical signals from several subpixels, the features on which extend in the same transverse direction. Other function of the electronic circuitry can include a gain adjustment, a calculation of Stoke's parameters. In particular, the subpixels can be arranged into a group (i.e. pixel). For example, in FIG. 8, a subpixel A and subpixels B, C and D can be arranged adjacent to each other and referred to as a pixel, wherein features on the subpixels B, C and D extend in transverse directions at 45°, 90° and −45° relative to a transverse direction in which features on the subpixel A extend.

Figure 9:
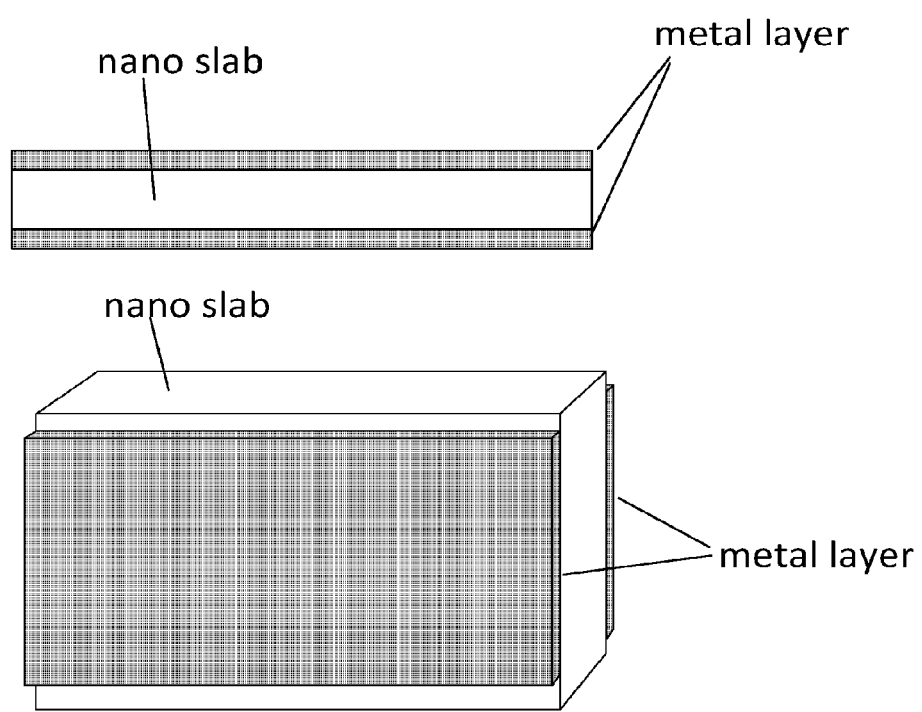
FIG. 9 shows a top view and a perspective view of a nanostructure in the device of FIG. 6, wherein the feature has metal layers on its sidewalls.

According to an embodiment as shown in FIG. 9, the nanostructures 100 can each comprise a metal layer on each sidewall (i.e. surface extending in the transverse direction and the normal direction). The metal layer preferably has a thickness of about 5 nm to about 100 nm, more preferably about 50 nm. The metal layer substantially covers the entire sidewall and the metal layer does not extend to either end of the nanostructures in the normal direction.

A photovoltaic device, also called a solar cell is a solid state device that converts the energy of sunlight directly into electricity by the photovoltaic effect. Assemblies of cells are used to make solar modules, also known as solar panels. The energy generated from these solar modules, referred to as solar power, is an example of solar energy.

The photovoltaic effect is the creation of a voltage (or a corresponding electric current) in a material upon exposure to light. Though the photovoltaic effect is directly related to the photoelectric effect, the two processes are different and should be distinguished. In the photoelectric effect, electrons are ejected from a material's surface upon exposure to radiation of sufficient energy. The photovoltaic effect is different in that the generated electrons are transferred between different bands (i.e. from the valence to conduction bands) within the material, resulting in the buildup of a voltage between two electrodes.

Photovoltaics is a method for generating electric power by using solar cells to convert energy from the sun into electricity. The photovoltaic effect refers to photons of light—packets of solar energy—knocking electrons into a higher state of energy to create electricity. At higher state of energy, the electron is able to escape from its normal position associated with a single atom in the semiconductor to become part of the current in an electrical circuit. These photons contain different amounts of energy that correspond to the different wavelengths of the solar spectrum. When photons strike a PV cell, they may be reflected or absorbed, or they may pass right through. The absorbed photons can generate electricity. The term photovoltaic denotes the unbiased operating mode of a photodiode in which current through the device is entirely due to the light energy. Virtually all photovoltaic devices are some type of photodiode.

A conventional solar cell often has opaque electrodes on a surface that receives light. Any light incident on such opaque electrodes is either reflected away from the solar cell or absorbed by the opaque electrodes, and thus does not contribute to generation of electricity. Therefore, a photovoltaic device that does not have this drawback is desired.

Figure 10:
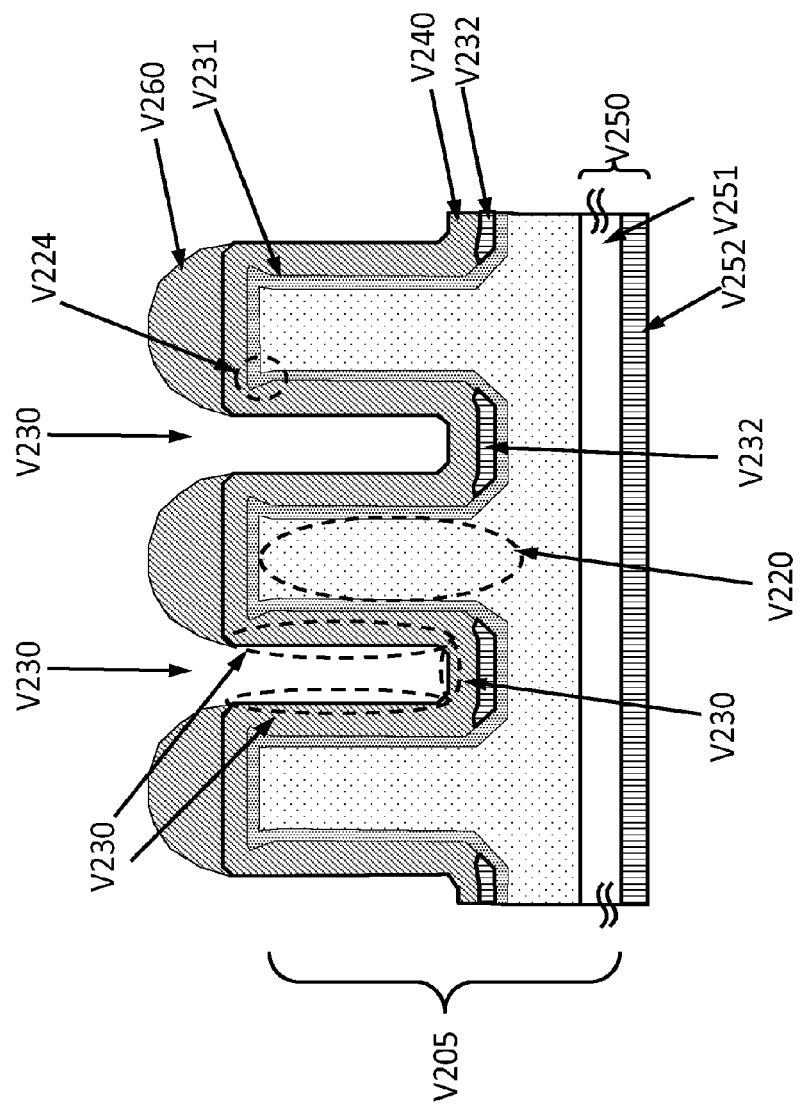
FIG. 10 is a schematic cross sectional view of a photovoltaic device according to an embodiment.

FIG. 10 shows a schematic cross-section of a photovoltaic device V200, according to another embodiment. The photovoltaic device V200 comprises a substrate V205, a plurality of nanostructures 1 essentially perpendicular to the substrate V205 and one or more recesses V230 between the nanostructures 1. Each recess V230 has a sidewall V230a and a bottom wall V230b. The bottom wall V230b has a planar reflective layer V232. The sidewall V230a does not have any planar reflective layer V232. A continuous cladding layer 240 is disposed over an entire the nanostructures 1. The photovoltaic device V200 can further comprise a coupling layer V260 disposed on the cladding layer V240 and only directly above the top surface V220a.

Figure 15:
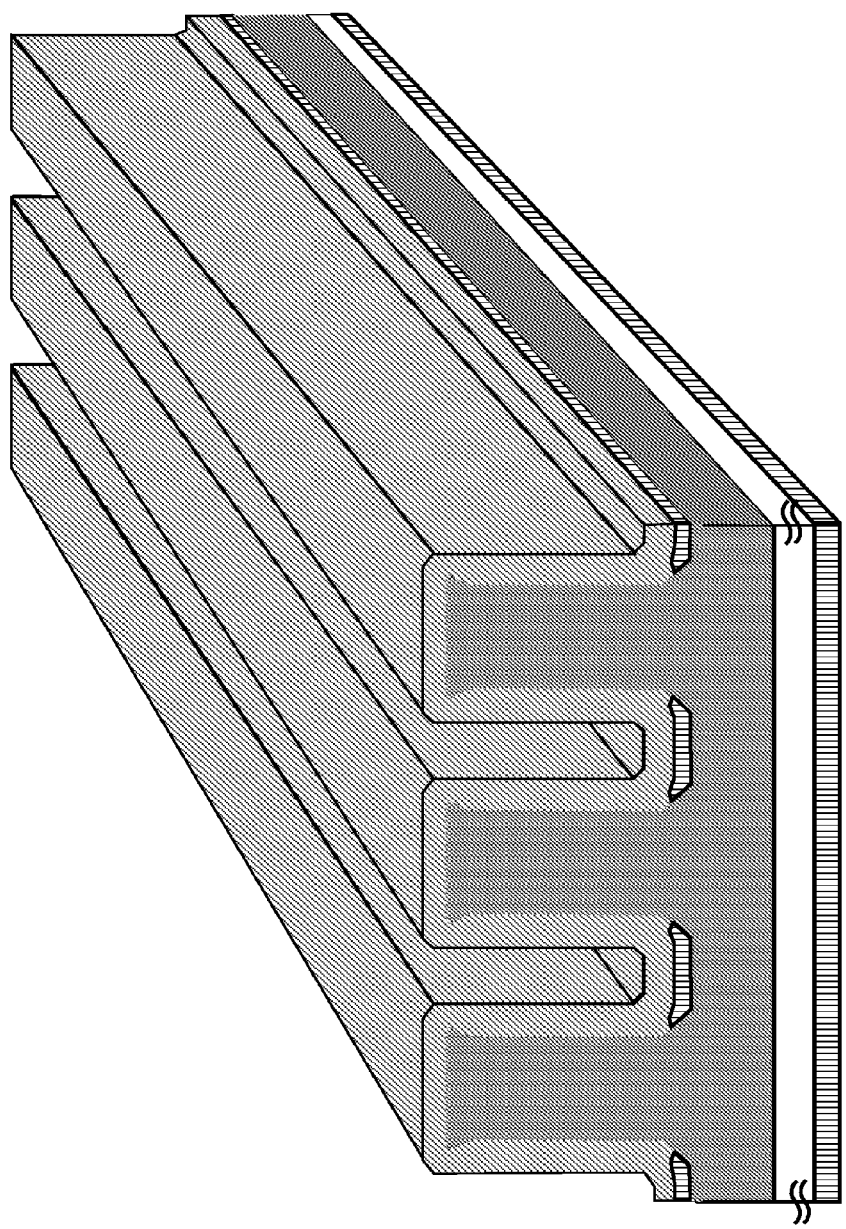
FIG. 15 shows an alternative stripe-shaped structures of the photovoltaic device.
Figure 16:
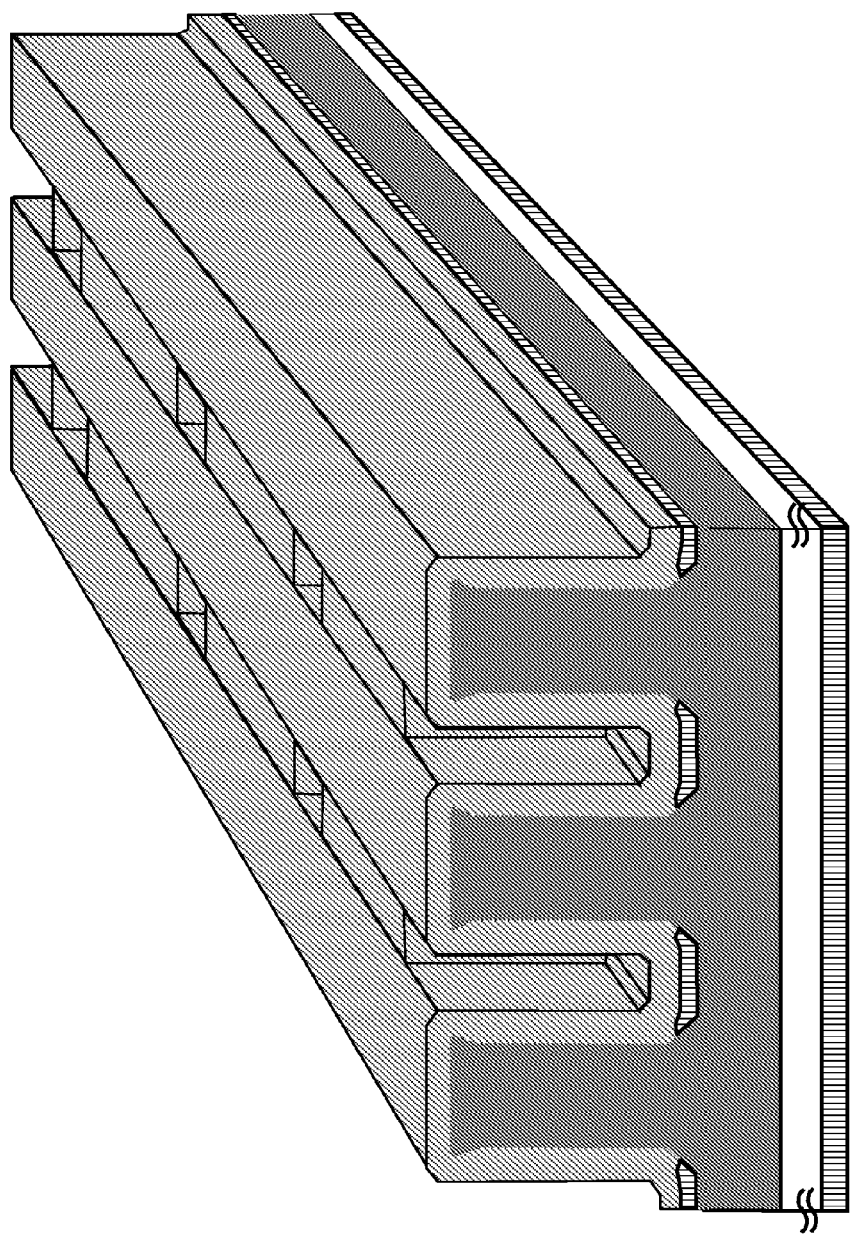
FIG. 16 shows an alternative mesh-shaped structures of the photovoltaic device.

The nanostructures 1 can have any cross-sectional shape. For example, the nanostructures 1 can be cylinders or prisms with elliptical, circular, rectangular, polygonal cross-sections. The nanostructures 1 can also be strips as shown in FIG. 15, or a mesh as shown in FIG. 16. According to one embodiment, the nanostructures 1 are pillars with diameters from 50 nm to 5000 nm, heights from 1000 nm to 20000 nm, a center-to-center distance between two closest pillars of 300 nm to 15000 nm. Preferably, the nanostructures 1 have an overhanging portion V224 along an entire contour of the top surface V220a of the nanostructures 1.

Each recess V230 preferably has a rounded or beveled inner edge between the sidewall V230a and the bottom wall V230b.

The planar reflective layer V232 can be any suitable material, such as ZnO, Al, Au, Ag, Pd, Cr, Cu, Ti, a combination thereof, etc. The planar reflective layer V232 preferably is an electrically conductive material, more preferably a metal. The planar reflective layer V232 preferably has a reflectance of at least 50%, more preferably has a reflectance of at least 70%, most preferably has a reflectance of at least 90%, for visible light of any wavelength. The planar reflective layer V232 has a thickness of preferably at least 5 nm, more preferably at least 20 nm. The planar reflective layer V232 in all the recesses V230 is preferably connected. The planar reflective layer V232 is functional to reflect light incident thereon to the nanostructures 1 so the light is absorbed by the nanostructures 1. The planar reflective layer V232 preferably is functional as an electrode of the photovoltaic device V200.

The cladding layer V240 is substantially transparent to visible light, preferably with a transmittance of at least 50%, more preferably at least 70%, most preferably at least 90%. The cladding layer V240 can be made of an electrically conductive material. The cladding layer V240 preferably is made of a transparent conductive oxide, such as ITO (indium tin oxide), AZO (aluminum doped zinc oxide), ZIO (zinc indium oxide), ZTO (zinc tin oxide), etc. The cladding layer V240 can have a thickness of 50 nm to 5000 nm. The cladding layer V240 preferably forms an Ohmic contact with the nanostructures 1. The cladding layer V240 preferably forms an Ohmic contact with the planar reflective layer V232. The cladding layer V240 preferably is functional as an electrode of the photovoltaic device V200.

The substrate V205 preferably has a flat surface V250 opposite the nanostructures 1. The flat surface V250 can have a doped layer V251 of the opposite conduction type from the core 11 of the nanostructures 1, i.e. if the core 11 is n type, the doped layer V251 is p type; if the core 11 is p type, the doped layer V251 is n type. The doped layer V251 is electrically connected to each of the nanostructures 1. The flat surface V250 can also have a metal layer V252 disposed on the doped layer V251. The metal layer V252 forms an Ohmic contact with the doped layer V251. The substrate V205 preferably has a thickness of at least 50 microns. Total area of the planar reflective layer V232 is preferable at least 40% of a surface area of the flat surface 250.

Figure 11:
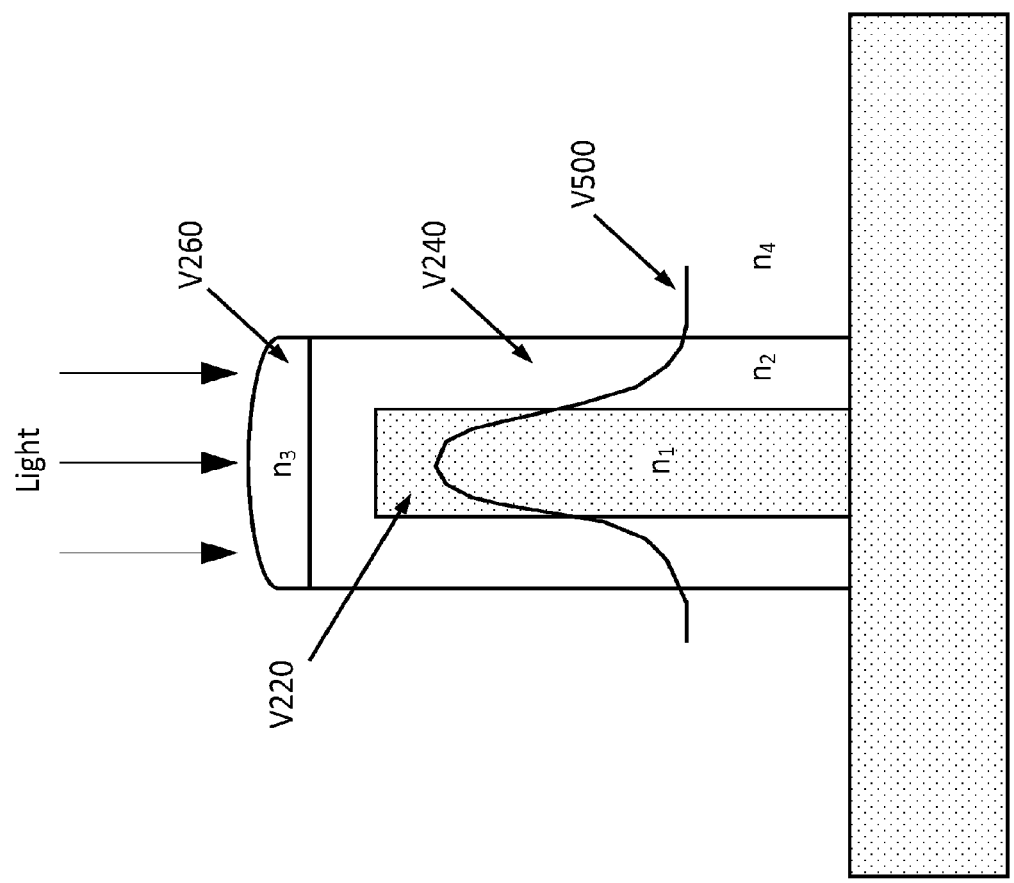
FIG. 11 shows a schematic of light concentration in the structures of the photovoltaic device.

The coupling layer V260 can be of the same material as the cladding layer V240 or different material from the cladding layer V240. As shown in FIG. 11, refractive index of the core 11 of the nanostructure 1 $n_1$, refractive index of the cladding layer V240 $n_2$, refractive index of the coupling layer V260 $n_3$, refractive index of the space between the nanostructures 1 $n_4$, preferably satisfy relations of $n_1 > n_2 > n_4$ and $n_1 > n_3 > n_4$, which lead to enhanced light concentration in the nanostructures 1.

In one embodiment, the nanostructures 1 are pillars arranged in an array, such as a rectangular array, a hexagonal array, a square array, concentric ring. Each pillar is about 5 microns in height. A pitch of the nanostructures 1 is from 300 nm to 15 microns. The cladding layer V240 is about 175 nm thick.

Figure 12:
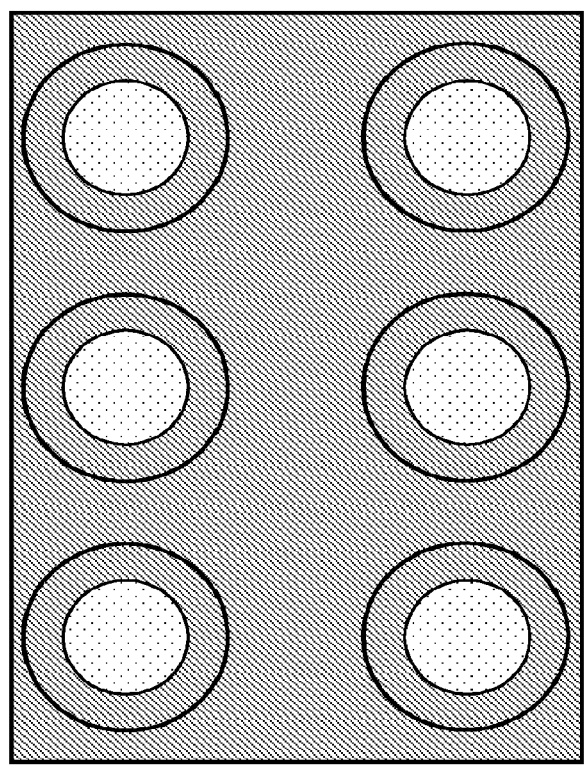
FIG. 12 shows an exemplary top cross sectional view of the photovoltaic device.
Figure 13:
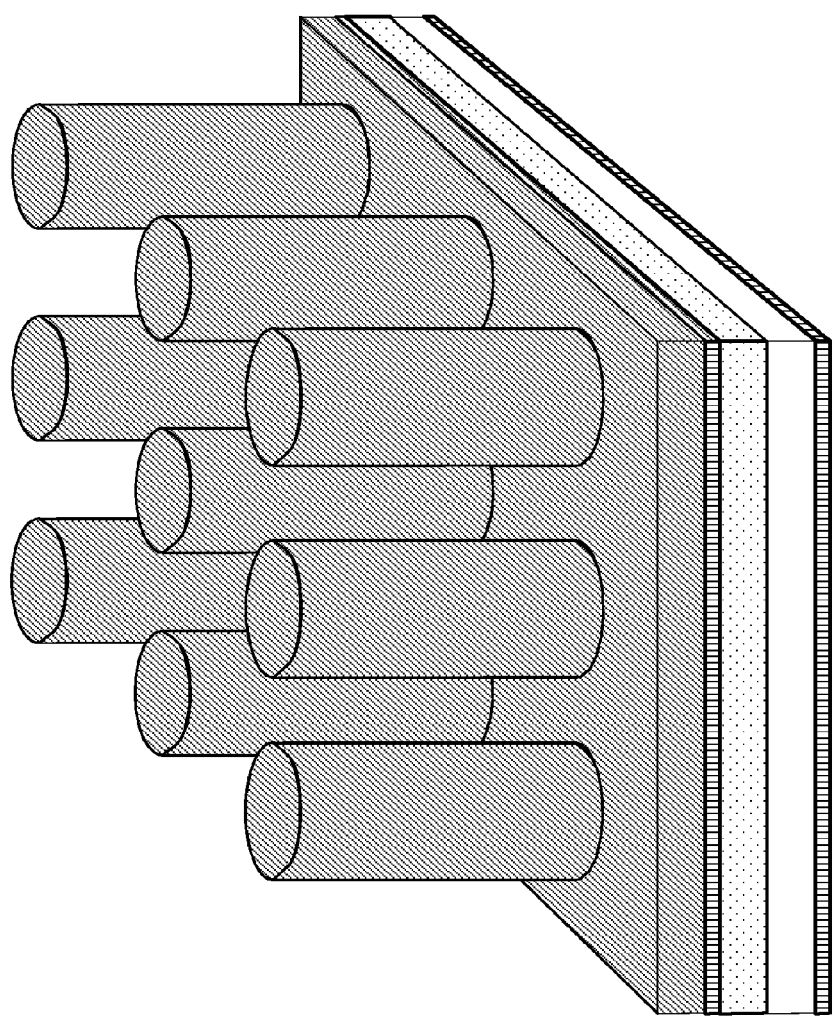
FIG. 13 shows an exemplary perspective view of the photovoltaic device.

FIG. 12 shows an exemplary top cross sectional view of the photovoltaic device V200. FIG. 13 shows an exemplary perspective view of the photovoltaic device V200.

Figure 14:
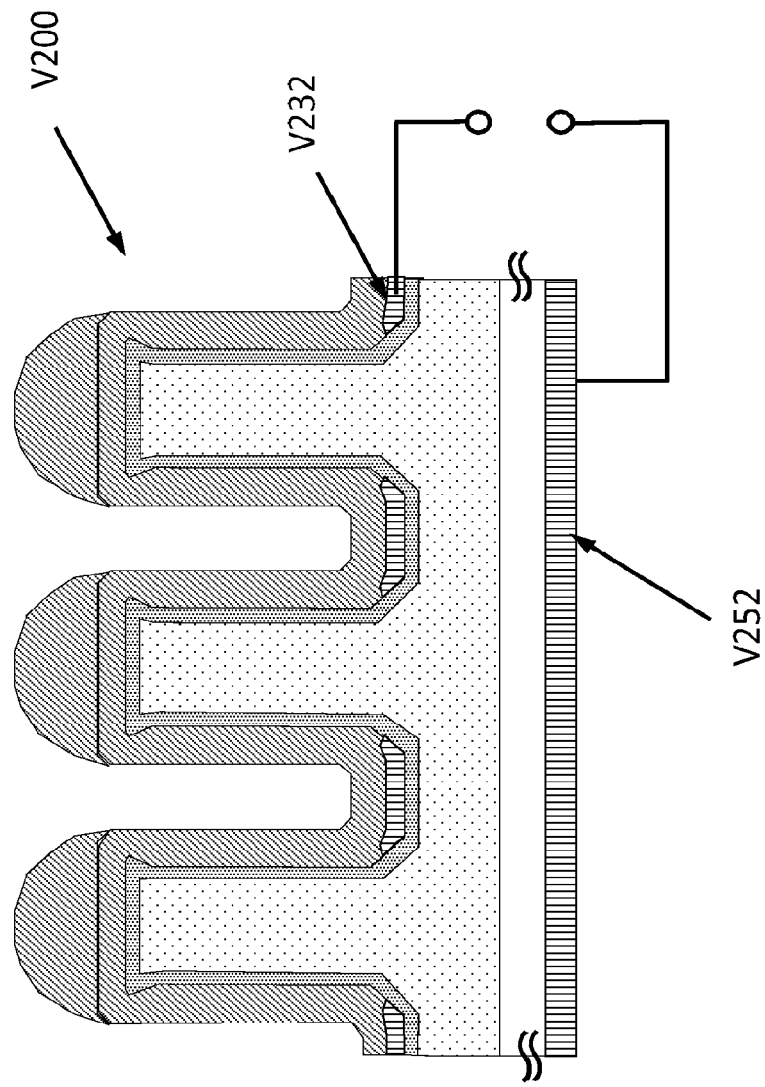
FIG. 14 shows schematics of drawing electrical current from the photovoltaic device of FIG. 10.

A method of converting light to electricity comprises: exposing the photovoltaic device V200 to light; reflecting light to the nanostructures 1 using the planar reflective layer V232; absorbing the light and converting the light to electricity using the nanostructures 1; drawing an electrical current from the photovoltaic device V200. As shown in FIG. 14, the electrical current can be drawn from the metal layer V252 and/or the planar reflective layer V232 in the photovoltaic device V200.

Figure 17:
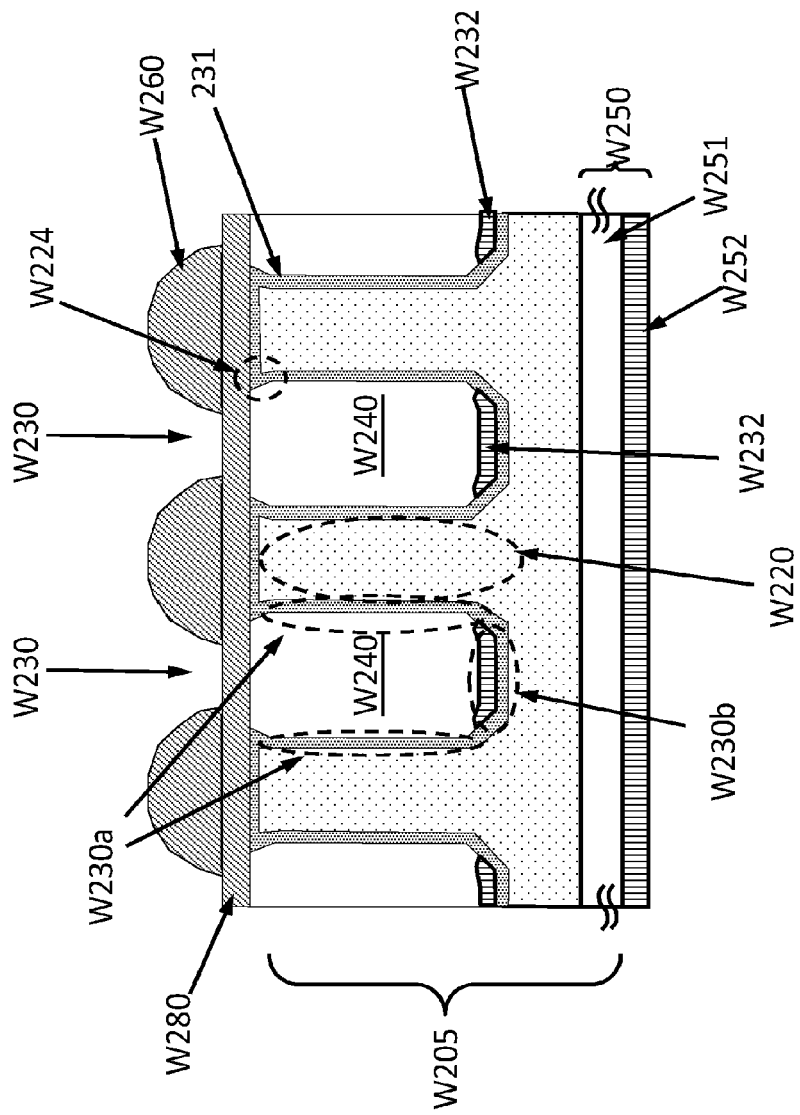
FIG. 17 is a schematic cross sectional view of a photovoltaic device according to an embodiment.

FIG. 17 shows a schematic cross-section of a photovoltaic device W200, according to another embodiment. The photovoltaic device W200 comprises a substrate W205, a plurality of nanostructures 1 essentially perpendicular to the substrate W205, one or more recesses W230 between the nanostructures 1 and an electrode layer W280. Each recess W230 is filled with a transparent material W240. Each recess W230 has a sidewall W230a and a bottom wall W230b. The bottom wall W230b has a planar reflective layer W232. The sidewall W230a does not have any planar reflective layer. The transparent material W240 preferably has a surface coextensive with the top surface W220a of the nanostructures 1. The photovoltaic device W200 further comprises an electrode layer W280 disposed on the transparent material W240 and the nanostructures 1. The photovoltaic device W200 can further comprise a coupling layer W260 disposed on the electrode layer W280 and only directly above the top surface W220a.

The nanostructures 1 can have any cross-sectional shape. For example, the nanostructures 1 can be cylinders or prisms with elliptical, circular, rectangular, polygonal cross-sections. The nanostructures 1 can also be strips as shown in FIG. 15, or a mesh as shown in FIG. 16. According to one embodiment, the nanostructures 1 are pillars with diameters from 50 nm to 5000 nm, heights from 1000 nm to 20000 nm, a center-to-center distance between two closest pillars of 300 nm to 15000 nm. Preferably, the nanostructures 1 have an overhanging portion W224 along an entire contour of the top surface W220*a* of the nanostructures 1.

Each recess W230 preferably has a rounded or beveled inner edge between the sidewall W230*a* and the bottom wall W230*b*.

The planar reflective layer W232 can be any suitable material, such as ZnO, Al, Au, Ag, Pd, Cr, Cu, Ti, Ni, a combination thereof, etc. The planar reflective layer W232 preferably is an electrically conductive material, more preferably a metal. The planar reflective layer W232 preferably has a reflectance of at least 50%, more preferably has a reflectance of at least 70%, most preferably has a reflectance of at least 90%, for visible light of any wavelength. The planar reflective layer W232 has a thickness of preferably at least 5 nm, more preferably at least 20 nm. The planar reflective layer W232 in all the recesses W230 is preferably connected. The planar reflective layer W232 is functional to reflect light incident thereon to the nanostructures 1 so the light is absorbed by the nanostructures 1. The planar reflective layer W232 preferably is functional as an electrode of the photovoltaic device W200.

The transparent material W240 is substantially transparent to visible light, preferably with a transmittance of at least 50%, more preferably at least 70%, most preferably at least 90%. The transparent material W240 can be an electrically conductive material. The transparent material W240 preferably is made of a transparent conductive oxide, such as ITO (indium tin oxide), AZO (aluminum doped zinc oxide), ZIO (zinc indium oxide), ZTO (zinc tin oxide), etc. The transparent material W240 preferably forms an Ohmic contact with the heavily doped amorphous semiconductor layer 13 of the nanostructures 1. The transparent material W240 preferably forms an Ohmic contact with the planar reflective layer W232. The transparent material W240 preferably is functional as an electrode of the photovoltaic device W200. The transparent material W240 can also be a suitable electrically insulating material such as $SiO_2$ or a polymer.

The substrate W205 preferably has a flat surface W250 opposite the nanostructures 1. The flat surface W250 can have a doped layer W251 of the opposite conduction type from the core 11 of the nanostructures 1, i.e. if the core 11 is n type, the doped layer W251 is p type; if the core 11 is p type, the doped layer W251 is n type. The doped layer W251 is electrically connected to each of the nanostructures 1. The flat surface W250 can also have a metal layer W252 disposed on the doped layer W251. The metal layer W252 forms an Ohmic contact with the doped layer W251. The substrate W205 preferably has a thickness of at least 50 microns. Total area of the planar reflective layer W232 is preferable at least 40% of a surface area of the flat surface W250.

The electrode layer W280 can be the same material as the transparent material W240 or different material from the transparent material W240. The electrode layer W280 is substantially transparent to visible light, preferably with a transmittance of at least 50%, more preferably at least 70%, most preferably at least 90%. The electrode layer W280 is an electrically conductive material. The electrode layer W280 preferably is a transparent conductive oxide, such as ITO (indium tin oxide), AZO (aluminum doped zinc oxide), ZIO (zinc indium oxide), ZTO (zinc tin oxide), etc. The electrode layer W280 preferably forms an Ohmic contact with the heavily doped amorphous semiconductor layer 13. The electrode layer W280 preferably is functional as an electrode of the photovoltaic device W200.

Figure 18:
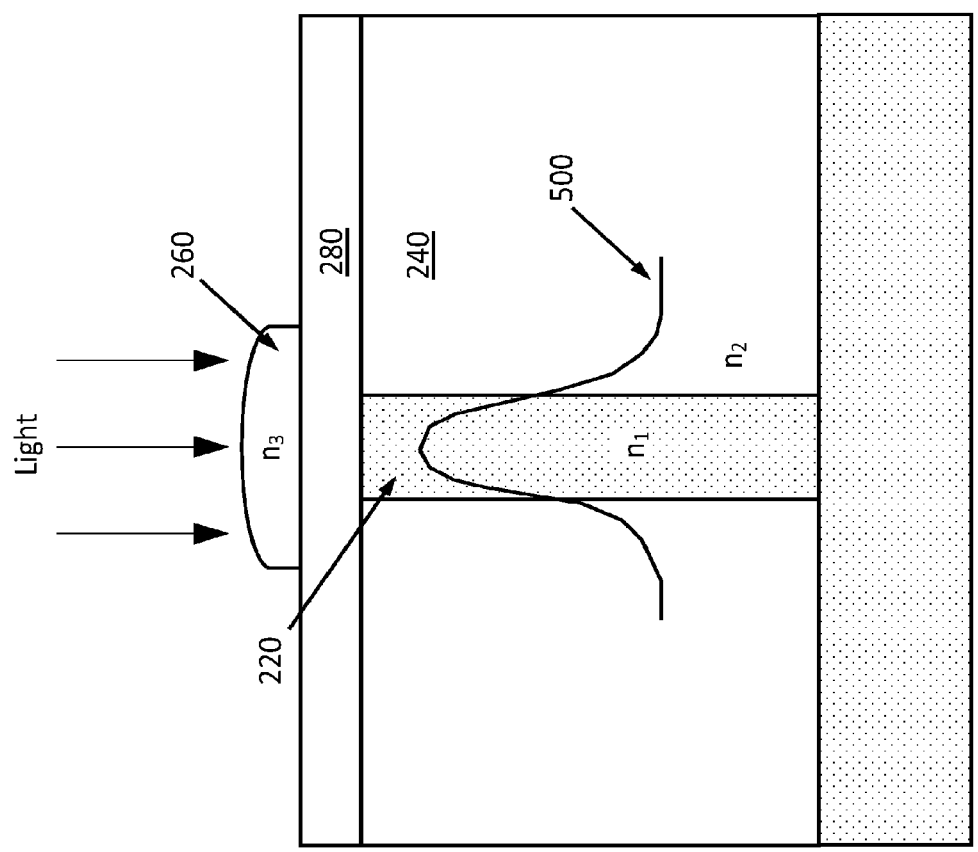
FIG. 18 shows a schematic of light concentration in the structures of the photovoltaic device.

The coupling layer W260 can be the same material as the transparent material W240 or different material from the transparent material W240. As shown in FIG. 18, refractive index of the core 11 of the nanostructure 1 $n_1$, refractive index of the transparent material W240 $n_2$, refractive index of the coupling layer W260 $n_3$, preferably satisfy relations of $n_1 > n_2$ and $n_1 > n_3$, which lead to enhanced light concentration in the nanostructures 1.

In one embodiment, the nanostructures 1 are pillars arranged in an array, such as a rectangular array, a hexagonal array, a square array, concentric ring. Each pillar is about 5 microns in height. A pitch of the nanostructures 1 is from 300 nm to 15 microns.

Figure 19A:
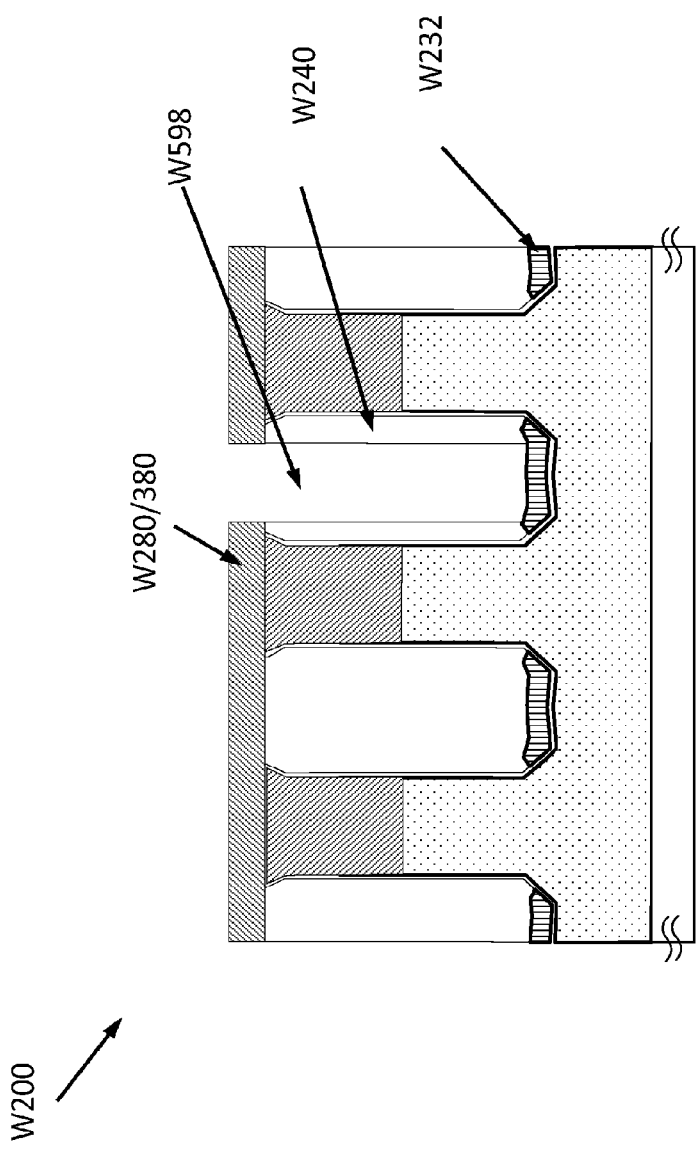
FIG. 19A and FIG. 19B show a process of making vias.
Figure 19B:
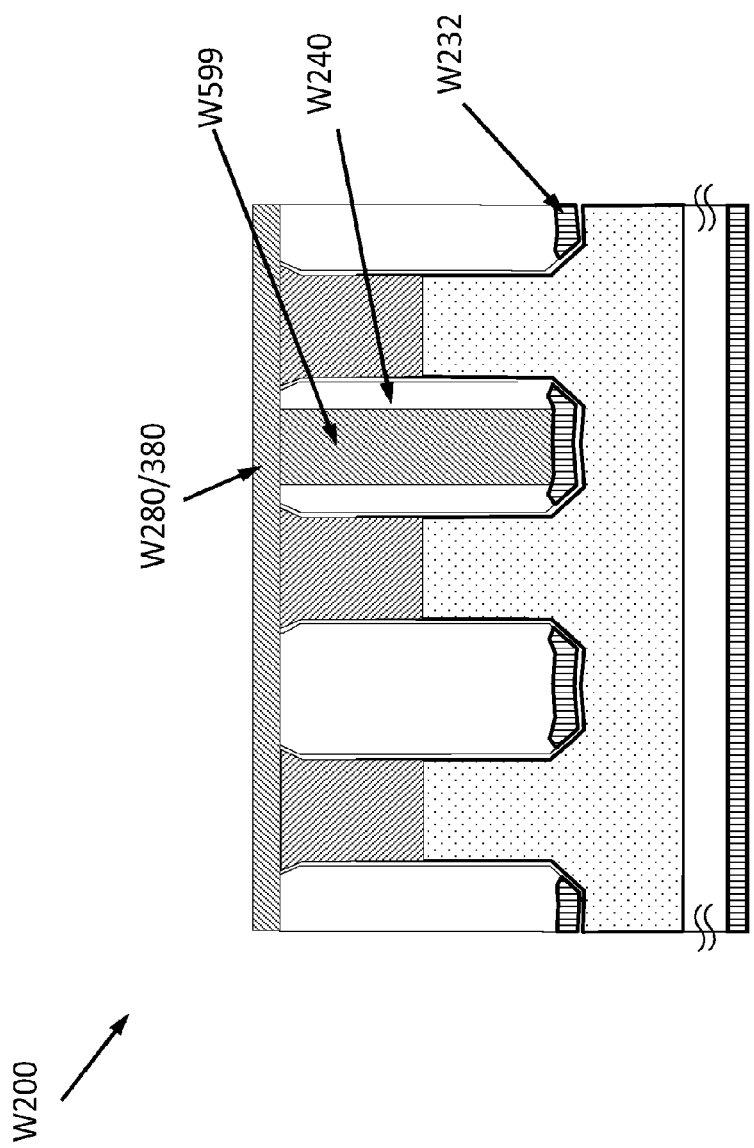
Figure 20A:
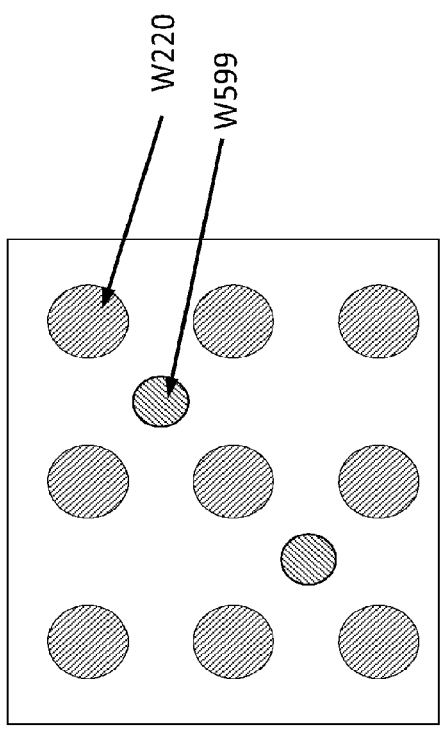
FIG. 20A and FIG. 20B show top views of exemplary vias.
Figure 20B:
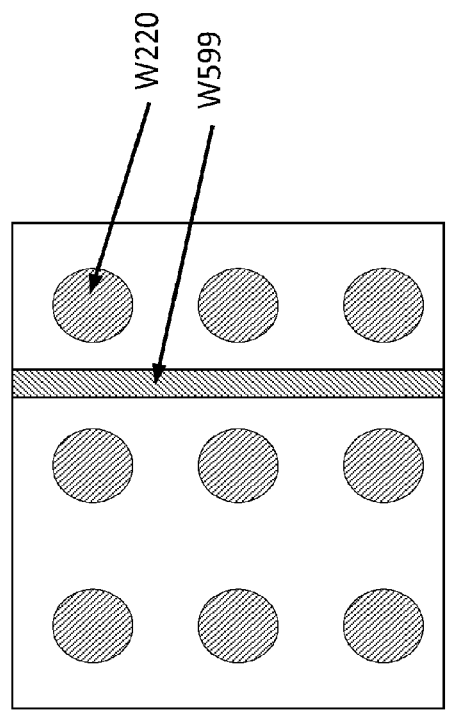

As shown in FIG. 19B, the photovoltaic device W200 can further comprise at least one via W599 in the transparent material W240 and between the electrode layer W280 and the planar reflective layer W232, wherein the at least one via W599 is an electrically conductive material, preferably an electrically conductive transparent material (e.g. ITO, AZO, etc.) and the at least one via electrically connects the electrode layer W280 and the planar reflective layer W232. As shown in FIG. 19A, the via W599 can be made by etching a recess W598 through the electrode layer W280 and the transparent material W240 until the planar reflective layer W232 is exposed and then filling the recess W598 to form the via W599. As shown in FIGS. 20A and 20B, the vias W599 can be any suitable shape such as rod-shaped or bar-shaped.

Figure 21:
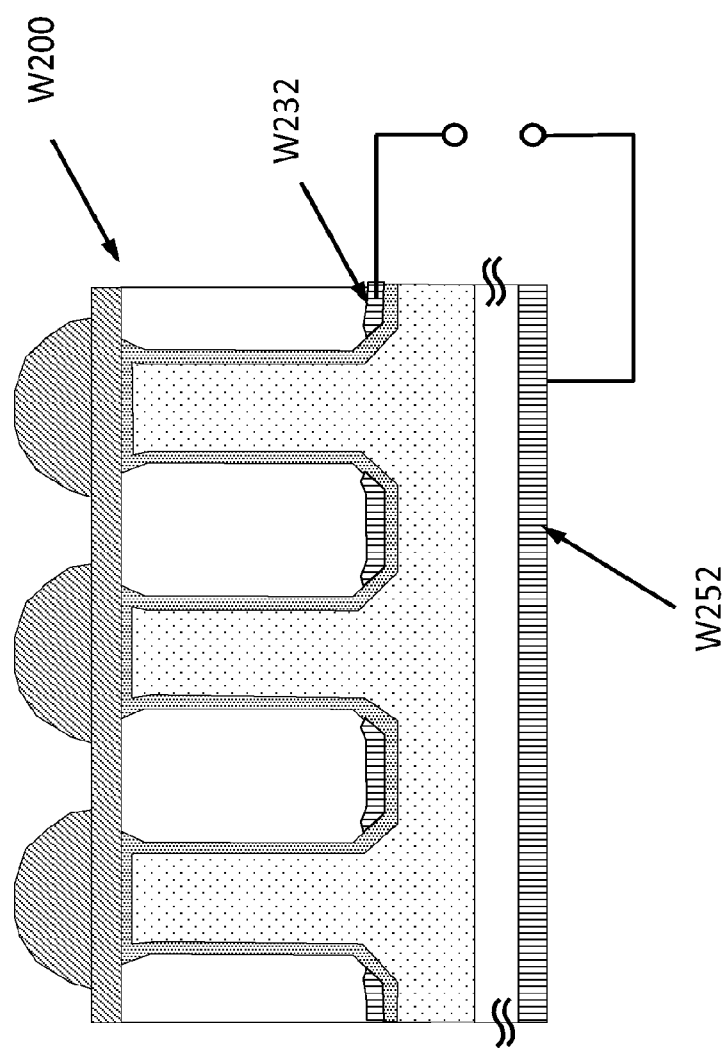
FIG. 21 shows schematics of drawing electrical current from the photovoltaic device of FIG. 17.

A method of converting light to electricity comprises: exposing the photovoltaic device W200 to light; reflecting light to the structures W220 using the planar reflective layer W232; absorbing the light and converting the light to electricity using the structures W220; drawing an electrical current from the photovoltaic device W200. As shown in FIG. 21, the electrical current can be drawn from the metal layer W252 and the planar reflective layer W232, in the photovoltaic device W200.

According to an embodiment, a nanostrucuted LED with an optical feedback comprising a substrate, a nanostructure 1 in the form of a nanowire protruding from a first side the substrate, an active region to produce light, a optical sensor and a electronic circuit, wherein the optical sensor is configured to detect at least a first portion of the light produced in the active region, and the electronic circuit is configured to control an electrical parameter that controls a light output of the active region. The nanostructured LED in one example implementation, may further comprise a volume element epitaxially connected to the nanostructure 1. The volume element could provide a high doping degree for the formation of the active region, typically within or close to the nanostructure 1. Preferably, the nanostructured LED without optical feedback would be the combination of the substrate, the nanostructure 1 and a volume element, wherein a portion of the nanostructure 1 and a portion of the volume element are configured to form the active region. The volume element could be a cylindrical bulb, but is not limited to a cylindrical bulb with a dome-shaped top, a spherical/ellipsoidal, and pyramidal. The volume element can extend in three dimensions; can have a large volume, and a large surface. The volume element/nanostructure architecture enhances both electrical and optical performance of a LED. By using different material compositions in the nanostructure 1 and the volume element, the nanostructure 1 material composition can be chosen to propagate into the volume element in order to decrease the optical disturbance by the connection with the nanostructure 1.

The nanostructure 1, a part of the nanostructure 1, or a structure in connection with the nanostructure 1, could form a waveguide directing at least a portion of the light produced in the active region in a given direction.

The nanostructure 1 and the volume element could be embedded in a low index material like SiO$_2$. In one possible implementation the low index region (e.g., a cover layer) is in turn enclosed by a cylindrical ring of metal to provide optical isolation of the each LED from its neighbors. This metal ring may also aid in the local removal of heat generated by each LED.

A nanostructured LED makes it possible to use a very large fraction of the light produced by the LED. This is at least partly achieved by the nanostructure 1 being used as a waveguide, directing the light produced in the junction out of the surface.

The use of the nanostructure 1 as a waveguide offers a possibility to direct light in well defined directions. By using concepts from the area of fiber optics light beams can be focused, or dispersed, depending on the intended use. In this case a concave surface on the nanostructure 1 and the silica surrounding it would help provide a focused beam of light suitable for a display system.

The nanostructured LED allows for inclusions of heterostructures as well as areas of different doping within the nanostructure 1, facilitating optimization of electrical and/or optical properties.

According to an embodiment, the nanostructured LED can comprise an optical feedback loop to create a uniformity of light emission for precise control of the light output of an LED or the uniformity of multiple LEDs arranged in a two dimensional grid for display purposes. Such a feedback loop would include an optical sensor to measure a fraction of the light output of the LED in real time and an electronic circuit to use the measurement to adjust the operating point of the LED.

An embodiment could include a nanostructured LED grown on a substrate that already has an embedded photodiode such as pinned photodiode. The light from the nanostructured LED is partially transmitted to the substrate where a photodiode measures and provides a signal proportional to the intensity of the light generated by the LED. This signal in turn is used in a feedback loop to control the bias point of the LED such that a stable light output is maintained at the desired intensity.

The nanostructured LED with optical feedback (NWLOF) could further comprise a partially reflective layer on the substrate surrounding and/or within the nanostructure 1, wherein the partially reflective layer is configured to allow a first portion of the light to transmit through the partially reflective layer to the optical sensor and to allow at least a second portion of the light to reflect from a surface of the partially reflective layer.

The NWLOF could further comprise one or more cladding layers surrounding the nanostructure 1, wherein the one or more cladding layers are configured such that the nanostructure 1 is configured to form a waveguide. The NWLOF could further comprise a low-index material having a lower refractive index surrounding the nanostructure 1 and a metal layer surrounding the low-index material.

The NWLOF could further comprise a volume element, wherein a portion of the nanostructure 1 and a portion of the volume element are configured to form the active region.

A nanostructured LED according to the embodiments comprises of an upstanding nanostructure 1. For the purpose of this application an upstanding nanostructure 1 should be interpreted as a nanostructure 1 protruding essentially perpendicularly from the substrate, the upstanding nanostructure 1 for example being grown from the substrate, preferably by as vapor-liquid-solid (VLS) grown nanostructures 1. The angle with the substrate will typically be a result of the materials in the substrate and the nanostructure 1, the surface of the substrate and growth conditions. By controlling these parameters it is possible to produce nanostructures 1 pointing in only one direction, for example vertical, or in a limited set of directions.

According to the embodiments, a part of the nanostructure 1 or structure formed from the nanostructure 1 could be used as a waveguide directing and confining at least a portion of the light created in the nanostructured LED in a direction given by the upstanding nanostructure 1. The waveguiding nanostructured LED structure could include a high refractive index nanostructure 1 with one or more surrounding cladding with refractive indices less than that of the nanostructure 1. The structure could be either circular symmetrical or close to being circular symmetrical. Light waveguiding in circular symmetrical structures are well-known for fiber-optic applications and many parallels can be made to the area of rare-earth-doped fiber optic devices. However, one difference is that fiber amplifier are optically pumped to enhance the light guided through them while the described nanostructured LED can be seen as an efficient light to electricity converter and vice versa.

Preferably, an output of the optical sensor is an input to the electronic circuit. Preferably, the electrical parameter comprises voltage or current. Preferably, the electronic circuit is configured to control voltage or current such that the light output is maintained substantially constant irrespective of a temperature of the active region within an operating temperature range of the active region. Preferably, the optical sensor comprises a pn or p-i-n photodiode having a performance characteristic that is substantially insensitive to a temperature in an operating temperature range of the active region. Preferably, at least a portion of the light produced in the active region is directed in a direction given by the nanostructure 1. Preferably, the nanostructure 1 is configured to both produce light and form a waveguide.

Preferably, the volume element comprises a doping layer configured to provide a p or n region and a well layer. Preferably, the optical sensor comprises a pinned photodiode in the substrate. Preferably, the one or more cladding layers are configured to provide a graded refractive index such that a refractive index of the nanostructure 1 is higher than that of the one or more cladding layer. Preferably, the NWLOF comprises a plurality of the nanostructures 1 comprising different materials emit different ranges of wavelengths of the light. Preferably, the NWLOF comprises a plurality of the nanostructures 1 comprising different diameters that form waveguides for different ranges of wavelengths of the light. Preferably, the NWLOF comprises a plurality of the nanostructures 1 comprising different materials emit different ranges of wavelengths of the light and the NWLOF comprises a plurality of the nanostructures 1 comprising different diameters that form waveguides for different ranges of wavelengths of the light. Preferably, the nanostructure 1 and the volume element are arranged to direct the light through the nanostructure 1 and the substrate such that the light is emitted from a second side of the substrate opposite the first side. Preferably, the volume element is configured to spread the light by dispersion at a junction between the nanostructure 1 and the volume element. Preferably, the electronic circuit comprises a controller configured to calibrate the electrical parameter. Preferably, the controller comprises memory, the memory comprising values for controlling the electrical parameter so that the light output is set by the values stored in the memory. Preferably, the controller comprises memory;

wherein the controller is configured to calibrate the electrical parameter to cause the light output to more closely match a target output based on target values of the light output stored in the memory. Preferably, the target values represent current values for different colors of the light. Preferably, the target values represent target brightness levels.

The waveguiding properties of the nanostructure 1 can be improved in different ways. The nanostructure 1 could have a first effective refractive index, $n_w$, and a cladding surrounding at least a portion of the nanostructure 1 could have a second effective refractive index, $n_c$, and by assuring that the first refractive index is larger than the second refractive index, $n_w > n_c$, good wave-guiding properties could be provided to the nanostructure 1. The waveguiding properties may be further improved by introducing an optically active cladding.

The high index material in the nanostructure 1 could, for example, be silicon nitride having a refractive index of about 2.0. The lower index cladding layer material could, for example, be a glass, plasma enhanced $Si_3N_4$, plasma enhanced $SiO_2$, $SiO_2$.

For a LED operating in different wavelengths from the visible to the IR and deep in the micrometer wavelengths, a variety of materials can be used, such as: Si, GaAs (p), InAs, Ge, ZnO, InN, GaInN, GaN AlGaInN, InP, InAsP, GaInP, InGaP:Si, InGaP:Zn, GaInAs, AlInP, GaAlInP, GaAlInAsP, GaInSb, InSb among others. To create CMOS circuits, Si and doped Si materials are preferable.

In one embodiment, the typical values of the refractive indexes for III-V semiconductor nanostructure 1 material are in the range from 2.5 to 5.5 when combined with glass type of cladding material (such as $SiO_2$ or $Si_3N_4$) having refractive indexes ranging from 1.4 to 2.3, satisfying the waveguiding requirement, $n_w > n_c$.

One consideration in the optimization of light extraction is to make the Numerical Aperture (NA) vary along the nanostructure 1 structure to optimize light extraction from the structure. In general, it is ideal to have the NA be highest when the light generation takes place furthest away from the exit location. This will maximize the light captured and guided toward the exit, in contrast, closer to the exit end of the structure, the NA can be made smaller since light generated will radiate in random directions and most of the radiate light will hit the top and side of the top part of the structure and exit. Having a lower NA in the top part of the structure also minimizes the light captures and guide back down through the structure that may not be ideal unless a reflector is inserted in the bottom of the structure. A low NA can be obtained by surrounding the III-V nanostructure 1 core with another III-V cladding of different composition with slightly less refractive index.

A nanostructured LED according to some embodiments could comprise a substrate and a nanostructure 1 epitaxially grown from the substrate. A portion of the nanostructure 1 is enclosed by a volume element. The volume element is preferably epitaxially connected to the nanostructure 1. A portion of or all of the nanostructure 1 could be arranged to act as a waveguiding portion directing at least a portion of the impinging light in a direction given by the elongated direction of the nanostructure 1, and will be referred to as a waveguide. The nanostructure 1 could have a diameter in the order of 50 nm to 500 nm. The length of the nanostructure 1 could be of the order of 1 to 10 μm.

The materials of the different members of the nanostructured LED are chosen so that the nanostructure 1 will have good waveguiding properties vis-a-vis the surrounding materials, i.e. the refractive index of the material in the nanostructure 1 should preferably be larger than the refractive indices of the surrounding materials.

If the nanostructure 1 has a first refracting index, $n_w$, the material surrounding the nanostructure 1 in wave guide portion, typically a cover layer, a second refractive index, $n_c$, and the a volume element, a third refractive $n_{ve}$, then $n_w > n_c$ and $n_w > n_{ve}$. Typical values for the nanostructured LED are $n_w \sim 4$, $n_c \sim 1.5$ and $n_{ve} \sim 3$.

In addition, the nanostructure 1 may be provided with one or more layers. For example an optical layer may be introduced specifically to improve the waveguiding properties of the nanostructure 1, in manners similar to what is well established in the area of fiber optics. The optical layer typically has a refractive index in between the refractive index of the nanostructure 1 and the surrounding cladding region material. Alternatively the intermediate layer has a graded refractive index, which has been shown to improve light transmission in certain cases. If an optical layer is utilized, the refractive index of the nanostructure 1, $n_w$, should define an effective refractive index for both the nanostructure 1 and the layers.

The ability to grow nanostructures 1 with well defined diameters could be to optimize the waveguiding properties of the nanostructure 1 with regards to the wavelength of the light confined in the nanostructured LED. The diameter of the nanostructure 1 could be chosen so as to have a favorable correspondence to the wavelength of the desired light. Preferably the dimensions of the nanostructure 1 are such that a uniform optical cavity, optimized for the specific wavelength of the produced light, is provided along the nanostructure 1. The nanostructure 1 generally is sufficiently wide to capture the desired light. A rule of thumb would be that diameter must be larger than $\lambda/2n_w$, wherein $\lambda$ is the wavelength of the desired light and $n_w$ is the refractive index of the nanostructure 1. As an example a diameter of about 60 nm may be appropriate to confine blue light only and one 80 nm may be appropriate for to confine both blue and green light in a silicon nanostructure 1.

In the infrared and near infrared a diameter above 100 nm would be sufficient. An approximate preferred upper limit for the diameter of the nanostructure 1 is given by the growth constrains, and could be in the order of 500 nm. The length of the nanostructure 1 is typically and preferably in the order of 1-10 μm, providing enough volume for the active region.

A reflective layer could be in one embodiment, provided on the substrate and extending under the wire. The reflective layer is preferably provided in the form of a multilayered structure comprising repeated layers of silicates for example, or as a metal film.

An alternative approach to getting a reflection in the lower end of the nanostructure 1 could be to arrange a reflective layer in the substrate underneath the nanostructure 1. Yet another alternative could be to introduce reflective means within the waveguide. Such reflective means can be a multi-layered structure provided during the growth process of the nanostructure 1, the multilayered structure comprising repeated layers of for example $SiN_x/SiO_x$ (dielectric) or GaAs/AlGaAs (semiconductor). Such repeated layers with controlled thickness could also serve as optical grating filters to precisely control the output wavelength of the LED to mitigate wavelength drift for example with temperature.

In a further embodiment, a major part of the produced light is directed by the waveguide of the nanostructure 1 in a downward direction through the substrate. The light can be directed through the entire thickness of the substrate, or alternatively the substrate could be provided with a cut out beneath the base of the nanostructure 1 in order to reduce the thickness of the substrate and thereby reduce the scattering or absorption of light in the substrate. The substrate is preferably made of transparent material. A portion, or preferably the entire outer surface of the volume element may be covered by a reflective layer that increases the radiation of the produced light through the waveguide. The reflective layer, for example formed of a metal, may additionally serve as a contact. Part of the nanostructure 1 and the substrate could optionally covered by a protective layer of SiC or SiN, for example.

In an embodiment, the volume element can be arranged to be a dispersive element, giving a light radiation that is essentially evenly distributed over a wide angle. Such device can be well suited for illuminating purposes wherein an even illumination is required. The active region may be arranged in the nanostructure 1 but alternatively may be within the volume element, and above the upper end of the nanostructure 1, or radially outwards of the nanostructure 1 and possibly above. The nanostructure 1 should preferably at its lower end be provided with some of the reflective means, for example a reflective material within the nanostructure 1, in order to redirect light upwards. The geometry of the volume element can be designed to further disperse the light. Dispersion is provided at the junction between the nanostructure 1 waveguide and the volume element and further at the edge formed by the upper boundary of the volume element. The height and width of the volume element can be chosen so that the edge disperses light further. One embodiment can be optimized for providing a collected and directionally oriented beam. The nanostructure 1 of relatively large diameter, preferably above 150 nm, can extend to the upper surface of the volume element. The nanostructure 1 can be provided with a concave lens like exit surface on the upper end.

Nanostructures 1, acting as waveguides, can be used to improve the performance of conventional planar LEDs. In an embodiment, a plurality of nanostructures 1 can be arranged on the surface of a planar LED. Light is produced in the active region, which could be an active layer of the planar LED, for example of GaAsP. The nanostructures 1 can be epitaxially connected on top of the planar LED layers in order to get a good matching of the different parts. The nanostructures 1 may be coated by a cladding layer protecting the nanostructures 1 and/or improving the properties, for example $Si_3N_4$, The surface in between the nanostructures 1 can be preferably coated with a reflective layer, for example of Au. At least a part of the light, produced in the active region, could enter the nanostructures 1 that are acting as waveguides and leading the light away from the substrate plane.

A wide range of materials can be used for the different parts of the nanostructured LED. Suitable materials for LED have to be matched with suitable materials for the photo diodes based on the wavelength of the light being emitted/detected by the system. Both the LED and the photo diode should work as intended in the wavelength range of light for which the system is configured to operate.

In addition, the nanostructure 1 based technology allows for defect free combinations of materials that otherwise would be impossible to combine. The III-V semiconductors are of particular interest due to their properties facilitating high speed and low power electronics. Suitable materials for the substrate include, but is not limited to: Si, GaAs, GaP, GaP:Zn, InAs, InP, GaN, $Al_2O_3$, SiC, Ge, GaSb, ZnO, InSb, SOI (silicon-on-insulator), CdS, ZnSe, CdTe. In the case of the present invention (i.e. for creating display structure in the visible light), a Si substrate is preferred since it embeds a CMOS photodiode underneath the LED. For wavelengths between blue and near IR, Si could be used in the photo diode. For wavelengths outside the range of light detected by Si, such as IR or UV light, it is possible to use GaAs in photodiodes for LED in the range of 800-1500 nm, e.g., 850 nm; and InGaAs/InP in the range 1310-1550 nm.

Suitable materials for the nanostructure 1 include, but is not limited to: Si, GaAs (p), InAs, Ge, ZnO, InN, GaInN, GaN AlGaInN, BN, InP, InAsP, GaInP, InGaP:Si, InGaP:Zn, GaInAs, AlInP, GaAlInP, GaAlInAsP, GaInSb, InSb. The materials of the nanostructures 1 can be selected to produce red, green and blue light based on the bandgaps of the materials.

A stream of photons with a wavelength of 532 nm (green light) would have an energy of approximately 2.33 eV. Similarly, 1 eV would correspond to a stream of infrared photons of wavelength 1240 nm, and so on.

The substrate could be an integral part of the device, since it also contains the photodiodes necessary to detect light that has not been confined to the nanostructure 1. For this application, the substrate in addition also contains standard CMOS circuits to control the biasing, amplification and readout of the LED as well as any other CMOS circuit deemed necessary and useful. The substrate includes substrates having active devices therein. Suitable materials for the substrates include silicon and silicon-containing materials. Generally, each sensor element of the embodiment includes a nanostructured LED structure comprising a nanostructure 1, a cladding enclosing at least a portion of the nanostructure 1, a coupler and two contacts. Similarly, for light in higher wavelengths, GaAs circuitry can be used with the appropriate light emitting materials for those wavelengths.

In one embodiment, a micro lens could be located on the LED. The micro lens may comprise any of several optically transparent lens materials that are known in the art. Non-limiting examples include optically transparent inorganic materials, optically transparent organic materials and optically transparent composite materials. Most common are optically transparent organic materials. Typically the lens layers could be formed incident to patterning and reflow of an organic polymer material that has a glass transition temperature lower than the series of color filter layers, if present, or the patterned planarizing layer. Polymeric materials should preferably have a high degree of stability with temperature to act as micro lenses for LEDs since this device needs to perform at high temperatures. The micro lens does not require a new material; simply patterning the clad material to the right shape forms it.

Figure 22:
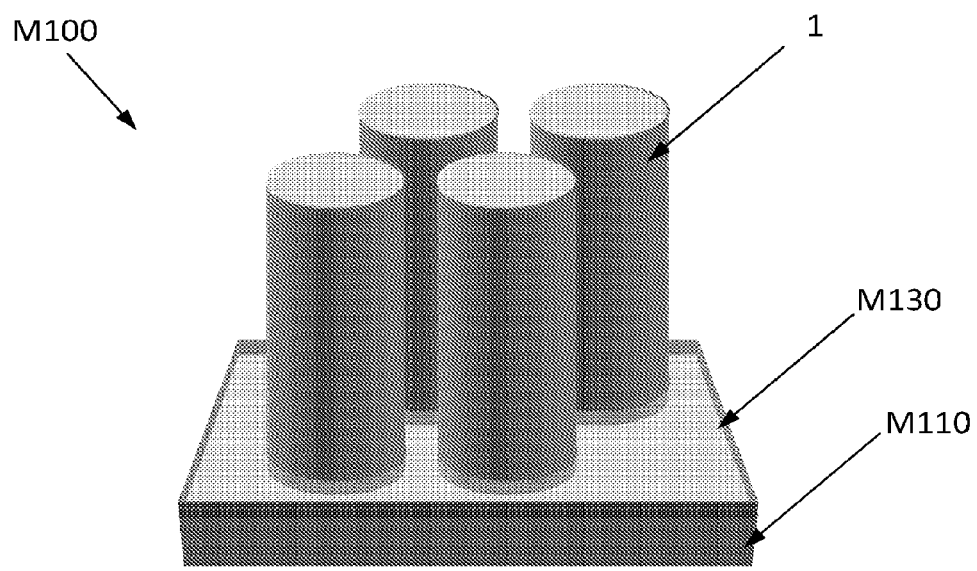
FIG. 22 shows a schematic perspective view of an array of nanostructures, according to an embodiment.
Figure 23:
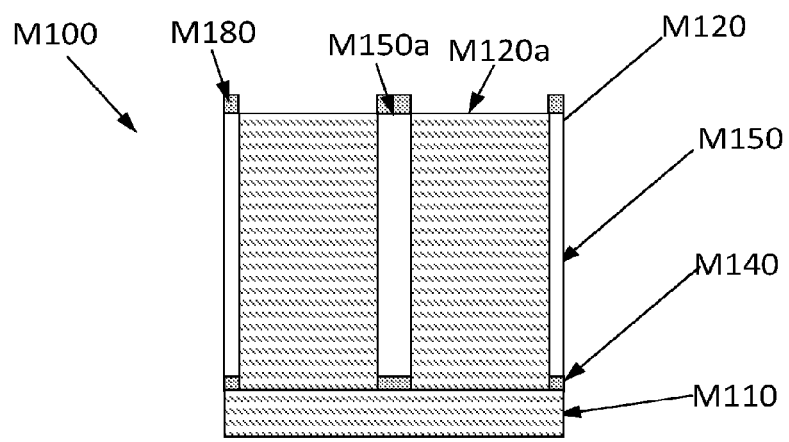
FIG. 23 shows a schematic cross-sectional view of the array of nanostructures of FIG. 22, according to an embodiment.

FIGS. 22 and 23 are a schematic perspective view and a schematic cross-sectional view of a nanostructure array M100, respectively, according to an embodiment. The nanostructure array M100 comprises a substrate M110, a plurality of fluorescent nanostructures 1, a reflective layer M140 disposed on the substrate M110 in areas between the fluorescent nanostructures 1. The fluorescent nanostructures 1 can be embedded in a material M150. The term "fluorescent nanostructures" as used herein means nanostructures that can fluoresce. The term "fluoresce" as used herein means to exhibit or undergo the phenomenon of fluorescence. The term "fluorescence" as used herein means the emission of light by a substance that has absorbed light or other electromagnetic radiation of a different wavelength. The term "fluoresced light" as used herein means emitted light from fluorescence of a substance. In most cases, emitted light has a longer wavelength, and therefore lower energy, than the absorbed radiation. However, when the absorbed electromagnetic radiation is intense, it is possible for one electron to absorb two photons; this two-photon absorption can lead to emission of radiation having a shorter wavelength than the absorbed radiation. Fluorescence has many practical applications, including mineralogy, gemology, chemical sensors, fluorescent labeling, dyes, biological detectors, and, most commonly, fluorescent lamps. For example, the common fluorescent lamp relies on fluorescence. Inside the glass tube is a partial vacuum and a small amount of mercury. An electric discharge in the tube causes the mercury atoms to emit ultraviolet light. The tube is lined with a coating of a fluorescent material, called the phosphor, which absorbs the ultraviolet and re-emits visible light.

The substrate M110 can be any suitable material, such as, silicon, sapphire, glass, silicon oxide, etc. The substrate M110 and the fluorescent nanostructures 1 can be the same material or different materials. The substrate M110 can have any suitable thickness such as 0.1-1 mm. Examples of the substrate M110 include a silicon wafer, a sapphire wafer, and a glass wafer.

The reflective layer M140 can be any suitable material, such as ZnO, Al, Au, Ag, Pd, Cr, Cu, a combination thereof, etc. The reflective layer M140 preferably has a reflectance of at least 50%, more preferably has a reflectance of at least 70%, most preferably has a reflectance of at least 90%, for fluoresced light from the fluorescent nanostructures 1. The reflective layer M140 has a thickness of preferably at least 5 nm, more preferably at least 20 nm. In addition to the areas between the fluorescent nanostructures 1, the reflective layer M140 can also be disposed on the substrate M110 in areas under the fluorescent nanostructures 1.

Figure 24:
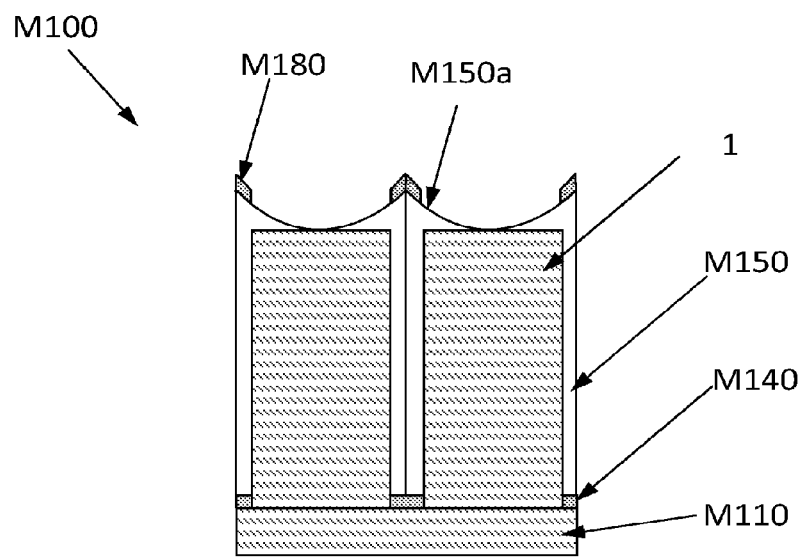
FIG. 24 shows an alternative schematic cross-sectional view of the array of nanostructures of FIG. 22, according to an embodiment.

The material M150 in which the are embedded can be any suitable material substantially transparent to fluoresced light from the fluorescent nanostructures 1. For example, the material M150 can be silicon oxide, silicon nitride or a combination thereof. A surface M150a of the material M150 can be substantially coextensive with surfaces M120a of the fluorescent nanostructures 1 such that the surfaces M120a of the fluorescent nanostructures 1 are exposed. Alternatively, the fluorescent nanostructures 1 can be entirely buried in the material M150 without any exposed surface. As shown in FIG. 24, the surface M150a of the material M150 can have a concave shape effective to focus fluoresced light from the fluorescent nanostructures 1. A refractive index of the material M150 is preferably smaller than a refractive index of the fluorescent nanostructures 1. A partial reflective layer M180 can be deposited on the surface M150a in areas around the surfaces M120a wherein no portion of the surfaces M120a overlaps the partial reflective layer M180. The term "partial reflective layer" as used herein means a layer with a reflectance less than 100%. For example, a partial reflective layer can be a layer of Ag or Al with a thickness less than 10 nm.

The fluorescent nanostructures 1 can comprise one or more suitable fluorescent material, such as GaN, ZnO, organic fluorescent materials, or a combination thereof. The fluorescent nanostructures 1 can also be one or more non-fluorescent material with one or more fluorescent material embedded therein and covered thereby, such as diamond with color centers embedded therein. Fluorescence is the emission of light by a substance that has absorbed light or other electromagnetic radiation of a different wavelength from emitted light. In most cases, the emitted light has a longer wavelength, and therefore lower energy, than the absorbed radiation. In an example, the fluorescent nanostructures 1 are diamond with nitrogen vacancy defects as the color centers. The color centers can be embedded randomly in the fluorescent nanostructures 1. In a given nanostructure array M100, at least 100%, 75%, 50%, 25%, or 10% of the fluorescent nanostructures 1 have at least one color center. A nitrogen vacancy defect (also referred to as a nitrogen vacancy center) is one of numerous point defects in diamond consisting of a substitutional nitrogen atom and a vacancy in an adjacent site of the diamond lattice. Diamond with embedded nitrogen vacancy defects can be created by irradiating nitrogen doped diamond with 1-2 MeV electrons followed by annealing in vacuum at about 850-1000° C. for about 2-20 hours. Nitrogen vacancy defects are resistant to photobleaching, i.e., fluorescence intensity of nitrogen vacancy defects remains unchanged after several hours of continuous laser irradiation in the saturation regime. The saturation regime as used here in means a range of laser irradiation intensity in which fluorescence intensity of the nitrogen vacancy defects is independent from the laser irradiation intensity. Nitrogen vacancy defects can have high quantum yield at temperatures up to in excess of 500 K. A nitrogen vacancy defect can fluoresce at wavelengths such as 637 nm and 531 nm, depending on the symmetry of the nitrogen atom of the nitrogen vacancy defect relative to the diamond lattice. The term "quantum yield" gives the efficiency of the fluorescence process and is defined as the ratio of the number of photons emitted to the number of photons absorbed. The fluorescent nanostructures 1 can have any cross-sectional shape. For example, the fluorescent nanostructures 1 can be cylinders or prisms with elliptical, circular, rectangular, polygonal cross-sections.

Figure 25:
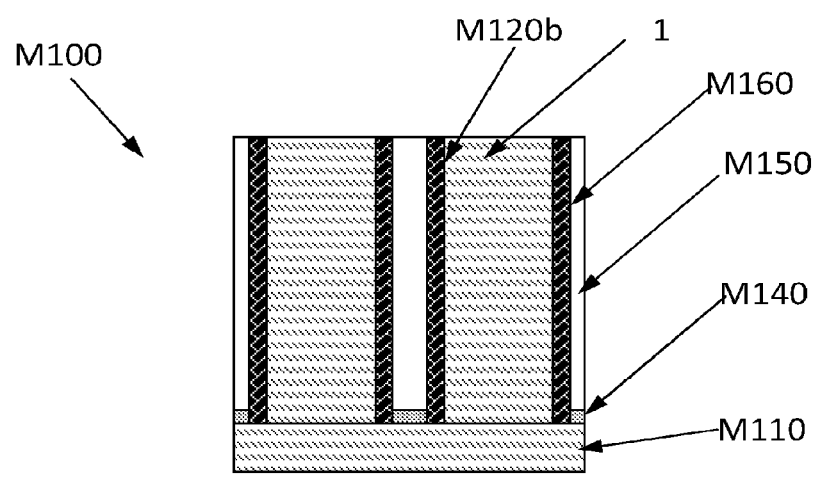
FIG. 25 shows yet another schematic cross-sectional view of the array of nanostructures of FIG. 22, according to an embodiment.

As shown in FIG. 25, the fluorescent nanostructures 1 can have a cladding layer M160 surrounding a sidewall M120b of each of the fluorescent nanostructures 1. The cladding layer M160 can be any suitable material substantially transparent to fluoresced light from the fluorescent nanostructures 1. If the fluorescent nanostructures 1 are embedded in the material M150, a refractive index of cladding layer M160 preferably is greater than the refractive index of the material M150 and smaller than the refractive index of the fluorescent nanostructures 1.

The fluorescent nanostructures 1 preferably are arranged in an array, such as a rectangular array, a hexagonal array, a square array, concentric ring. The term "pitch" is defined as a distance of a fluorescent nanostructure 1 to a nearest neighbor of the fluorescent nanostructure 1 along a direction parallel to the substrate M110. The term "array" as used herein means a spatial arrangement having a particular order. The fluorescent nanostructures 1 preferably have a substantially uniform length.

The pitch of the nanostructure array M100 and the radius, length, material of the fluorescent nanostructures 1, and the material M150 are selected such that the fluorescent nanostructures 1 fluoresce at a wavelength of a collective mode of the nanostructure array M100. The pitch of the nanostructure array M100 is preferably 100 nm to 10 microns, more preferably 300 nm to 1 micron. The radius of the fluorescent nanostructures 1 is preferably 20 to 200 nm, more preferably 30 to 80 nm. The length of the fluorescent nanostructures 1 is preferably from 100 nm to 10 microns, more preferably from 800 nm to 5 microns. The collective mode is a mode of the entire nanostructure array M100 instead of a mode of individual fluorescent nanostructures 1. When the fluorescent nanostructures 1 fluoresce at the collective mode of the nanostructure array M100, fluoresced light of the fluorescent nanostructures 1 is substantially spatially and/or temporally coherent. Fluoresced light from such an nanostructure array M100 has a much higher intensity than fluoresced light from an individual fluorescent nanowire and remains coherent. Namely, the nanostructure array M100 can be a coherent light source. A coherent light source is a light source whose emitted light is substantially coherent, temporally, spatially, or both. A coherent light source can have application such as in quantum communication, in quantum cryptography, and as laser. The term "mode" as used herein means a possible standing electromagnetic wave in the nanostructure array M100. A standing wave, also known as a stationary wave, is a wave that remains in a constant position. In a stationary medium, a standing wave can occur as a result of interference between two waves traveling in opposite directions. Not all standing waves are possible in a given system. Possible standing waves are dictated by characteristics of the system, such as, physical dimensions, shapes, chemical composition and/or characteristics of an environment in the vicinity of the system. The wavelength of the standing wave of a mode is called the wavelength of the mode.

Figure 26:
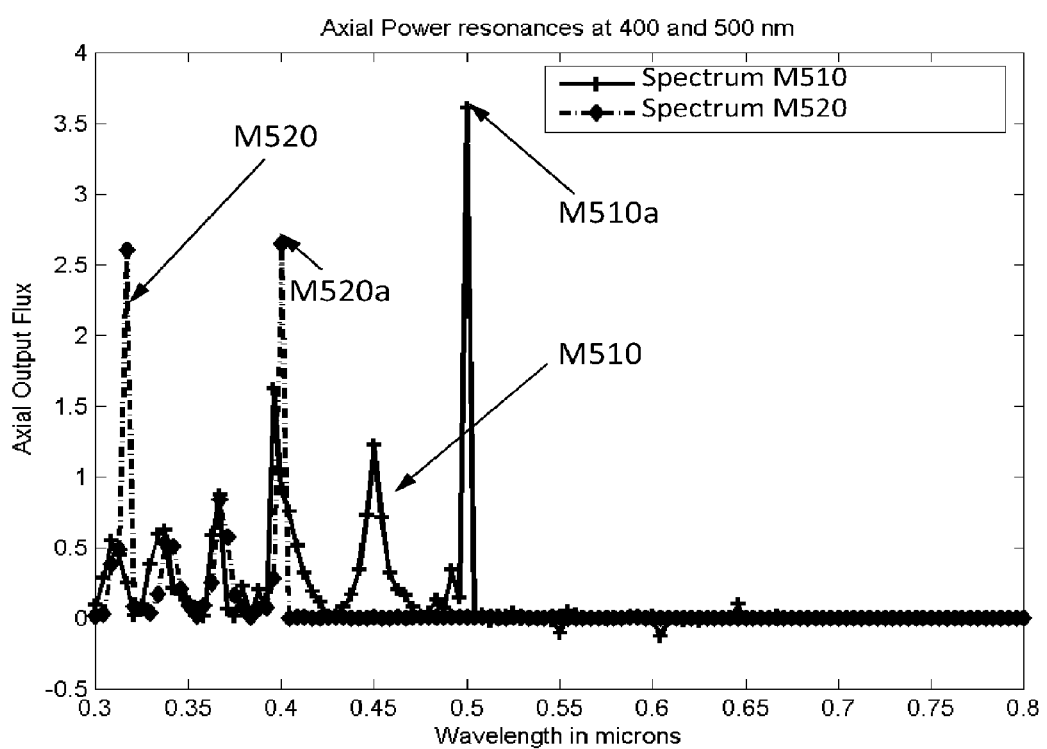
FIG. 26 shows simulated fluorescence spectra of two exemplary arrays of nanostructures in axial directions thereof.

FIG. 26 shows simulated fluorescence spectra of two exemplary nanostructure arrays in axial directions thereof. The axial direction of a nanostructure array means the direction perpendicular to the substrate of the nanostructure array. The simulation is done using the finite difference time domain (FDTD) method. The FDTD method is a method of numerically simulating propagation of light in a structure and can be used to predict detailed characteristics of the propagation. Both spectra M510 and M520 show sharp peaks such as the peaks M510a and M520a. These peaks M510a and M520a are at wavelengths of collective modes of the exemplary nanostructure arrays, respectively. Spectrum M510 is a fluorescence spectra of one of the exemplary nanostructure arrays wherein the fluorescent nanostructures 1 are diamond nanowires and have a radius of 50 nm and pitch of 500 nm. Spectrum M520 is a fluorescence spectra of the other one of the exemplary nanostructure arrays wherein the fluorescent nanostructures 1 are diamond nanowires, have a radius of 60 nm and pitch of 400 nm. In both spectra M510 and M520, the highest peaks M510a and M520a are at wavelengths substantially equal to the pitches of the exemplary nanostructure arrays, respectively. This observation leads to a method of designing a nanostructure array that fluoresces at a wavelength of interest, the method comprising: selecting the wavelength of interest; selecting a pitch of the nanostructure array to be substantially equal to the wavelength of interest; selecting a radius of fluorescent nanowires of the nanostructure array that maximizes fluorescence intensity of the nanostructure array at the wavelength of interest; selecting a material of the fluorescent nanowires such that the fluorescent nanowires fluoresce at the wavelength of interest.

Figure 27:
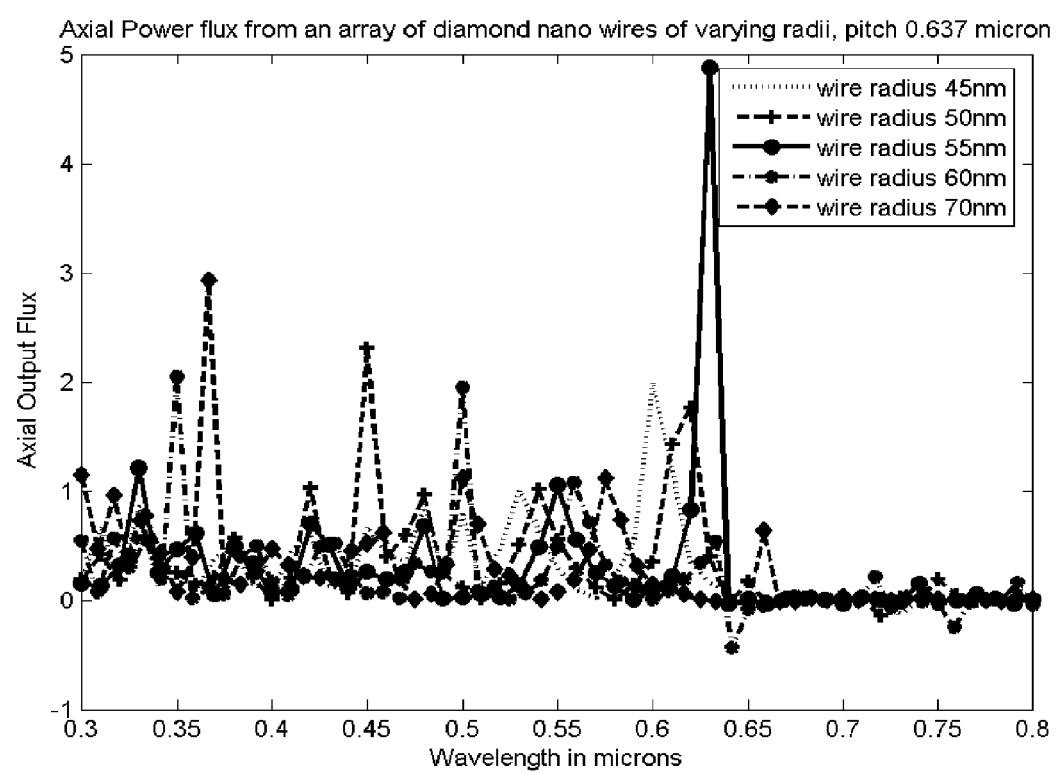
FIG. 27 shows simulated fluorescence spectra of several exemplary arrays of nanostructures in axial directions thereof, all of which have a same pitch of 637 nm and different radii.

FIG. 27 shows results of this method of design for a wavelength of interest at about 630 nm. Among five nanostructure arrays all with a pitch of 637 nm but different radii of fluorescent nanowires, one nanostructure arrays with fluorescent nanowires with a radius of about 55 nm maximizes fluorescence intensity of the nanostructure array at the wavelength of interest.

Once a pitch of a nanostructure array, a radius and a material of fluorescent nanowires in the nanostructure array are determined, for examples, by the methods above, length of the fluorescent nanowires can be determined in a method as described below. A MODE solver is used to determine an effective refractive index $n_{eff}$ of the nanostructure array at the wavelength of interest $\lambda_{air}$, given the pitch of the nanostructure array and the radius and material of the fluorescent nanowires therein. An effective wavelength $\lambda_{eff}$ is defined as $\lambda_{eff}=\lambda_{air}/n_{eff}$. The length of the fluorescent nanowires is selected to be a multiple of $\lambda_{eff}$, which guarantees that the nanostructure array has a collective mode at the wavelength of interest.

A MODE solver can accurately describe light propagation in a structure of any geometries. FDTD and MODE solvers from Lumerical Solutions, Inc. located at Vancouver, British Columbia, Canada were used.

Figure 28:
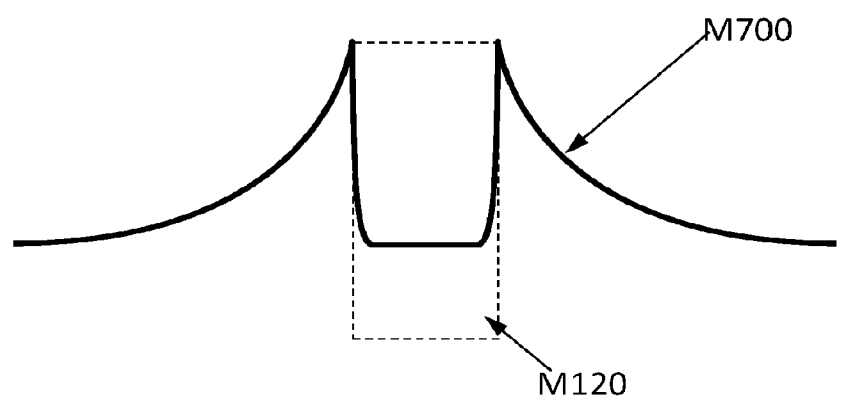
FIG. 28 shows a schematic light distribution of an air mode of the array of nanostructures.

The collective mode of the nanostructure array can be an air mode. As shown in FIG. 28, the term "air mode" as used herein means a mode in which light intensity M700 is substantially zero within the fluorescent nanostructures 1 and substantially non-zero outside the fluorescent nanostructures 1.

Figure 29:
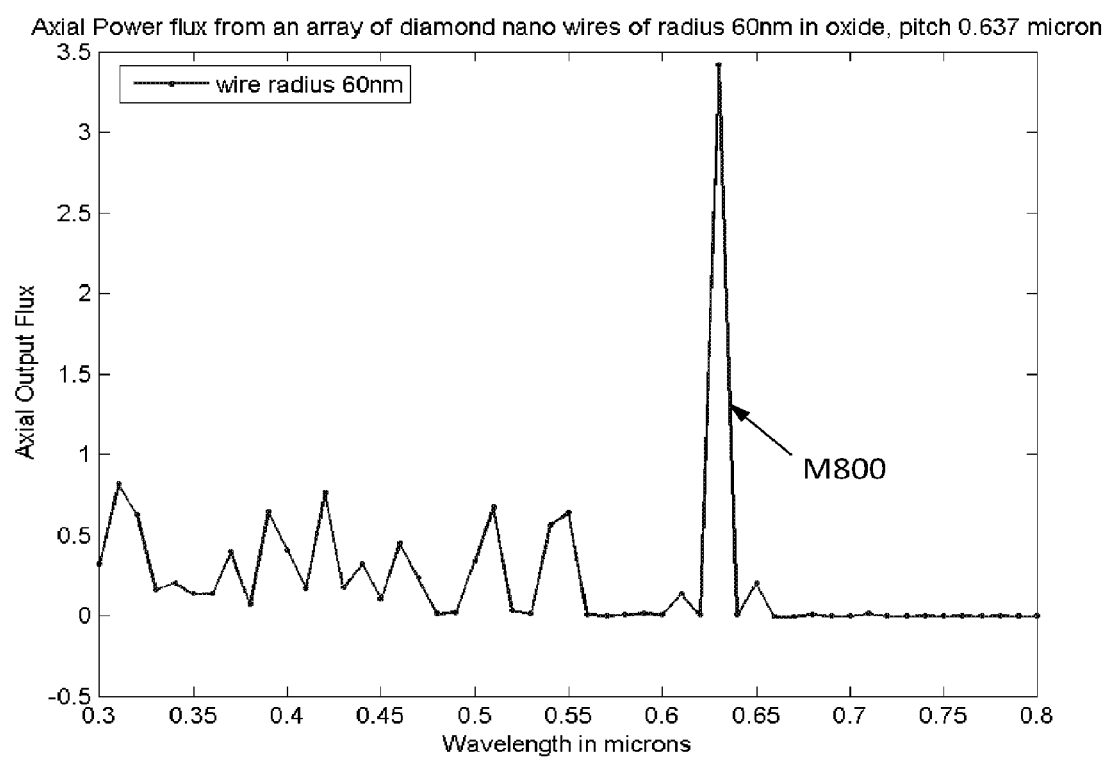
FIG. 29 shows a simulated fluorescence spectrum of an exemplary array of nanostructures in axial directions thereof, wherein the fluorescent nanostructures are embedded in oxide.

FIG. 29 shows a simulated fluorescence spectrum of an exemplary nanostructure array M100 in axial directions thereof, using the FDTD method. The fluorescent nanostructures 1 of this exemplary nanostructure array M100 has a pitch of 637 nm and a radius of 60 nm. The fluorescent nanostructures 1 of this exemplary nanostructure array M100 are embedded in a material M150 which is an oxide. Compared with the spectra of FIG. 27, it can be seen that embedding the fluorescent nanostructures 1 in the material M150 shifts the radius that maximizes fluorescence intensity of the nanostructure array M100 from about 55 nm to about 60 nm. A partially reflective layer M180 can be deposited in areas on the surface M150a around the fluorescent nanostructures 1 as shown in FIGS. 23 and 24. The partially reflective layer M180 and the concave shape of the surface M150a can enhance sharpness of the peak M800. Sharpness of a peak can be defined by the Q value (Q factor, or quality factor) defined as center of the peak divided by a full width at half maximum (FWHM) of the peak. A higher Q value indicates a sharper peak.

Figure 30:
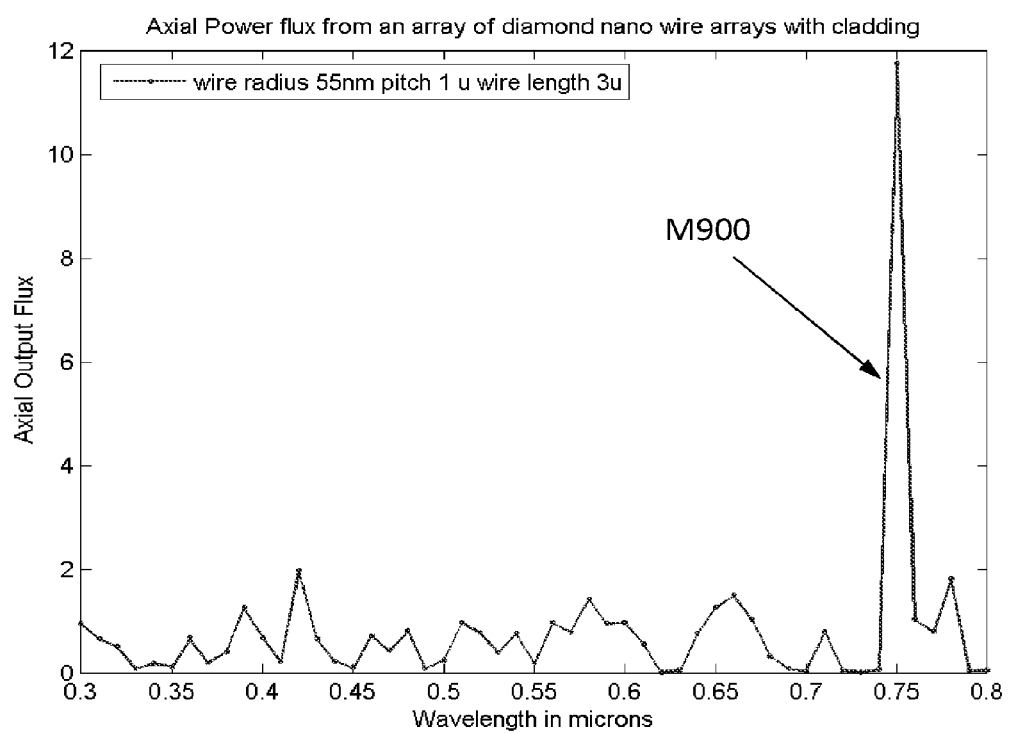
FIG. 30 shows a simulated fluorescence spectrum of an exemplary array of nanostructures in axial directions thereof, wherein the fluorescent nanostructures have a cladding layer.

FIG. 30 shows a simulated fluorescence spectrum of an exemplary nanostructure array M100 in axial directions thereof, using the FDTD method. The fluorescent nanostructures 1 of this exemplary nanostructure array M100 has a pitch of 1 micron, a radius of 55 nm and a height of 3 microns. The fluorescent nanostructures 1 have a cladding layer M160 having a thickness of 300 nm. The fluorescent nanostructures 1 are not embedded in a material M150. The effect of the cladding layer M160 is evident by comparing the spectrum of FIG. 30 with the spectrum of FIG. 29: the peak M900 of FIG. 30 is taller than the peak M800 of FIG. 29 and the peak M900 is shifted to 750 nm from the position of the peak M800 at 637 nm.

Figure 31:
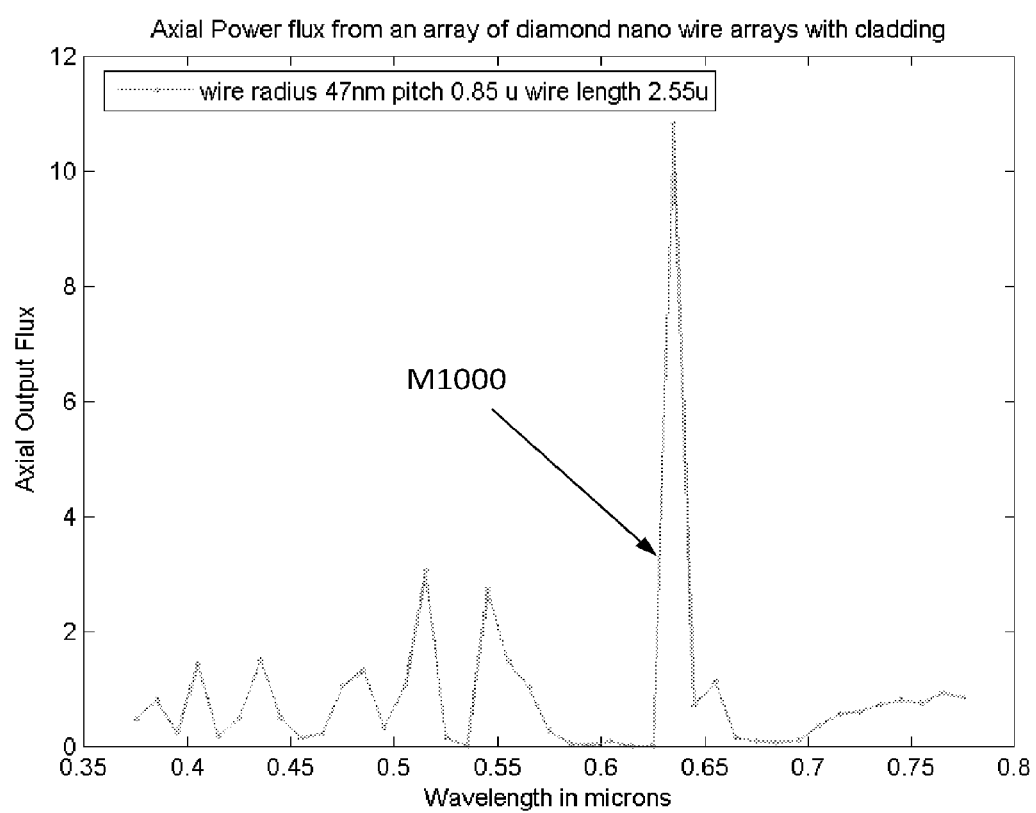
FIG. 31 shows a simulated fluorescence spectrum of an exemplary array of nanostructures in axial directions thereof, wherein the fluorescent nanostructures have a cladding layer and wherein the array of nanostructures of FIG. 31 has dimensions to scale with the array of nanostructures of FIG. 30 and a peak position at 637 nm.

The peak M900 can be adjusted to 637 nm by scaling the physical dimensions of the nanostructure array M100 (pitch, nanowire radius, nanowire length) by a factor of 637 nm/750 nm=0.85. FIG. 31 shows result of this scaling. FIG. 31 shows a simulated fluorescence spectrum of an exemplary nanostructure array M100 in axial directions thereof, using the FDTD method. The fluorescent nanostructures 1 of this exemplary nanostructure array M100 has a pitch of 0.85 micron (=1 micron×0.85), a radius of 47 nm (=55 nm×0.85) and a height of 2.55 microns (=3 microns×0.85). The fluorescent nanostructures 1 have a cladding layer M160 having a thickness of 255 nm (=300 nm×0.85). Indeed the peak M1000 of FIG. 31 falls at 637 nm.

The nanostructure array M100 can be used as a light source such as a laser. According to an embodiment, a light source comprises one or more of the nanostructure array M100. A method of using the nanostructure array M100 as a light source comprises exposing the nanostructure array M100 to a light, wherein the light preferable has a shorter wavelength than the wavelength of the wavelength of the collective mode of the nanostructure array at which the fluorescent nanowires are operable to fluoresce. For example, if the wavelength of the collective mode is 500 nm, the light preferably has a wavelength less than 500 nm. The light can be provided by any suitable source such as LEDs, fluorescent lamps, mercury-vapor lamps, sodium-vapor lamps, discharge lamps, sunlight, incandescent lamps and/or laser.

The nanostructure array M100 can be manufactured using an exemplary method, according to an embodiment, the exemplary method comprising: providing a substrate M110 having a layer of fluorescent material; coating a resist layer on the layer of fluorescent material; patterning the resist layer using a lithographic technique such as photolithography, e-beam lithography or holographic lithography such that a pattern corresponding to the fluorescent nanostructures 1 is formed in the resist layer; forming the fluorescent nanostructures 1 by etching the layer of fluorescent material; depositing the reflective layer M140 using a suitable deposition technique such as e-beam evaporation, thermal evaporation, or sputtering.

Another exemplary method of manufacturing the nanostructure array M100, according to an embodiment, comprises: providing a substrate M110; growing the fluorescent nanostructures 1 on the substrate by a suitable method such as the vapor-liquid-solid (VLS) method; depositing the reflective layer M140 using a suitable deposition technique such as e-beam evaporation, thermal evaporation, or sputtering. The VLS method is a method for the growth of one-dimensional structures, such as nanowires, from chemical vapor deposition. Growth of a crystal through direct adsorption of a gas phase on to a solid surface is generally very slow. The VLS method circumvents this by introducing a catalytic liquid alloy phase which can rapidly adsorb a vapor to supersaturation levels, and from which crystal growth can subsequently occur from nucleated seeds at the liquid-solid interface. The physical characteristics of nanowires grown in this manner depend, in a controllable way, upon the size and physical properties of the liquid alloy.

The exemplary methods can also comprise a step of depositing a fluorescent material on the fluorescent nanostructures 1 by a suitable technique such as e-beam evaporation, thermal evaporation, sputtering, chemical vapor deposition (CVD), atomic layer deposition (ALD), electrochemical deposition, followed by an optional annealing step.

The exemplary methods can also comprise a step of embedding a fluorescent material in the fluorescent nanowires by a suitable technique such as ion implantation, irradiation with electrons, followed by an optional annealing step.

The exemplary methods can also comprise a step of coating a dielectric nanowire around a fluorescent or an active emitting material such a nanowire laser. By a suitable technique such as ALD or CVD.

The exemplary methods can also comprise a step of coating a cladding layer surrounding a sidewall M120b of the fluorescent nanowires, using a suitable technique such as e-beam evaporation, thermal evaporation, sputtering, chemical vapor deposition (CVD), atomic layer deposition (ALD), electrochemical deposition.

The exemplary methods can also comprise a step of filling space between the fluorescent nanowires with the material M150 by a suitable technique such as e-beam evaporation, thermal evaporation, sputtering, chemical vapor deposition (CVD), atomic layer deposition (ALD), electrochemical deposition, followed by an optional step of planarization such as chemical-mechanical planarization (CMP).

According to an embodiment, an image sensor comprises a plurality of pixels, each pixel of which has at least a nanostructure 1 in a form of a nanowire that can convert light impinging thereon to electrical signals and a gate electrode surrounding the nanostructure 1 preferably near its lower end (i.e. the end connected to a substrate). The gate electrode may be located at another location of the nanostructure 1. The gate electrodes are functional to individually electrically connect the nanostructures 1 to or disconnect the nanostructures 1 from external readout circuitry. The pixels can be arranged in any suitable pattern such as a square grid, a hexagonal grid, and concentric rings. The pixels can be fabricated to absorb light in the ultraviolet (UV), visible (VIS) or infrared (IR) regions and to generate a detectable electrical signal in response thereto.

The nanostructures 1 essentially extend perpendicularly from the substrate, which can also be referred to as "standing-up".

The image sensor can be configured for various types of uses such as compact image sensors and spectrophotometers.

In one embodiment, the pixels are organized into a plurality of "rows". The pixels in each row are electrically connected in parallel to a readout line. Pixels in different rows are electrically connected to different readout lines. The pixels can be organized into a plurality of "columns" such that the gate electrodes of the pixels in each column are electrically connected in parallel to a gate line, the gate electrodes of the pixels in different columns are electrically connected to different gate lines, and no two different pixels are connected to a same readout line and their gate electrodes are connected to a same gate line. The terms "row" and "column" do not require that pixels are physically aligned or arranged in any particular way, but rather are used to describe topological relationship between the pixels, readout lines and gate lines. An exemplary image sensor according to this embodiment comprises first, second, third, fourth pixels, each of which has a gate electrode, a first readout line electrically connected to the first and second pixels, a second readout line electrically connected to the third and fourth pixels, a first gate line electrically connected to the gate electrodes of the first and third pixels and a second gate line electrically connected to the gate electrodes of the second and fourth pixels.

In one embodiment, each pixel has at least one nanostructure 1. The nanostructures 1 in the pixels can be configured to absorb, confine and transmit light impinging thereon. For example, the nanostructures 1 can function as waveguides to confine and direct light in a direction determined by its physical boundaries.

In one embodiment, more than one pixels can have a common electrode electrically connected thereto, for example, for providing a bias voltage. The common electrode can be a top layer made of a transparent conductive material, such as ITO (indium tin oxide) or aluminum doped ZnO (AZO).

In one embodiment, the readout lines and the gate lines can have suitable electronic devices connected thereto, such as, amplifiers, multiplexers, D/A or A/D converters, computers, microprocessing units, digital signal processors, etc.

In one embodiment, the nanostructures 1 and the substrate can comprise suitable semiconductor materials and/or metals such as Si, GaAs, InAs, Ge, ZnO, InN, GaInN, GaN, AlGaInN, BN, InP, InAsP, GaInP, InGaP:Si, InGaP:Zn, GaInAs, AlInP, GaAlInP, GaAlInAsP, GaInSb, InSb, Al, Al—Si, $TiSi_2$, TiN, W, $MoSi_2$, PtSi, $CoSi_2$, $WSi_2$, In, AuGa, AuSb, AuGe, PdGe, Ti/Pt/Au, Ti/Al/Ti/Au, Pd/Au, ITO (InSnO). The nanostructures 1 and the substrate can be doped by suitable dopants such as GaP, Te, Se, S, Zn, Fe, Mg, Be, Cd, etc. It should be noted that the use nitrides such as $Si_3N_4$, GaN, InN and AlN can facilitate fabrication of image sensors that can detect light in wavelength regions not easily accessible by conventional techniques. Doping levels of the nanostructures 1 and the substrate can be up to $10^{20}$ atoms/cm$^3$. Other suitable materials are possible.

Methods of fabrication of the image sensor can include shallow trench isolation (STI), also known as "Box Isolation Technique." STI is generally used on CMOS process technology nodes of 250 nanometers and smaller. Older CMOS technologies and non-MOS technologies commonly use isolation based on Local Oxidation of Silicon (LOCOS). STI is typically created early during the semiconductor device fabrication process, before transistors are formed. Steps of the STI process include, for instance, etching a pattern of trenches in the substrate, depositing one or more dielectric materials (such as silicon dioxide) to fill the trenches, and removing the excess dielectric using a technique such as chemical-mechanical planarization.

The nanostructures 1 can be formed by a dry etching process, such as a deep etching process, or a Bosch process, in combination with a suitable lithography technique (e.g. photolithography, e-beam lithography, holographic lithography). The nanostructures 1 can also be formed by a Vapor Liquid Solid (VLS) method. Diameters of the nanostructures 1 can be from 10 to 2000 nm, preferably 50 to 150 nm, more preferably 90 to 150 nm. Lengths of the nanopillars can be from 10 nm to 10000 nm, preferably 1000 nm to 8000 nm, more preferably 4000 nm to 6000 nm. The nanostructures 1 can have any suitable cross-sectional shape such as a circle, a square, a hexagon.

The nanostructures 1 can be sized to selectively absorb a wavelength region of interest, for instance, as described in co-pending U.S. Patent Application Ser. No. 61/357,429 filed Jun. 22, 2010, herein incorporation by reference in its entirety. Absorptance can be adjusted by varying the nanostructure 1 spacing (pitch), particularly to near unity.

The nanostructures 1 can have a cladding material. The nanostructures 1 can selectively absorb UV light, red light, green light, blue light, or IR light.

The image sensor can have large number of nanostructures 1, for instance, a million or more.

A method of using the image sensor comprises: (a) exposing the pixels to light; (b) reading electrical signals from a pixel by connecting at least one nanopillar in the pixel to external readout circuitry using the gate electrode surrounding the at least one nanopillar of the pixel. The electrical signals can be electric charge accumulated on the nanopillar, a change of electrical current through the nanopillar, or a change of electrical impedance of the nanopillar.

Figure 32:
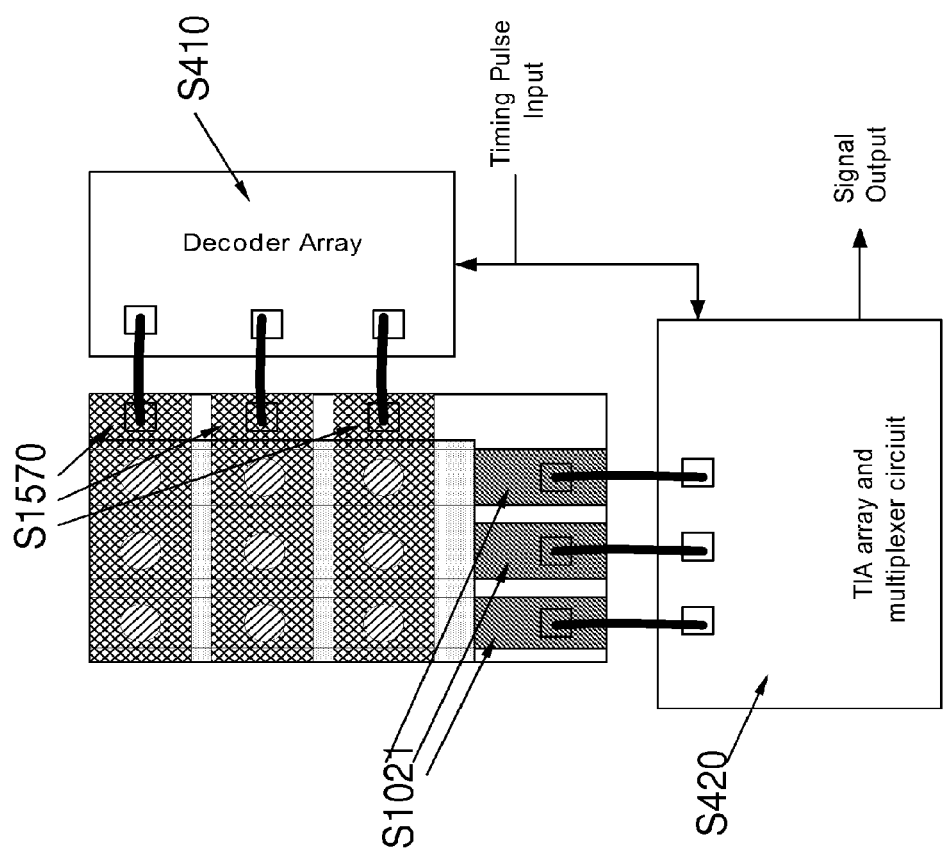
FIG. 32 and FIG. 33 show an apparatus comprising the image sensor, according to an embodiment.
Figure 33:
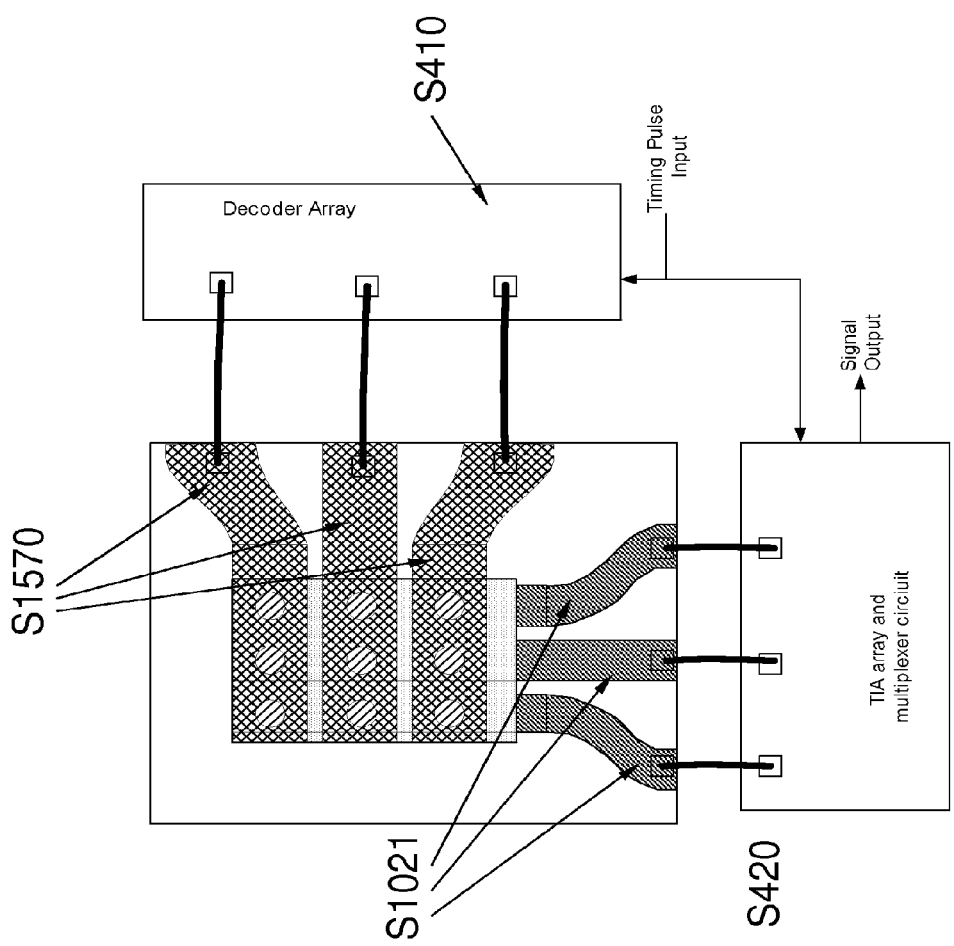

FIGS. 32 and 33 show an apparatus comprising the image sensor and a control circuit. The control circuit comprises a decoder S410 and a trans-impedance amplifier (TIA) and multiplexer circuit S420. The image sensor and the control circuit can be formed as an integrated circuit or chip. To control or address the nanopillars, a gate voltage can be selectively applied to one of the gate lines S1570 at a time to allow electrical current through those nanopillars connected to that particular gate line S1570 and the readout lines S1021 can be used to read electrical current from each of those nanopillars. In this way, a row-by-row (i.e. gate line by gate line) addressing scheme may be executed. The TIA and multiplexer circuit S420 is connected to each readout line S1021 and can include a multiplexer to sequentially output electrical current one each readout line S1021 to a single terminal. The TIA and multiplexer circuit S420 can amplify the electrical current from each readout line S1021 and convert it into a voltage signal. The decoder array S410 is connected to each gate line S1570 and can include a multiplexer to sequentially apply gate voltages to each gate line S1570. The TIA and multiplexer circuit S420 and the decoder array S410 can be synchronized by a common timing signal from a timing pulse input. A controller can be used to generate the timing signal. The control circuit can further comprise other functional components, such as, for example, an analog-to-digital converter, an exposure controller, and a bias voltage circuit, etc. An exemplary TIA can be OPA381; an exemplary multiplexer can be ADG732, and an exemplary decoder can be SN74154 (all from Texas Instruments Inc). It will be appreciated, of course, that other readout circuitry components may also be used.

The control circuit can be connected to the image sensor by any suitable interconnect techniques, such as wire-bonding, flip-chip bonding or bump bonding.

The readout lines S1021 and the gate lines S1570 can be parallel as shown in FIG. 32 or can have a "fan-out" shape as shown in FIG. 33. As will be appreciated the fan out shaped electrodes provide greater room for connections to external circuitry.

The image sensor described herein can be used as various image sensors, including contact image sensors (CIS). Contact image sensors are capable of resolving features of a size approximately equal to the size of the pixel. The size of the pixel may be determined by the size of the nanopillar and the surrounding region in which the evanescent field propagates. CISs are a relatively recent technological innovation in the field of optical flatbed scanners that are rapidly replacing charge-coupled devices (CCDs) in low power and portable applications. As the name implies, CISs place the image sensor in near direct contact with an object to be scanned in contrast to using mirrors to bounce light to a stationary sensor, as is the case in conventional CCD scanners. A CIS typically consists of a linear array of detectors, covered by a focusing lens and flanked by red, green, and blue LEDs for illumination. Usage of LEDs allows the CIS to be relatively power efficient, with many scanners being powered through the minimal line voltage supplied, for instance, via a universal serial bus (USB) connection. CIS devices typically produce lower image quality compared to CCD devices; in particular, the depth of field is limited, which poses a problem for material that is not perfectly flat. However, a CIS contact sensor is typically modularized. All the necessary optical elements may be included in a compact module. Thus, a CIS module can help to simplify the inner structure of a scanner. Further, a CIS contact sensor is typically smaller and lighter than a CCD line sensor. With a CIS, the scanner can be portable with a height around 30 mm.

A CIS can include an elongate optical assembly comprising illumination, optical imaging, and detection systems. The illumination source illuminates a portion of the object (commonly referred to as a "scan region"), whereas the optical imaging system collects light reflected by the illuminated scan region and focuses a small area of the illuminated scan region (commonly referred to as a "scan line") onto the pixels of the CIS. The pixels convert light incident thereon into electrical signals. Image data representative of the entire object then may be obtained by sweeping the CIS across the entire object.

A method of scanning an object using a CIS essentially comprises three steps: first, the pixels of the CIS convert reflected light they receive from the object into analog electrical signals; second, the analog electrical signals are amplified; third, the amplified analog electrical signals are converted to digital electrical signals by an analog-to-digital (A/D) converter. The digital signals may then be further processed and/or stored as desired.

Figure 34:
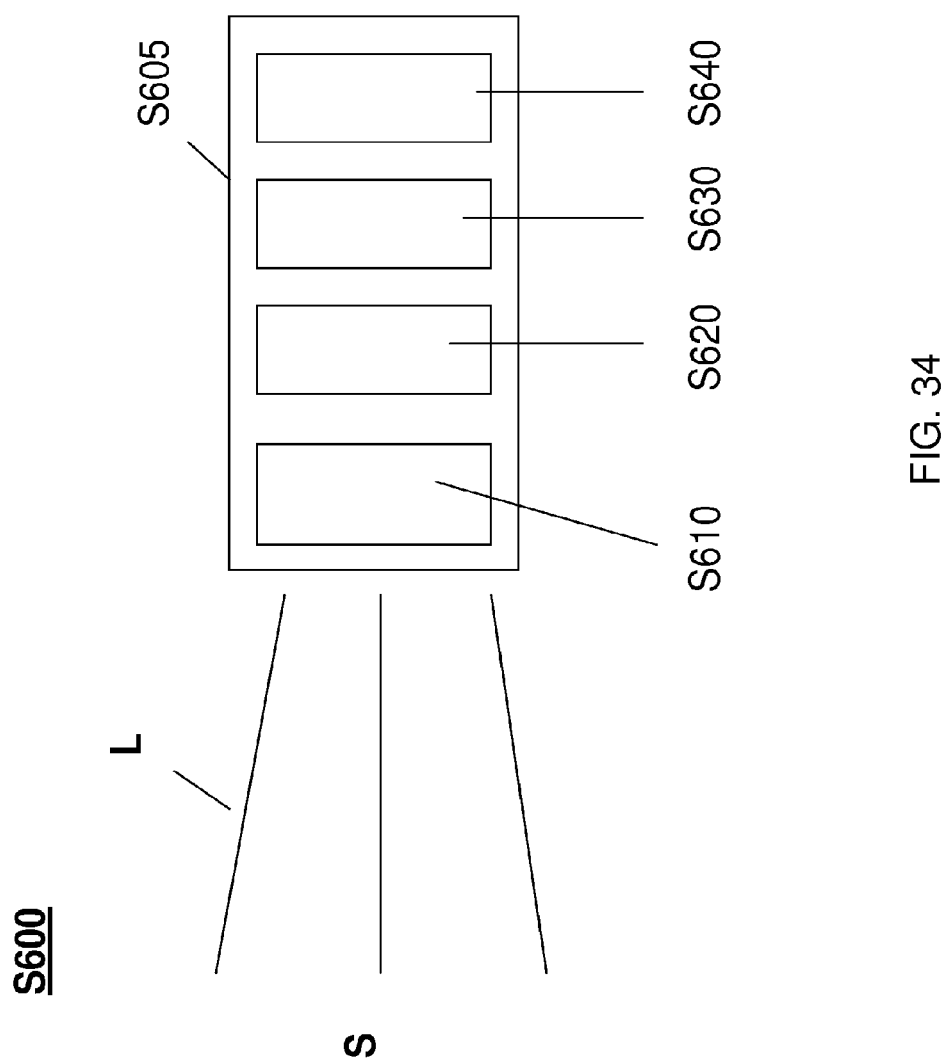
FIG. 34 shows another apparatus comprising the image sensor, according to an embodiment.

FIG. 34 shows a schematic of an apparatus S600 in accordance with an embodiment. The apparatus S600 comprises foreoptics S610, the image sensor S620, a readout circuit (ROC) S630, and a processor S640. A housing may enclose and protect one of more the foregoing components of the apparatus S600 from excessive or ambient light, the environment (e.g., moisture, dust, etc.), mechanical damage (e.g., vibration, shock), etc.

Light (L) from a scene (S) emanates toward the apparatus S600. For clarity, only L from S impinging upon the apparatus S600 is depicted (although it will be appreciated that L from S propagates in all directions).

The foreoptics S610 may be configured to receive L from S and focus or collimate the received L onto the image sensor S620. For instance, foreoptics S610 may include one or more of: a lens, an optical filter, a polarizer, a diffuser, a collimator, etc.

The pixels in the image sensor S620 may include nanopillars of different sizes (e.g. from about 50 to 200 nm) for selective detection of light across a wavelength regions of interest.

The ROC S630 may be connected to the image sensor S620 and is configured to receive output therefrom.

The processor S640 is configured to receive output from the ROC S630. The processor S640 may, in some instances, be configured to provide defect correction, linearity correction, data scaling, zooming/magnification, data compression, color discrimination, filtering, and/or other imaging processing, as desired.

In one embodiment, the processor S640 may include hardware, such as Application Specific Integrated Circuits (ASICs), Field Programmable Gate Arrays (FPGAs), digital signal processors (DSPs), or other integrated formats. However, those skilled in the art will recognize that the processor S640 may, in whole or in part, can be equivalently implemented in integrated circuits, as one or more computer programs having computer-executable instructions or code running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one skilled in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of computer-readable medium used to actually carry out the distribution.

In some implementations, the apparatus S600 may also be configured as a spectrophotometer to measure intensity of reflection or absorption at one more wavelengths.

Depending on the construction of the image sensor S620, light at different wavelengths may be detected nanopillars at different locations and with different sizes. A three- or four-nanopillar pixel may be fabricated. Of course, pixels having additional pillars are also possible.

Figure 35B:
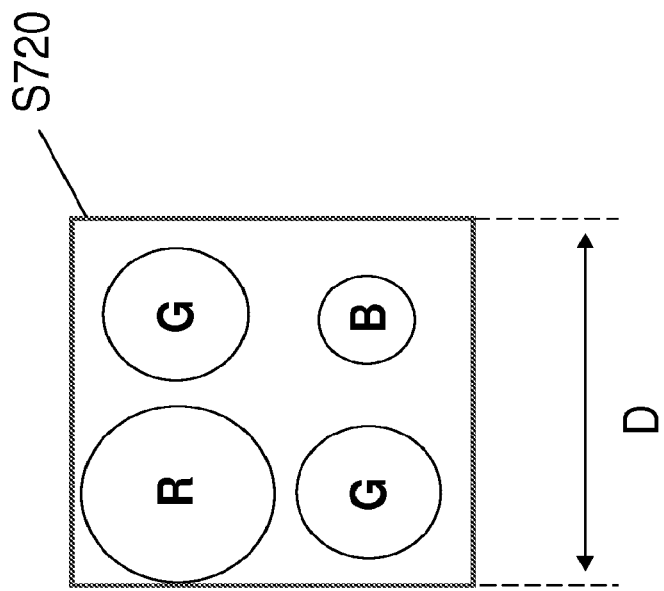
FIGS. 35A and 35B show schematics of a pixel of the image sensor, the pixel having more than one nanopillar sized to absorb and/or detect light of different wavelength or color, according to embodiments.
Figure 35A:
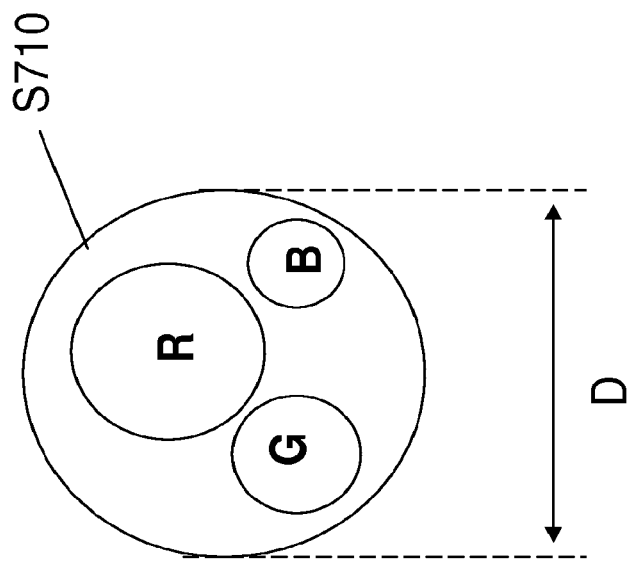

FIGS. 35A and 35B show an exemplary three-nanopillar pixel and an exemplary four-nanopillar pixel according to embodiments. These pixels may be incorporated into the image sensor.

FIG. 35A shows a pixel S710 including three nanopillars R, G, B, having different sizes configured to absorb and/or detect red, green, and blue light, respectively, according to an embodiment. For instance, the R, G, B nanopillars can have sizes effective to absorb and/or detect light of about 650 nm, 510 nm, and 475 nm in wavelength, respectively. The diameter of the pixel S710 may be 10 μm or less. The pixel S710 may be used in traditional shadow masked based display device.

FIG. 35B shows a pixel S720 including four nanopillars R, G, B, G, having different sizes configured to absorb and/or detect red, green, and blue light, respectively, according to an embodiment. Two of the nanopillars, G, absorb and/or detect green light. The diameter of the pixel S720 may be 10 μm or less.

A cladding may, in some instance, surround at least one pixel of the image sensor to increase light absorption. The cladding of pixel S710 and S720 may be formed, for instance, from hafnium oxide or silicon nitride.

The term excitons refer to electron hole pairs.

An active element is any type of circuit component with the ability to electrically control electron and/or hole flow (electricity controlling electricity or light, or vice versa). Components incapable of controlling current by means of another electrical signal are called passive elements. Resistors, capacitors, inductors, transformers, and even diodes are all considered passive elements. Active elements include in embodiments disclosed herein, but are not limited to, an active waveguide, transistors, silicon-controlled rectifiers (SCRs), light emitting diodes, and photodiodes. A waveguide is a system or material designed to confine and direct electromagnetic radiation of selective wavelengths in a direction determined by its physical boundaries. Preferably, the selective wavelength is a function of the diameter of the waveguide. An active waveguide is a waveguide that has the ability to electrically control electron and/or hole flow (electricity controlling electricity or light, or vice versa). This ability of the active waveguide, for example, is one reason why the active waveguide could be considered to be "active" and within the genus of an active element.

An optical pipe is an element to confine and transmit an electromagnetic radiation that impinges on the optical pipe. The optical pipe can include a core and a cladding. The core could be a nanostructure 1. The optical pipe could be configured to separate wavelengths of an electromagnetic radiation beam incident on the optical pipe at a selective wavelength through the core and the cladding, wherein the core is configured to be both a channel to transmit the wavelengths up to the selective wavelength and an active element to detect the wavelengths up to the selective wavelength transmitted through the core. A core and a cladding are generally complimentary components of the optical pipe and are configured to separate wavelengths of an electromagnetic radiation beam incident on the optical pipe at a selective wavelength through the core and cladding.

An embodiment relates to an image sensor comprising one or more nanostructure 1 on a substrate of a cavity, the nanostructure 1 being configured to transmit a first portion of an electromagnetic radiation beam incident on the sensor, and the substrate comprising an anti-reflective material that absorbs a second portion of the electromagnetic radiation beam incident on the sensor, wherein the first portion is substantially different from the second portion, wherein the anti-reflective material absorbs at least 68 percent of optical light incident on the anti-reflective material, and wherein the anti-reflective material does not disrupt an electronic surface properties of epitaxial silicon to cause surface current leakage or provide sites for recombination of carriers generated by photons when the anti-reflective material is contacted with epitaxial silicon.

Preferably, the second portion comprises at least a portion of electromagnetic radiation that comes out from the nanostructures 1. Preferably, the anti-reflective material is in an anti-reflective layer on a front side of the substrate that is exposed to the electromagnetic radiation beam incident on the sensor.

Preferably, the sensor comprises a plurality of nanostructures 1 in each of the cavity.

Preferably, the nanostructure 1 is configured to separate wavelengths of the electromagnetic radiation beam incident on the nanowire at a selective wavelength.

Preferably, the first portion comprises electromagnetic radiation of wavelengths of light of a certain color and the second portion comprises electromagnetic radiation of wavelengths of light of a complementary color.

Preferably, the sensor is configured to have an array optical response that substantially resembles a human eye optical response.

Preferably, the sensor comprises a plurality of nanowires and is configured to have a substantially minor change in an array optical response with a 10° change in a direction of the electromagnetic radiation beam incident on the sensor.

Preferably, the anti-reflective layer comprises a plurality of anti-reflective films configured to absorb electromagnetic radiation of a plurality of wavelengths.

Preferably, each of the nanostructures 1 is configured to separate wavelengths of the electromagnetic radiation beam incident on the nanostructure 1 through at a selective wavelength, the sensor further comprising a pair of photosensitive elements comprising a central photosensitive element and a peripheral photosensitive element, wherein the central photosensitive element is operably coupled to the nanostructure 1 and the peripheral photosensitive element is operably coupled to the substrate around the nanostructure 1.

Preferably, the nanostructure 1 is configured to be an active element to detect wavelengths of electromagnetic radiation transmitted through the nanowire.

Preferably, the active element is configured to be a photodiode, a charge storage capacitor, or combinations thereof.

Preferably, the anti-reflective material absorbs at least about 90 percent of optical light incident on the anti-reflective material. Preferably, the anti-reflective material reduces a surface leakage current.

Preferably, the plurality of nanostructures 1 are located so as to create a regular or semi-regular tessellation wherein a shape is repeated over a plane without any gaps or overlaps. A regular tessellation means a tessellation made up of congruent regular polygons. Regular means that the sides of the polygon are all the same length. Congruent means that the polygons are all the same size and shape. A regular polygon has 3 or 4 or 5 or more sides and angles, all equal. A semi-regular tessellation has two properties: (1) it is formed by regular polygons; and (2) the arrangement of polygons at every vertex point is identical.

Preferably, the tessellation is a regular tessellation such as a triangular tessellation, a square tessellation, a hexagonal tessellation or combinations thereof.

Another embodiment relates to a device comprising the sensor having a plurality of nanostructures 1 in each of the cavity, with each of the nanostructures 1 configured to separate wavelengths of the electromagnetic radiation beam incident on the nanostructure 1 through at a selective wavelength, the sensor further comprising a pair of photosensitive elements comprising a central photosensitive element and a peripheral photosensitive element, wherein the central photosensitive element is operably coupled to the nanostructure 1 and the peripheral photosensitive element is operably coupled to the substrate around the nanostructure 1. The device could be an image sensor.

Preferably, the nanostructure 1 comprises a waveguide.

The device could further comprise a passivation layer around the waveguide.

The device could further comprise a metal layer around the waveguide.

Preferably, the device comprises no color or IR filter.

Preferably, the nanostructure 1 has an index of refraction ($n_1$), and a cladding surrounding the nanostructure 1 has a cladding index of refraction ($n_2$), wherein $n_1 > n_2$, $n_1 = n_2$, or $n_1 < n_2$.

Preferably, the selective wavelength is a function of the diameter of the waveguide.

The device could further comprise at least a pair of metal contacts with at least one of the metal contacts being contacted to the waveguide.

Another embodiment relates to a device comprising the sensor having the nanostructure 1 configured to be an active element to detect wavelengths of electromagnetic radiation transmitted through the nanowire. The device could be an image sensor.

Preferably, the waveguide is configured to convert energy of the electromagnetic radiation transmitted through the waveguide and to generate excitons.

Preferably, the waveguide comprises a p-i-n junction that is configured to detect the excitons generated in the waveguide.

The device could further comprise an insulator layer around the waveguide and a metal layer around the insulator layer to form a capacitor that is configured to collect the excitons generated in the waveguide and store charge in the capacitor.

The device could further comprise metal contacts that connect to the metal layer and waveguide to control and detect the charge stored in the capacitor.

The device could further comprise a cladding around the nanostructure 1, and the substrate comprises a peripheral photosensitive element, wherein the peripheral photosensitive element is operably coupled to the cladding.

Preferably, the substrate comprises an electronic circuit.

The device could further comprise a lens structure or an optical coupler over the nanostructure 1, wherein the lens structure or the optical coupler is operably coupled to the nanostructure 1.

The device could further comprise a stack surrounding the nanostructure 1, the stack comprising metallic layers embedded in dielectric layers.

Preferably, a surface of the stack comprises a reflective surface.

Preferably, the anti-reflective material is not located on the nanostructure 1 or on a back-side of the substrate opposite to a front side of the substrate that is exposed to the electromagnetic radiation beam incident on the sensor.

Preferably, a wall surface of the cavity has a reflective surface.

Preferably, a wall surface of the nanostructure 1 has a reflective surface.

Another embodiment relates to an image sensor comprising a plurality of nanostructures 1 on a substrate of a cavity, the nanostructure 1 being configured to transmit a first portion of an electromagnetic radiation beam incident on the sensor, the substrate absorbs a second portion of the electromagnetic radiation beam incident on the sensor, wherein the first portion is substantially different from the second portion.

Yet another embodiment relates to an image sensor comprising a nanostructure 1 on a substrate of a cavity, the nanowire being configured to transmit a first portion of an electromagnetic radiation beam incident on the sensor, the substrate absorbs a second portion of the electromagnetic radiation beam incident on the sensor, wherein the first portion is substantially different from the second portion, and the ratio of a diameter of the cavity to a diameter of the nanostructure 1 is at less than about 10.

In yet other embodiments, a plurality of nanostructures 1 are arranged on a regular tessellation.

Figure 36:
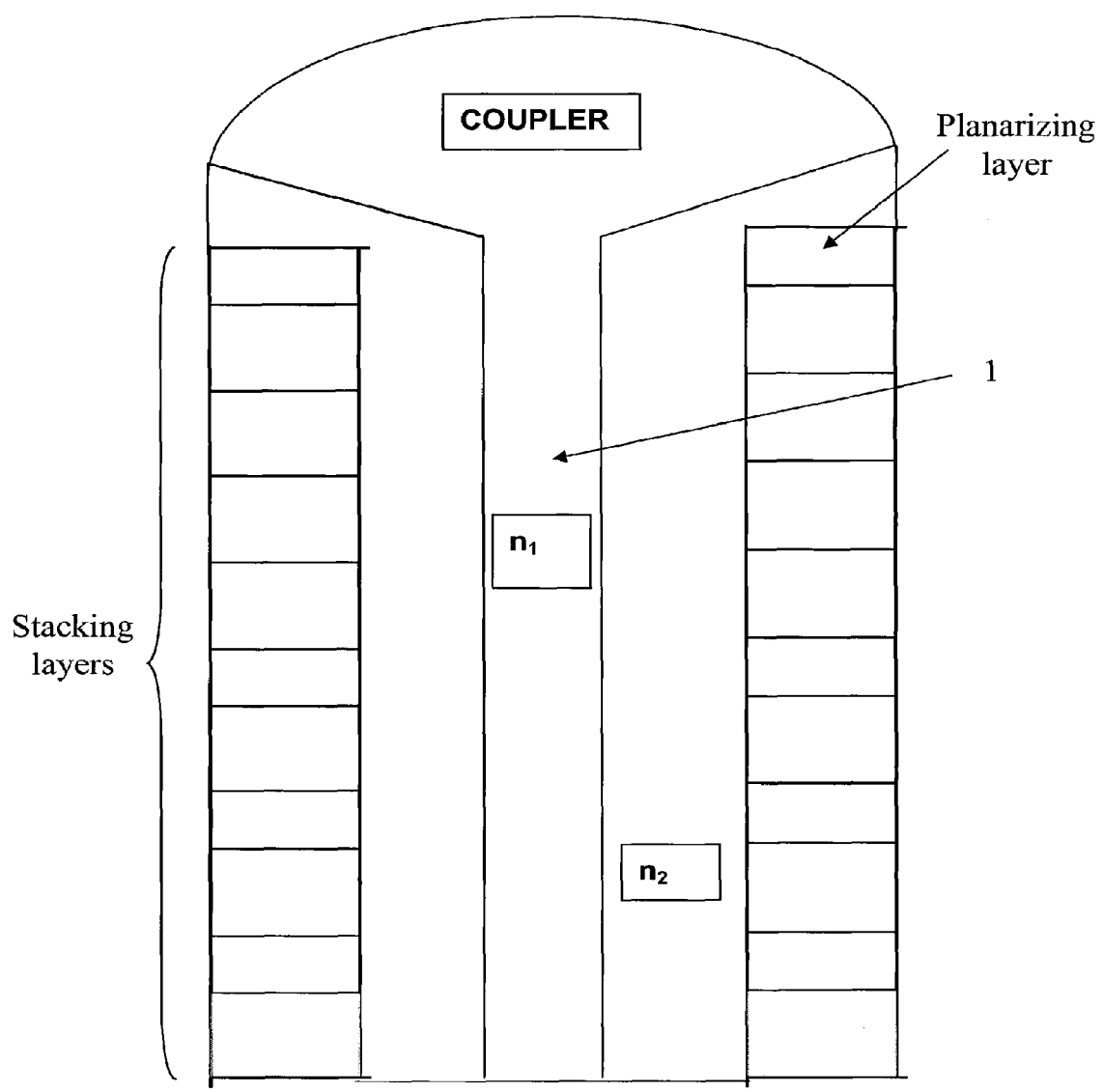
FIG. 36 shows a cross sectional view of an embodiment of an image sensor having a microlens.

In yet other embodiments, as shown in FIG. 36, a coupler that may take the shape of a micro lens efficiently could be located on the nanostructure 1 to collect and guide the electromagnetic radiation into the nanostructure 1. As shown in FIG. 36, the nanostructure 1 has a refractive index $n_1$ surrounded by a cladding of refractive index $n_2$.

In the configuration of FIG. 36, it is possible to eliminate pigmented color filters that absorb about ⅔ of the light that impinges on the image sensor. The nanostructure 1 functions as an active waveguide and the cladding of the optical pipe could function as a passive waveguide with a peripheral photosensitive element surrounding the core to detect the electromagnetic radiation transmitted through the passive waveguide of the cladding. Passive waveguides do not absorb light like color filters, but can be designed to selectively transmit selected wavelengths.

A waveguide, whether passive or active, has a cutoff wavelength that is the lowest frequency that the waveguide can propagate. The diameter of the nanostructure 1 serves as the control parameter for the cutoff wavelength of the nanostructure 1.

The nanostructure 1 could also serve as a photodiode by absorbing the confined light, generating electron hole pairs (excitons) and detecting the excitons.

The stacking layers in FIG. 36 comprise dielectric material-containing and metal-containing layers. The dielectric materials include as but not limited to oxides, nitrides and oxynitrides of silicon having a dielectric constant from about 4 to about 20, measured in vacuum. Also included, and also not limiting, are generally higher dielectric constant gate dielectric materials having a dielectric constant from about 20 to at least about 100. These higher dielectric constant dielectric materials may include, but are not limited to hafnium oxides, hafnium silicates, titanium oxides, barium-strontium titanates (BSTs) and lead-zirconate titanates (PZTs).

The dielectric material-containing layers may be formed using methods appropriate to their materials of composition. Non-limiting examples of methods include thermal or plasma oxidation or nitridation methods, chemical vapor deposition methods (including atomic layer chemical vapor deposition methods) and physical vapor deposition methods.

The metal-containing layers could function as electrodes. Non-limiting examples include certain metals, metal alloys, metal silicides and metal nitrides, as well as doped polysilicon materials (i.e., having a dopant concentration from about $1 \times 10^{18}$ to about $1 \times 10^{22}$ dopant atoms per cubic centimeter) and polycide (i.e., doped polysilicon/metal silicide stack) materials. The metal-containing layers may be deposited using any of several methods. Non-limiting examples include chemical vapor deposition methods (also including atomic layer chemical vapor deposition methods) and physical vapor deposition methods. The metal-containing layers could comprise a doped polysilicon material (having a thickness typically in the range 1000 to 1500 Angstrom).

The dielectric and metallization stack layer comprises a series of dielectric passivation layers. Also embedded within the stack layer are interconnected metallization layers. Components for the pair of interconnected metallization layers include, but are not limited to contact studs, interconnection layers, interconnection studs.

The individual metallization interconnection studs and metallization interconnection layers that could be used within the interconnected metallization layers may comprise any of several metallization materials that are conventional in the semiconductor fabrication art. Non-limiting examples include certain metals, metal alloys, metal nitrides and metal silicides. Most common are aluminum metallization materials and copper metallization materials, either of which often includes a barrier metallization material, as discussed in greater detail below. Types of metallization materials may differ as a function of size and location within a semiconductor structure. Smaller and lower-lying metallization features typically comprise copper containing conductor materials. Larger and upper-lying metallization features typically comprise aluminum containing conductor materials.

The series of dielectric passivation layers may also comprise any of several dielectric materials that are conventional in the semiconductor fabrication art. Included are generally higher dielectric constant dielectric materials having a dielectric constant from 4 to about 20. Non-limiting examples that are included within this group are oxides, nitrides and oxynitrides of silicon. For example, the series of dielectric layers may also comprise generally lower dielectric constant dielectric materials having a dielectric constant from about 2 to about 4. Included but not limiting within this group are hydrogels such as silicon hydrogel, aerogels like silicon Al, or carbon aerogel, silsesquioxane spin-on-glass dielectric materials, fluorinated glass materials, organic polymer materials, and other low dielectric constant materials such as doped silicon dioxide (e.g., doped with carbon, fluorine), and porous silicon dioxide.

Typically, the dielectric and metallization stack layer comprises interconnected metallization layers and discrete metallization layers comprising at least one of copper metallization materials and aluminum metallization materials. The dielectric and metallization stack layer also comprises dielectric passivation layers that also comprise at least one of the generally lower dielectric constant dielectric materials disclosed above. The dielectric and metallization stack layer could have an overall thickness from about 1 to about 4 microns. It may comprise from about 2 to about 4 discrete horizontal dielectric and metallization component layers within a stack.

The layers of the stack layer could be patterned to form patterned dielectric and metallization stack layer using methods and materials that are conventional in the semiconductor fabrication art, and appropriate to the materials from which are formed the series of dielectric passivation layers. The dielectric and metallization stack layer may not be patterned at a location that includes a metallization feature located completely therein. The dielectric and metallization stack layer may be patterned using wet chemical etch methods, dry plasma etch methods or aggregate methods thereof. Dry plasma etch methods as well as e-beam etching if the dimension needs to be very small, are generally preferred insofar as they provide enhanced sidewall profile control when forming the series of patterned dielectric and metallization stack layer.

The planarizing layer may comprise any of several optically transparent planarizing materials. Non-limiting examples include spin-on-glass planarizing materials and organic polymer planarizing materials. The planarizing layer could extend above the optical pipe such that the planarizing layer would have a thickness sufficient to at least planarize the opening of the optical pipe, thus providing a planar surface for fabrication of additional structures within the CMOS image sensor. The planarizing layer could be patterned to form the patterned planarizing layer.

Optionally, there could be a series of color filter layers located upon the patterned planarizing layer. The series of color filter layers, if present, would typically include either the primary colors of red, green and blue, or the complementary colors of yellow, cyan and magenta. The series of color filter layers would typically comprise a series of dyed or pigmented patterned photoresist layers that are intrinsically imaged to form the series of color filter layers. Alternatively, the series of color filter layers may comprise dyed or pigmented organic polymer materials that are otherwise optically transparent, but extrinsically imaged while using an appropriate mask layer. Alternative color filter materials may also be used. The filter could also be filter for a black and white, or IR sensors wherein the filter cuts off visible and pass IR predominantly.

The spacer layer could be one or more layers made of any material that physically, but not optically, separates the stacking layers from the micro lens. The spacer layer could be formed of a dielectric spacer material or a laminate of dielectric spacer materials, although spacer layers formed of conductor materials are also known. Oxides, nitrides and oxynitrides of silicon are commonly used as dielectric spacer materials. Oxides, nitrides and oxynitrides of other elements are not excluded. The dielectric spacer materials may be deposited using methods analogous, equivalent or identical to the methods described above. The spacer layer could be formed using a blanket layer deposition and etchback method that provides the spacer layer with the characteristic inward pointed shape.

The micro lens may comprise any of several optically transparent lens materials that are known in the art. Non-limiting examples include optically transparent inorganic materials, optically transparent organic materials and optically transparent composite materials. Most common are optically transparent organic materials. Typically the lens layers could be formed incident to patterning and reflow of an organic polymer material that has a glass transition temperature lower than the series of color filter layers 12, if present, or the patterned planarizing layer 11.

As shown in FIG. 36, the high index material in the core could, for example, be silicon nitride having a refractive index of about 2.0. The lower index cladding layer material could be, for example, glass, plasma enhanced silicon nitride, plasma enhanced silicon oxide.

Optionally, a micro lens could be located on the nanostructure 1 near the incident electromagnetic radiation beam receiving end of the image sensor. The function of the micro lens or in more general terms is to be a coupler, i.e., to couple the incident electromagnetic radiation beam into the nanostructure 1. If one were to choose a micro lens as the coupler in this embodiment, its distance from the nanostructure 1 would be much shorter than to the photosensitive element, so the constraints on its curvature are much less stringent, thereby making it implementable with existing fabrication technology.

The shape of the nanostructure 1 could be different for different embodiments. In one configuration, the nanostructure 1 could cylindrical, that is, the diameter of the nanostructure 1 remains the substantially the same throughout the length of the nanostructure 1. In another configuration, the nanostructure 1 could conical, where the upper diameter of the cross sectional area of the nanostructure 1 could be greater or smaller than the lower diameter of the cross sectional area of the nanostructure 1. The terms "upper" and "lower" refer to the ends of the nanostructure 1 located closer to the incident electromagnetic radiation beam receiving and exiting ends of the image sensor. Other shapes include a stack of conical sections.

By nesting nanostructures 1 that function as waveguides and using a micro lens coupler as shown in FIG. 36, an array of image sensors could be configured to obtain complementary colors having wavelengths of electromagnetic radiation separated at a cutoff wavelength in the core and cladding of each nanostructure 1 of every image sensor. The complementary colors are generally two colors when mixed in the proper proportion produce a neutral color (grey, white, or black). This configuration also enables the capture and guiding of most of the electromagnetic radiation incident beam impinging on the micro lens to the photosensitive elements (i.e., photodiodes) located at the lower end of the nanostructure 1. Two adjacent or substantially adjacent image sensors with different color complementary separation can provide complete information to reconstruct a full color scene according to embodiments described herein. This technology of embodiments disclosed herein can further supplant pigment based color reconstruction for image sensing which suffers from the inefficiency of discarding (through absorption) the non selected color for each pixel.

Each physical pixel of a device containing an image sensor of the embodiments disclosed herein would have two outputs representing the complementary colors, e.g., cyan (or red) designated as output type 1 and yellow (or blue) designated as output type 2. These outputs would be arranged as follows:

$$1212121212121212 \ldots$$
$$2121212121212121 \ldots$$
$$1212121212121212 \ldots$$
$$\ldots$$
$$\ldots$$

Each physical pixel would have complete luminance information obtained by combining its two complementary outputs. As a result, the same image sensor can be used either as a full resolution black and white or full color sensor.

In the embodiments of the image sensors disclosed herein, the full spectrum of wavelengths of the incident electromagnetic radiation beam (e.g., the full color information of the incident light) could be obtained by the appropriate combination of two adjacent pixels either horizontally or vertically as opposed to 4 pixels for the conventional Bayer pattern.

Depending on minimum transistor sizes, each pixel containing an image sensor of the embodiments disclosed herein could be as small as 1 micron or less in pitch and yet have sufficient sensitivity. This could open the way for contact imaging of very small structures such as biological systems.

An embodiment of a compound pixel comprises a system of two pixels, each having a core of a different diameter such that cores have diameters $d_1$ and $d_2$ for directing light of different wavelengths ($\lambda_B$ and $\lambda_R$). The two cores also serve as photodiodes to capture light of wavelengths $\lambda_B$ and $\lambda_R$. The claddings of the two image sensors serve for transmitting the light of wave length $\lambda_{w-B}$ and $\lambda_{w-R}$. The light of wave length $\lambda_{w-B}$ and $\lambda_{w-R}$ transmitted through the cladding is detected by the peripheral photosensitive elements surrounding the cores. Note that (w) refers to the wavelength of white light. Signals from the 4 photodiodes (two located in the cores and two located in or on the substrate surrounding the core) in the compound pixel are used to construct color.

A nanostructured photodiode (PD) according to an embodiments comprise a substrate and an upstanding nanostructure 1 protruding from the substrate. A p-n junction giving an active region to detect light may be present within the structure. The nanostructure 1, a part of the nanostructure 1, or a structure in connection with the nanostructure 1, forms a waveguide directing and detecting at least a portion of the light that impinges on the device. In addition the waveguide doubles up as spectral filter that enables the determination of the color range of the impinging light.

A nanostructured PD according to the embodiments comprises of an upstanding nanostructure 1. For the purpose of this application an upstanding nanostructure 1 should be interpreted as a nanostructure 1 protruding from the substrate in some angle, the upstanding nanostructure 1 for example being grown from the substrate, preferably by as vapor-liquid-solid (VLS) grown nanostructures 1.

According to the embodiments, a part of the nanostructure 1 or structure formed from the nanostructure 1 is used as a waveguide directing and confining at least a portion of the light impinging on the nanostructured PD in a direction given by the upstanding nanostructure 1. The waveguiding nanostructured PD structure could include a high refractive index core with one or more surrounding cladding with refractive indices less than that of the core. The structure is either circular symmetrical or close to being circular symmetrical. Light waveguiding in circular symmetrical structures are well-known for fiber-optic applications and many parallels can be made to the area of rare-earth-doped fiber optic devices. However, one difference is that fiber amplifier are optically pumped to enhance the light guided through them while the described nanostructured PD can be seen as an efficient light to electricity converter. One well-known figure of merit is the so called Numerical Aperture, NA. The NA determines the angle of light captured by the waveguide. The NA and angle of captured light is an important parameter in the optimization of a new PD structure.

For a PD operating in IR and above IR, using GaAs is good, but for a PD operating in the visible light region, silicon would be preferable. For example to create circuits, Si and doped Si materials are preferable. Similarly, for a PD working in the visible range of light, one would prefer to use Si.

In one embodiment, the typical values of the refractive indexes for III-V semiconductor core material are in the range from 2.5 to 5.5 when combined with glass type of cladding material (such as $SiO_2$ or $Si_3N_4$) having refractive indexes ranging from 1.4 to 2.3. A larger angle of capture means light impinging at larger angles can be coupled into the waveguide for better capture efficiency.

One consideration in the optimization of light capture is to provide a coupler into the nanostructure 1 structure to optimize light capture into the structure. In general, it would be preferred to have the NA be highest where the light collection takes place. This would maximize the light captured and guided into the PD.

A nanostructured PD according to the embodiments could comprise a substrate and a nanostructure 1 epitaxially grown from the substrate in an defined angle θ. A portion of or all of the nanostructure 1 could be arranged to act as a waveguiding portion directing at least a portion of the impinging light in a direction given by the elongated direction of the nanostructure 1, and will be referred to as a waveguide. In one possible implementation, two contact could be provided on the nanostructure 1 for example one on top or in a wrapping configuration on the circumferential outer surface and the other contact could be provided in the substrate. The substrate and part of the upstanding structure may be covered by a cover layer, for example as a thin film as illustrated or as material filling the space surrounding the nanostructured PD.

The nanostructure 1 could have a diameter in the order of 50 nm to 500 nm, The length of the nanostructure 1 could be of the order of 1 to 10 μm. The p-n junction results in an active region arranged in the nanostructure 1. Impinging photons in the nanostructure 1 are converted to electron hole pairs and in one implementation are subsequently separated by the electric fields generated by the p-n junction along the length of the nanostructure 1. The materials of the different members of the nanostructured PD are chosen so that the nanostructure 1 will have good waveguiding properties vis-à-vis the surrounding materials, i.e. the refractive index of the material in the nanostructure 1 should preferably be larger than the refractive indices of the surrounding materials.

In addition, the nanostructure 1 may be provided with one or more layers. A first layer, may be introduced to improve the surface properties (i.e., reduce charge leakage) of the nanostructure 1. Further layers, for example an optical layer may be introduced specifically to improve the waveguiding properties of the nanostructure 1, in manners similar to what is well established in the area of fiber optics. The optical layer typically has a refractive index in between the refractive index of the nanostructure 1 and the surrounding cladding region material. Alternatively the intermediate layer has a graded refractive index, which has been shown to improve light transmission in certain cases. If an optical layer is utilized the refractive index of the nanostructure 1, $n_w$, should define an effective refractive index for both the nanostructure 1 and the layers.

The ability to grow nanostructures 1 with well defined diameters, as described above and exemplified below, could be to optimize the waveguiding properties of the nanostructure 1 or at least the waveguide with regards to the wavelength of the light confined and converted by the nanostructured PD. The diameter of the nanostructure 1 is chosen so as to have a favorable correspondence to the wavelength of the desired light. Preferably the dimensions of the nanostructure 1 are such that a uniform optical cavity, optimized for the specific wavelength of the produced light, is provided along the nanostructure 1. The core nanostructure 1 must be sufficiently wide to capture the desired light. A rule of thumb would be that diameter must be larger than $\lambda/2n_w$, wherein $\lambda$ is the wavelength of the desired light and $n_w$ is the refractive index of the nanostructure 1. As an example a diameter of about 60 nm may be appropriate to confine blue light only and one 80 nm may be appropriate for to confine both blue and green light only in a silicon nanostructure 1.

In the infra-red and near infra-red a diameter above 100 nm would be sufficient. An approximate preferred upper limit for the diameter of the nanostructure 1 is given by the growth constrains, and is in the order of 500 nm. The length of the nanostructure 1 is typically and preferably in the order of 1-10 μm, providing enough volume for the light conversion region A reflective layer is in one embodiment, provided on the substrate and extending under the wire. The purpose of the reflective layer is to reflect light that is guided by the wire but has not been absorbed and converted to carriers in the nanostructured PD. The reflective layer is preferably provided in the form of a multilayered structure comprising repeated layers of silicates for example, or as a metal film. If the diameter of the nanostructure 1 is sufficiently smaller than the wavelength of the light a large fraction of the directed light mode will extend outside the waveguide, enabling efficient reflection by a reflective layer surrounding the narrow the nanostructure 1 waveguide An alternative approach to getting a reflection in the lower end of the waveguide core is to arrange a reflective layer in the substrate underneath the nanostructure 1. Yet another alternative is to introduce reflective means within the waveguide. Such reflective means can be a multilayered structure provided during the growth process of the nanostructure 1, the multilayered structure comprising repeated layers of for example $SiN_x/SiO_x$ (dielectric).

To form the p-n junction useful for light detection at least part of the nanostructure is preferably doped. This can be done by either changing dopants during the growth of the nanostructure 1 or using a radial shallow implant method on the nanostructure 1 once it is grown.

Considering systems where nanostructure 1 growth is locally enhanced by a substance, as vapor-liquid-solid (VLS) grown nanostructures 1, the ability to alter between radial and axial growth by altering growth conditions enables the procedure (nanostructure 1 growth, mask formation, and subsequent selective growth) can be repeated to form nanostructure 1/3D-sequences of higher order. For systems where nanostructure 1 growth and selective growth are not distinguished by separate growth conditions it may be better to first grow the nanostructure 1 along the length and by different selective growth steps grow different types of 3D regions.

Depending on the intended use of the nanostructured PD, availability of suitable production processes, costs for materials etc., a wide range of materials can be used for the different parts of the structure. The III-V semiconductors are of particular interest due to their properties facilitating high speed and low power electronics. Suitable materials for the substrate include, but is not limited to: Si, GaAs, GaP, GaP: Zn, GaAs, InAs, InP, GaN, $Al_2O_3$, SiC, Ge, GaSb, ZnO, InSb, SOI (silicon-on-insulator), CdS, ZnSe, CdTe. Suitable materials for the nanostructure 1 110 include, but is not limited to: Si, GaAs (p), InAs, Ge, ZnO, InN, GaInN, GaN AlGaInN, BN, InP, InAsP, GaInP, InGaP:Si, InGaP:Zn, GaInAs, AlInP, GaAlInP, GaAlInAsP, GaInSb, InSb. Possible donor dopants for e.g. GaP, Te, Se, S, etc, and acceptor dopants for the same material are Zn, Fe, Mg, Be, Cd, etc.

The appropriateness of low resistivity contact materials are dependent on the material to be deposited on, but metal, metal alloys as well as non-metal compounds like Al, Al—Si, $TiSi_2$, TiN, W, $MoSi_2$, PtSi, $CoSi_2$, $WSi_2$, In, AuGa, AuSb, AuGe, PdGe, Ti/Pt/Au, Ti/Al/Ti/Au, Pd/Au, ITO (InSnO), etc. and combinations of e.g. metal and ITO can be used.

The substrate is an integral part of the device, since it also contains the photodiodes necessary to detect light that has not been confined to the nanostructure 1. The substrate in addition also contains standard CMOS circuits to control the biasing, amplification and readout of the PD as well as any other CMOS circuit deemed necessary and useful. The substrate include substrates having active devices therein. Suitable materials for the substrates include silicon and silicon-containing materials. Generally, each sensor element of the embodiments include a nanostructured PD structure comprise a nanostructure 1, a cladding enclosing at least a portion of the nanostructure 1, a coupler and two contacts.

The fabrication of the nanostructured PDs on silicon is possible to the degree that the nanostructures 1 are uniformly aligned the (111) direction normal to the substrates and essentially no nanostructures 1 are grown in the three declined (111) directions that also extends out from the substrate. The well aligned growth of III-V nanostructures 1 in predefined array structures on silicon substrates, is preferred for successful large scale fabrication of optical devices, as well as most other applications.

PD devices build on silicon nanostructures 1 are of high commercial interest due to their ability to detect light of selected wavelengths not possible with other material combinations. In addition they allow the design of a compound photodiode that allows the detection of most of the light that impinges on a image sensor.

Figure 37:
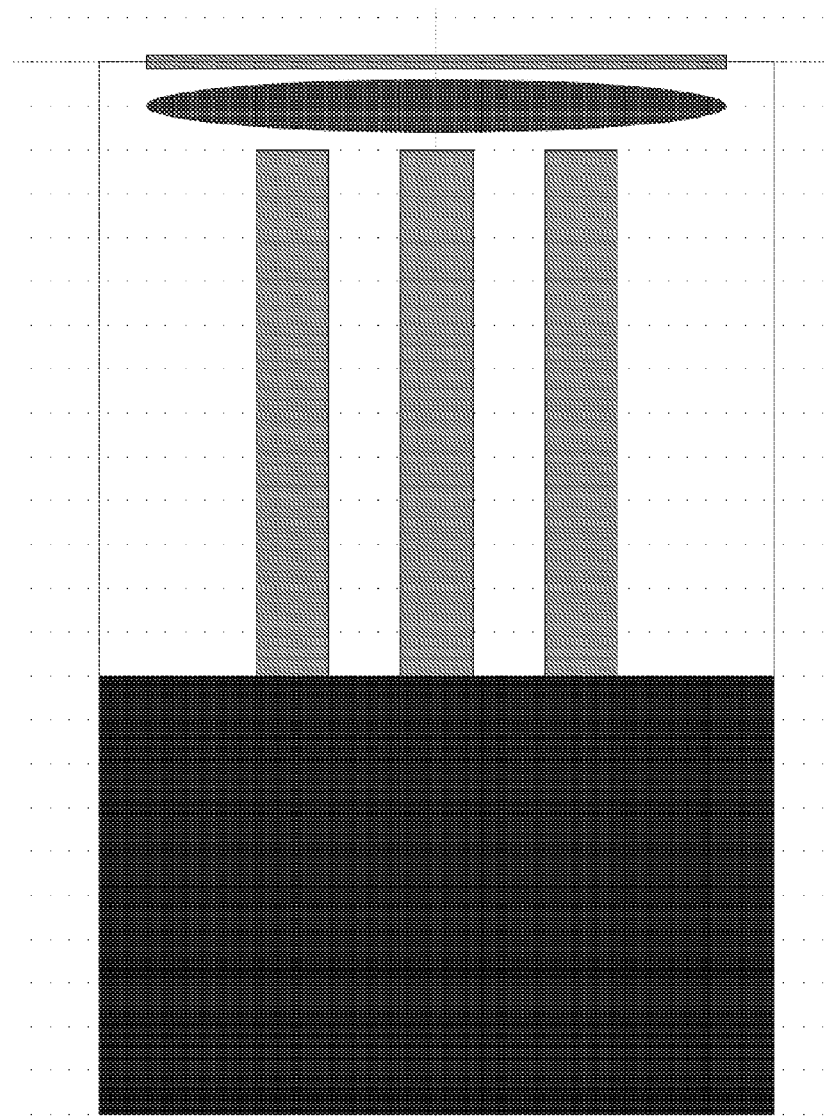
FIG. 37 shows an embodiment of an array of nanowires within a single cavity of the image sensor of an embodiment.

In other embodiments, there could be multiple nanostructures 1 in a single deep cavity as shown in FIG. 37 wherein at the bottom is a silicon substrate on which there is an array of nanostructures 1 over which is a coupler (shown as an oval), and over the coupler is a region (shown as rectangular box) through which light comes in to the coupler.

The recognition of color and luminance by the embodiments of the image sensors could be done by color reconstruction. Each compound pixel has complete luminance information obtained by combining its two complementary outputs. As a result, the same image sensor can be used either as a full resolution black and white or full color sensor.

The color reconstruction could be done to obtain full color information by the appropriate combination of two adjacent pixels, which could be one embodiment of a compound pixel, either horizontally or vertically. The support over which color information is obtained is less than the dimension of two pixels as opposed to 4 for the Bayer pattern.

Figure 38:
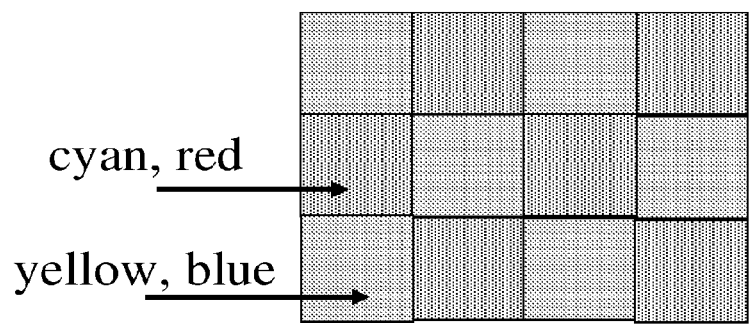
FIG. 38 shows a schematic of a top view of a device containing image sensors of the embodiments disclosed herein, each image sensor having two outputs representing the complementary colors.

Each physical pixel of a device containing an image sensor of the embodiments disclosed herein would have two outputs representing the complementary colors, e.g., cyan, red (C, R) designated as output type 1 or yellow, blue (Y, B) designated as output type 2 as shown in FIG. 38. These four outputs of two pixels of a compound pixel can be resolved to reconstruct a full color scene of an image viewed by a device containing the image sensors of the embodiments described herein.

Example

Angle Dependence an Image Sensor Having a Single and Multiple Nanostructures 1

A nanostructure 1 capacitor-photodiode has the properties of converting incoming light into charge stored in the capacitor. The efficiency with which light is coupled into the nanostructure 1, however, is dependent on the angle of the incident light. Simulations indicate that the efficiency decreases with increasing departure of the angle from normal incidence. Light that fails to couple to the nanostructure 1 could eventually end up either in the substrate or be reflected out of the cavity altogether. With increasing departure from normal incidence, the response of the nanostructure 1 decreases but that of the substrate increases. This could lead to errors to in scene color recognition and illumination, particularly for a non telecentric lens.

Figure 39:
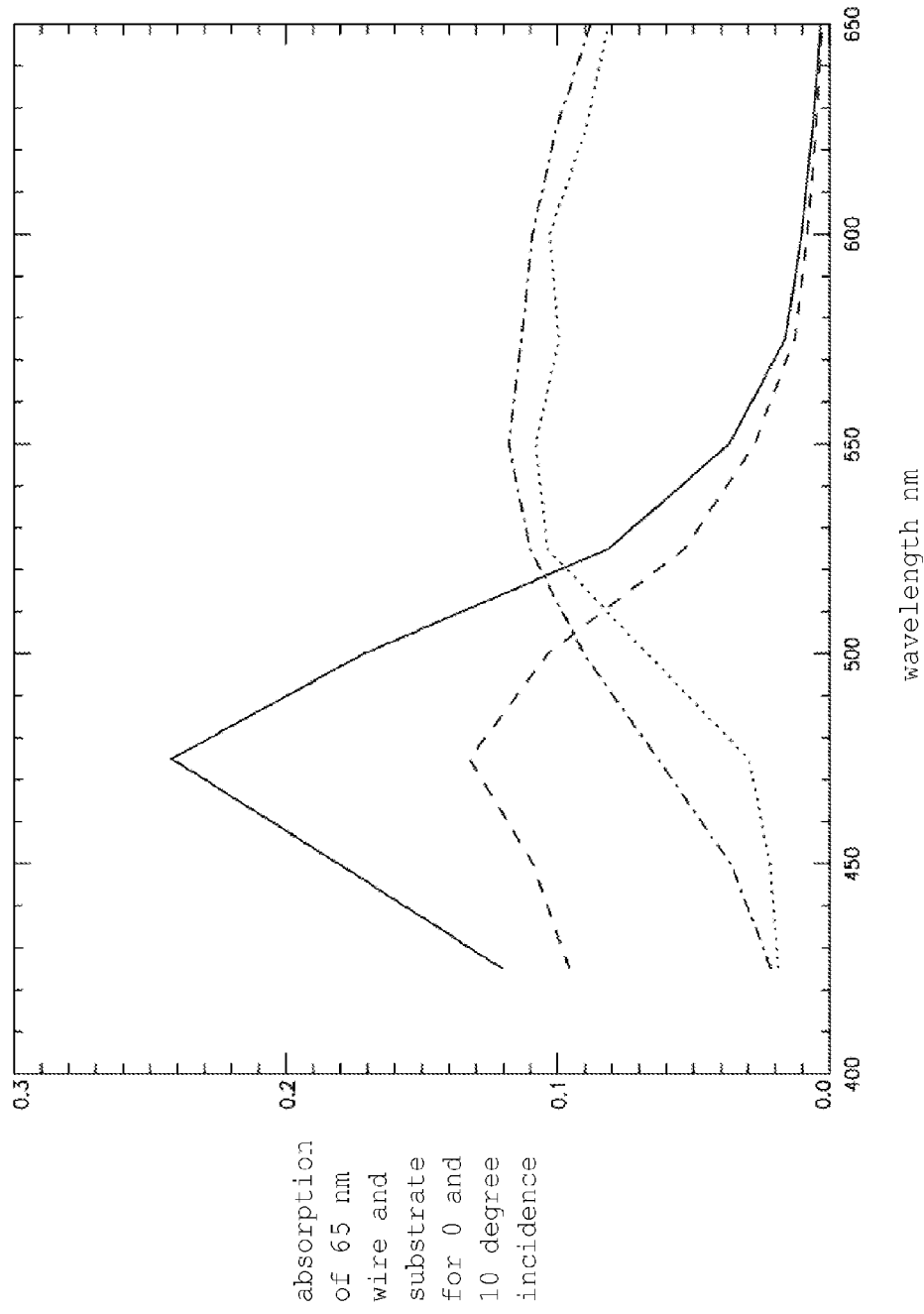
FIG. 39 shows a response of the single wire of diameter 65 nm in a 1200 nm cavity as a function of wavelength with illumination incident at 0 and 10 degrees from the vertical.
Figure 40:
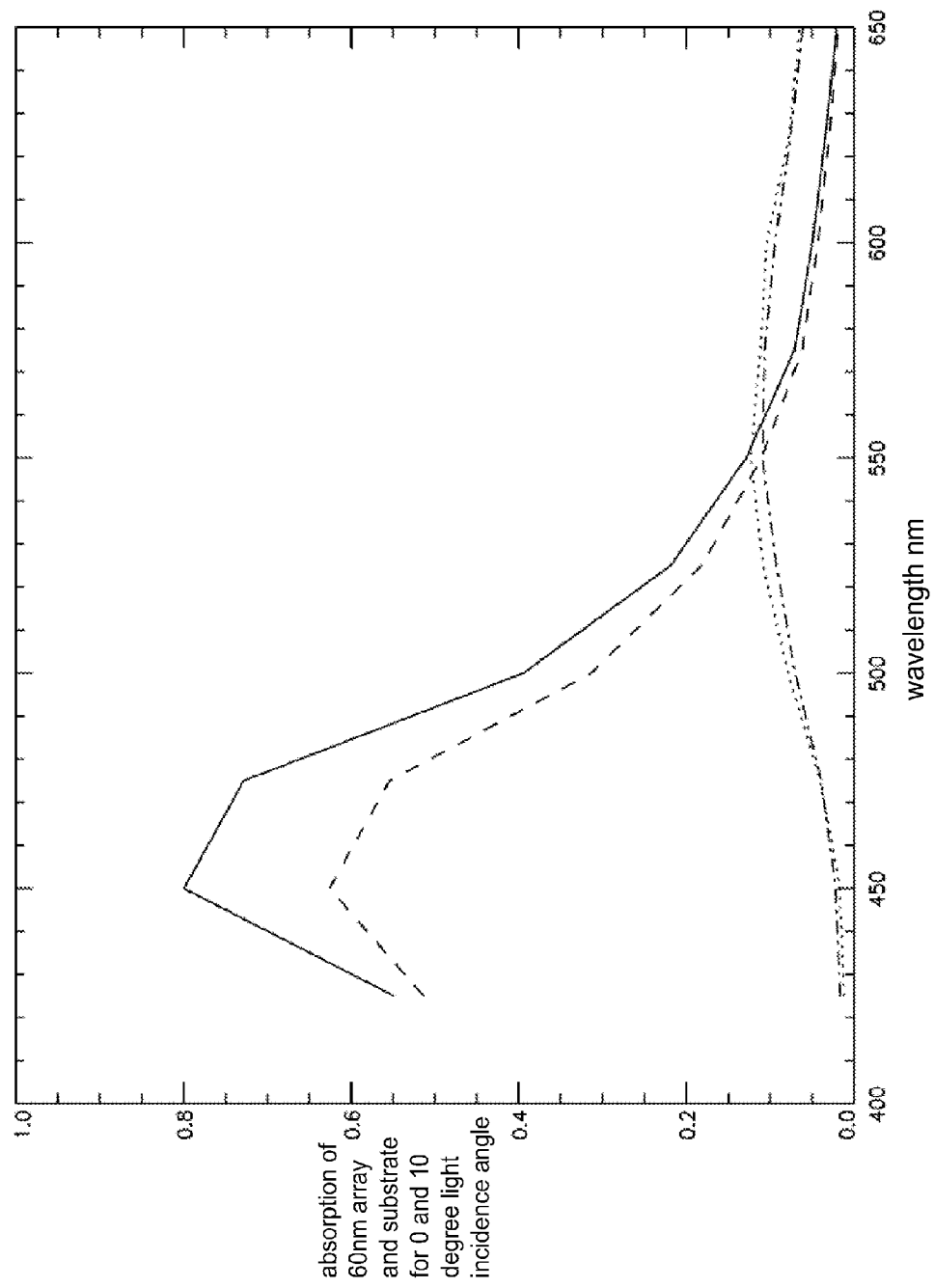
FIG. 40 shows a response of an array of 5 wires of diameter 60 nm in a 1200 nm cavity as a function of wavelength with illumination incident at 0 and 10 degrees from the vertical.

A nanostructure 1 array capacitor-photodiode could display a significantly reduced angular dependence in its response. In addition to optical response, the optimal number of nanostructures 1 in a single cavity could depend on the process and fabrication of the nanostructure 1 capacitor-photodiode. Simulations indicate five nanostructures 1 in a single cavity could dramatically reduce angular dependence as shown in FIGS. 39 and 40. The units of the y axis are arbitrary as the simulation results shown in FIGS. 39 and 40 is the show the relative change in the response as a function of wavelength with different angle of light incidence. The diameter of the cavity containing the single or array of nanostructures 1 whose simulation results are shown in FIGS. 39 and 40 was 1200 nm. Also, in arriving at the simulations whose results are shown in FIGS. 39 and 40, it was assumed that all light not absorbed by the nanostructure 1 would to be absorbed in the substrate.

FIG. 39 shows a plot entitled "wire_65 nm_angle_plot" simulating absorption in a 65 nm nanostructure 1 located concentrically in a cavity of 1200 nm and by the substrate. The solid line is the response of the single wire of diameter 65 nm as a function of wavelength with illumination incident in a perpendicular direction and the dashed line is the same response but for a wire illuminated at 10 degrees from vertical. The dotted line is the response of the substrate for vertical illumination and the dash dot line is the same for illumination at 10 degrees. The term response refers to the ability to absorb incident light.

FIG. 39 shows the following features of a single nanostructure 1 capacitor-photodiode in a cavity: (1) the response of the single nanostructure 1 has a maximum around 480 nm wavelength of light; (2) the response of the single nanostructure 1 changes substantially with a change in the angle of light incidence from perpendicular to the nanostructure 1 to 10 degrees from the perpendicular axis; (3) the response of the substrate has a maximum around 550 nm wavelength of light; and (4) the response of the substrate is greater for the angle of light incidence of 10 degrees from the perpendicular axis than for the angle of light incidence perpendicular to the nanostructure 1.

FIG. 40 shows a plot entitled "array_60 nm_angle_plot." The solid line is the response of an array of 5 nanostructures 1 each of diameter 60 nm as a function of wavelength with illumination incident in a perpendicular direction and the dashed line is the same response but for an array illuminated at 10 degrees from vertical. The dotted line is the response of the substrate for vertical illumination and the dash dot line is the same for illumination at 10 degrees. The term response refers to the ability to absorb incident light.

The 5 nanostructures 1 were arranged in a diamond with 4 nanostructures 1 located at the four corners of the diamond and one nanostructure 1 located at the center of the diamond, which was also the center of the cavity of diameter 1200 nm. The distance between the central nanostructure 1 and each of the four corner nanostructures 1 was 300 nm.

FIG. 40 shows the following features of a single nanostructure 1 photodiode in a cavity: (1) the response of the single nanostructure 1 has a maximum around 480 nm wavelength of light; (2) the response of the single nanostructure 1 does not change substantially with a change in the angle of light incidence from perpendicular to the nanostructure 1 to 10 degrees from the perpendicular axis; (3) the response of the substrate has a maximum around 550 nm wavelength of light, but the magnitude of the response of the substrate is substantially smaller than that of the response of the substrate of a single nanostructure 1 capacitor-photodiode in a cavity; and (4) the response of the substrate is almost the same for the angle of light incidence of 10 degrees from the perpendicular axis as that for the angle of light incidence perpendicular to the nanostructure 1.

Example

An Array of Nanostructures 1 with Anti-Reflective Material on the Substrate

Whenever a ray of light moves from one medium to another (for example, when light enters a sheet of glass after travelling through air), some portion of the light is reflected from the surface (known as the interface) between the two media. The strength of the reflection depends on the refractive indices of the two media as well as the angle of the surface to the beam of light. The exact value can be calculated using the Fresnel equations.

When the light meets the interface at normal incidence (perpendicularly to the surface), the intensity of light reflected is given by the reflection coefficient or reflectance, R:

$$R = \left(\frac{n_0 - n_s}{n_0 + n_s}\right)^2$$

where $n_0$ and $n_s$ are the refractive indices of the first and second media, respectively. The value of R varies from 0.0 (no reflection) to 1.0 (all light reflected) and is usually quoted as a percentage. Complementary to R is the transmission coefficient or transmittance, T. If absorption and scattering are neglected, then the value T is always 1−R. Thus if a beam of light with intensity I is incident on the surface, a beam of intensity RI is reflected, and a beam with intensity TI is transmitted into the medium.

Applying these principles to the embodiments of the invention, in an example, if the index of refraction of Si for red light is 4 and that of the cavity filled with $SiO_2$ is about 1.5, R would then be equal to about 0.2. This means that 20% of the incident power is reflected at the substrate and is not detected.

Strategies for minimizing the reflection of incident light on the substrate of the cavity are to provide an anti-reflective material in or on the substrate of the cavity. An anti-reflective material could be in the form of a coating and acts to reduce the reflection at the surface, allowing a higher level of visible light transmission. Anti-reflective or antireflection (AR) coatings are a type of optical coating applied to the surface of optical devices to reduce reflection. This improves the efficiency of the system since less light is lost. The methods for implementing anti-reflective coatings include the use of alternating layers of a low-index material like silica and a higher-index material to obtain reflectivity as low as 0.1% at a single wavelength or over a range of wavelengths.

In one embodiment, the anti-reflective material could work near a single light frequency. Other embodiments could use a green antireflective coating, for example, on the substrate of the cavity containing the blue absorbing nanostructure 1, and a red anti-reflective coating with a cyan absorbing nanostructure 1.

Many AR coatings have transparent thin film structures with alternating layers of contrasting refractive index. Layer thicknesses are chosen to produce destructive interference in the beams reflected from the interfaces, and constructive interference in the corresponding transmitted beams. This makes the structure's performance change with wavelength and incident angle, so that color effects often appear at oblique angles. A wavelength range must be specified when designing or ordering such coatings, but good performance can often be achieved for a relatively wide range of frequencies: usually a choice of IR, visible, or UV is offered.

A simple interference AR coating could be a single quarter-wave layer of transparent material whose refractive index is the square root of the substrate's refractive index. This theoretically gives zero reflectance at the center wavelength and decreased reflectance for wavelengths in a broad band around the center. By using alternating layers of a low-index material like silica and a higher-index material it is possible to obtain reflectivities as low as 0.1% at a single wavelength.

One embodiment of the AR coating could be ultraviolet anti-reflection (UAR) coating. This ultraviolet anti-reflection coating could reduce surface reflection from quartz, fused silica, semiconductor silicon substrates to less than 0.3% from 0.2 to 0.3 microns. UAR coatings are designed to promote effective transmission of light in the ultraviolet wavelengths.

Anti-reflective coatings include several different sub-layers comprising many different materials such as, but not limited to, $Al_2O_3$, $ZrO_3$, $MgF_2$, $SiO_2$, cryolite, LiF, $ThF_4$, $CeF_3$, $PbF_2$, ZnS, ZnSc, Si, Te, MgO, $Y_2O_3$, $Sc_2O_3$, SiO, $HfO_2$, $ZrO_2$, $CeO_2$, $Nb_2O_3$, $Ta_2O_5$, and $TiO_2$. The thickness of each sublayer is often related to an even whole number division of the wavelength of light that is most preferred to be transmitted through the coated material.

Another embodiment of an anti-reflective coating could be a treated silicon layer. An untreated silicon layer absorbs about 67.4 percent of light shone upon it—meaning that nearly one-third of that light is reflected away. In the embodiments of the invention, a silicon surface could be treated with a nanoengineered reflective coating such that the material could absorb 90 or more of the optical light directed onto the material. For example, the nanoengineered anti-reflective material of Lin disclosed in "Realization of a Near Perfect Antireflection Coating for Silicon Solar Energy," published in November 2008 by the journal *Optics Letters*, which is incorporated herein in its entirety by reference, absorbed 96.21 percent of light shone upon it.

The new coating could also successfully tackle the tricky challenge of angles. Typical antireflective coatings are engineered to transmit light of one particular wavelength. The new coating could stack multiple layers, for example seven layers, one on top of the other, in such a way that each layer enhances the antireflective properties of the layer below it. These additional layers also help to bend the flow of light to an angle that augments the coating's antireflective properties. This means that each layer not only transmits light, it also helps to capture any light that may have otherwise been reflected off of the layers below it.

For example, the seven layers, each with a height of 50 nanometers to 100 nanometers, could be made up of silicon dioxide and titanium dioxide nanorods positioned at an oblique angle such that light is captured between the nanorods. The nanorods could be attached to a silicon substrate via chemical vapor disposition. The new coating could be affixed to nearly any photovoltaic materials, including III-V multi-junction and cadmium telluride.

Example

Effect of Cavity Size on the Angle Dependence of a Single Nanostructure 1

A nanostructure 1 capacitor-photodiode in a smaller cavity could display a significantly reduced angular dependence in its response when the ratio of a diameter of the cavity to a diameter of the nanostructure 1 is at less than about 10, preferably less than about 9, more preferably less than 8, and most preferably less than 7.

Figure 41:
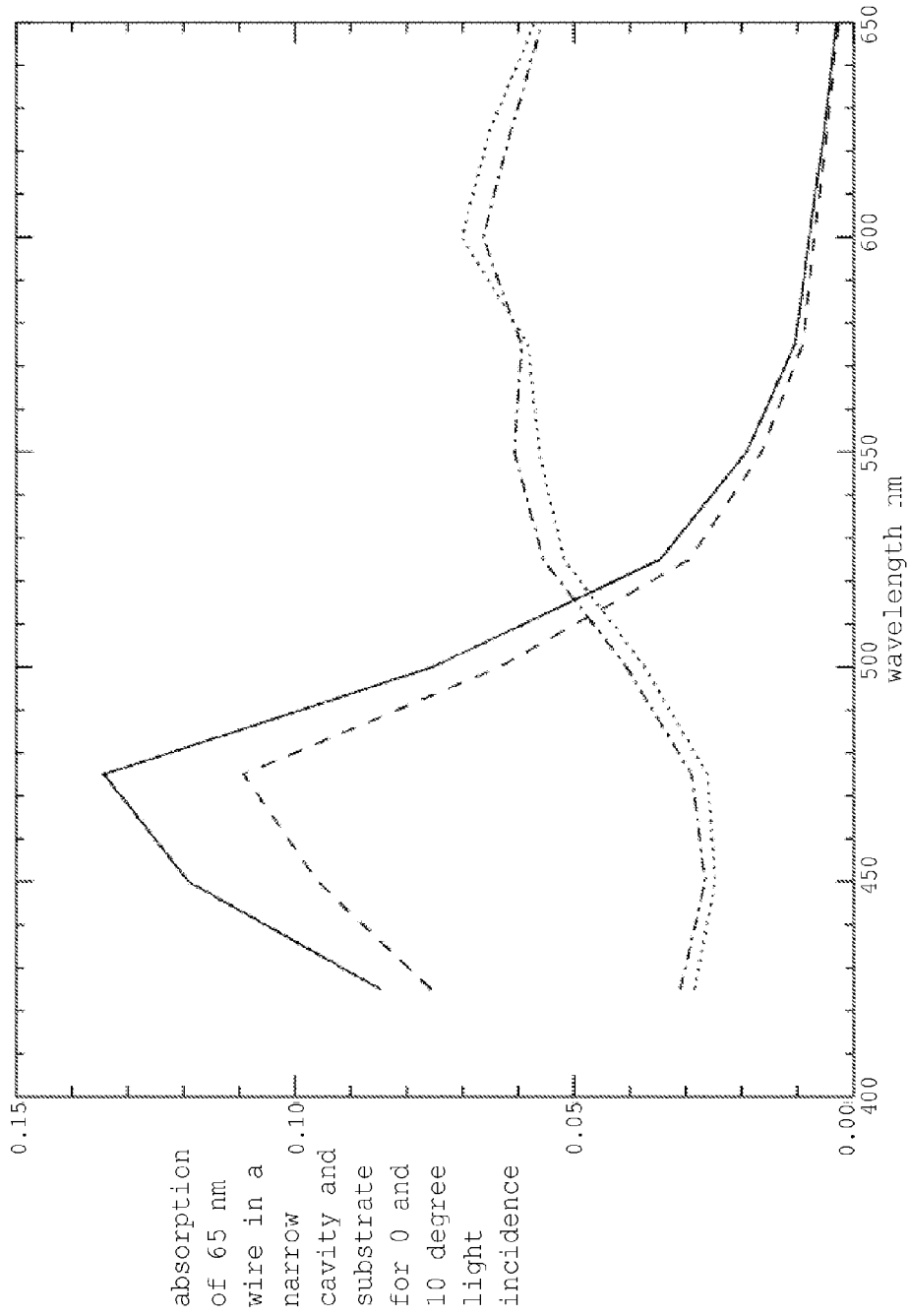
FIG. 41 shows a response of the single wire of diameter 65 nm in a 600 nm cavity as a function of wavelength with illumination incident at 0 and 10 degrees from the vertical.

Simulations indicate a nanostructure 1 of 65 nm in a single cavity of 600 nm could dramatically reduce angular dependence as shown in FIG. 41 as compared to the angular dependence of nanostructure 1 of 65 nm in a single cavity of 1200 nm shown in FIG. 39. In arriving at the simulations whose results are shown in FIGS. 39 and 41, it was assumed that all light not absorbed by the nanostructure 1 would be absorbed in the substrate.

FIG. 41 shows a plot entitled "wire_65 nm_angle_plot" simulating absorption in a 65 nm nanostructure 1 located concentrically in a cavity of 600 nm and by the substrate. The solid line is the response of the single wire of diameter 65 nm as a function of wavelength with illumination incident in a perpendicular direction and the dashed line is the same response but for a wire illuminated at 10 degrees from vertical. The dotted line is the response of the substrate for vertical illumination and the dash dot line is the same for illumination at 10 degrees. The term response refers to the ability to absorb incident light.

FIG. 41 shows the following features of a single nanostructure 1 capacitor-photodiode in a cavity: (1) the response of the single nanostructure 1 has a maximum around 480 nm wavelength of light; (2) the response of the single nanostructure 1 does not change substantially with a change in the angle of light incidence from perpendicular to the nanostructure 1 to 10 degrees from the perpendicular axis; (3) the response of the substrate has a maximum around 600 nm wavelength of light; and (4) the response of the substrate is substantially the same for the angle of light incidence of 10 degrees from the perpendicular axis and for the angle of light incidence perpendicular to the nanostructure 1.

The human eye has photoreceptors (called cone cells) for medium- and high-brightness color vision, with sensitivity peaks in short (S, 420-440 nm), middle (M, 530-540 nm), and long (L, 560-580 nm) wavelengths (there is also the low-brightness monochromatic "night-vision" receptor, called rod cell, with peak sensitivity at 490-495 nm). Thus, in principle, three parameters describe a color sensation. The tristimulus values of a color are the amounts of three primary colors in a three-component additive color model needed to match that test color. The tristimulus values are most often given in the CIE 1931 color space, in which they are denoted X, Y, and Z.

In the CIE XYZ color space, the tristimulus values are not the S, M, and L responses of the human eye, but rather a set of tristimulus values called X, Y, and Z, which are roughly red, green and blue, respectively (note that the X, Y, Z values are not physically observed red, green, blue colors. Rather, they may be thought of as 'derived' parameters from the red, green, blue colors). Two light sources, made up of different mixtures of various wavelengths, may appear to be the same color; this effect is called metamerism. Two light sources have the same apparent color to an observer when they have the same tristimulus values, no matter what spectral distributions of light were used to produce them.

Due to the nature of the distribution of cones in the eye, the tristimulus values depend on the observer's field of view. To eliminate this variable, the CIE defined the standard (colorimetric) observer. Originally this was taken to be the chromatic response of the average human viewing through a 2° angle, due to the belief that the color-sensitive cones resided within a 2° arc of the fovea. Thus the CIE 1931 Standard Observer is also known as the CIE 1931 2° Standard Observer. A more modern but less-used alternative is the CIE 1964 10° Standard Observer, which is derived from the work of Stiles and Burch, and Speranskaya.

The color matching functions are the numerical description of the chromatic response of the observer as described above.

The CIE has defined a set of three color-matching functions, called, $\bar{x}(\lambda)$, $\bar{y}(\lambda)$, and $\bar{z}(\lambda)$, which can be thought of as the spectral sensitivity curves of three linear light detectors that yield the CIE XYZ tristimulus values X, Y, and Z. These functions are known collectively as the CIE standard observer.

The tristimulus values for a color with a spectral power distribution $I(\lambda)$ are given in terms of the standard observer by:

$$X = \int_0^\infty I(\lambda)\bar{x}(\lambda)d\lambda, \quad Y = \int_0^\infty I(\lambda)\bar{y}(\lambda)d\lambda,$$

$$Z = \int_0^\infty I(\lambda)\bar{z}(\lambda)d\lambda,$$

wherein $\lambda$ is the wavelength of the equivalent monochromatic light (measured in nanometers).

Examples

Figure 42A:
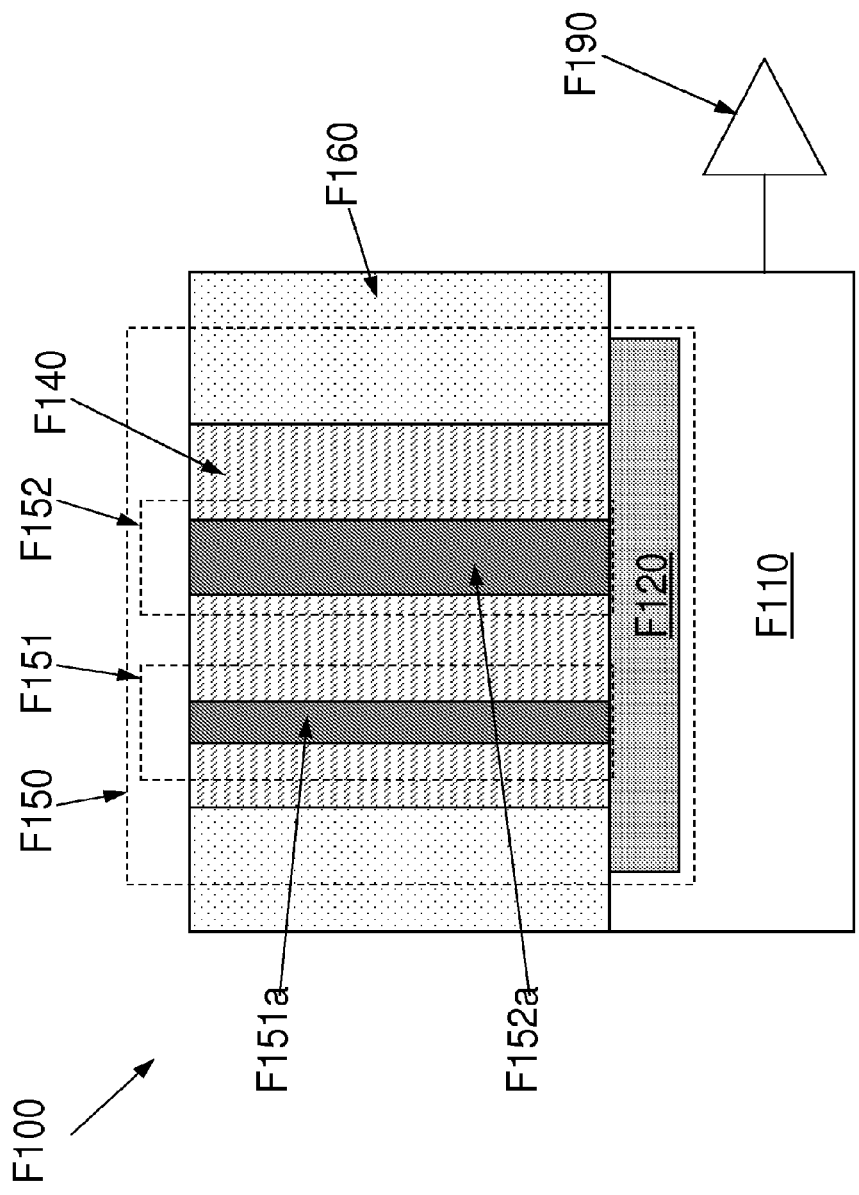
FIG. 42A shows a schematic cross-sectional view of an image sensor according to an embodiment.

FIG. 42A shows a schematic partial cross-sectional view of an image sensor F100, according to an embodiment. The image sensor F100 comprises a substrate F110, one or more pixels F150. At least one pixel F150 comprises a clad F140 and a plurality of subpixels embedded in the clad F140. Two subpixels F151 and F152 are shown in FIG. 42A as an example. Each of the subpixels comprises a nanostructure 1 (e.g. a nanowire F151a in the subpixel F151 and a nanowire F152a in the subpixel F152) extending essentially perpendicularly from the substrate F110. Space between the pixels F150 is preferably filled with a material F160. Each pixel F150 can further comprise one or more photodiodes F120 located between the substrate F110 and the nanowires F151a and F152a.

The substrate F110 can comprise any suitable material such as silicon, silicon oxide, silicon nitride, sapphire, diamond, silicon carbide, gallium nitride, germanium, indium gallium arsenide, lead sulfide, and/or a combination thereof.

The photodiode F120 can be any suitable photodiode. The photodiode F120 can have a p-n junction of a p-i-n junction and any suitable circuitry. The photodiode F120 preferably has a footprint that completely encloses a footprint of the clad F140.

The clad F140 can comprise any suitable material, such as silicon nitride, silicon oxide, and/or a combination thereof. The clad 140 is preferably substantially transparent to visible light, preferably with a transmittance of at least 50%, more preferably at least 70%, most preferably at least 90%. In one example, the clad F140 is silicon nitride and has a cylindrical shape with a diameter of about 300 nm.

The material F160 can comprise any suitable material such as silicon dioxide. A refractive index of the material F160 is preferably smaller than a refractive index of the clad F140.

The nanostructures 1 (e.g. nanowires F151a and F152a) in the subpixels (e.g. F151 and F152) have refractive indexes equal to or greater than the refractive index of the clad F140. The nanostructures 1 (e.g. nanowires F151a and F152a) and the photodiode F120 have different absorption spectra. For example, the nanowire F151a has strong absorptance in blue wavelengths, as shown by an exemplary absorption spectrum F181 in FIG. 42C; the nanowire F152a has a strong absorptance in green wavelengths, as shown by an exemplary absorption spectrum F182 in FIG. 42C; the photodiode F120 has strong absorptance in red wavelengths, as shown by an exemplary absorption spectrum F180 in FIG. 42C. The nanowires can have different diameters and/or different materials. Each nanowire in one pixel F150 preferably has a distance of at least 100 nm, preferable at least 200 nm, to a nearest neighboring nanowire in the same pixel. The nanowires can be positioned at any suitable positions in the clad F140.

The nanostructures 1 (e.g. nanowires F151a and F152a) in the subpixels (e.g. 151 and 152) are operable to generate electrical signals upon receiving light. One exemplary nanowire is a photodiode with a p-n or p-i-n junction therein, details of which can be found in U.S. patent application Publication Ser. Nos. 12/575,221 and 12/633,305, each of which is hereby incorporated by reference in its entirety. The electrical signals can comprise an electrical voltage, an electrical current, an electrical conductance or resistance, and/or a change thereof. The nanowires can have a surface passivation layer.

Substantially all visible light (e.g. >50%, >70%, or >90%) impinged on the image sensor F100 is absorbed by the subpixels (e.g. 151 and 152) and the photodiode F120. The subpixels and the photodiode absorb light with different wavelengths.

The image sensor F100 can further comprise electronic circuitry F190 operable to detect electrical signals from the subpixels and the photodiode F120.

In one specific example, each pixel F150 has two subpixels F151 and F152. Each subpixel F151 and F152 has only one nanostructure 1 (e.g. nanowires F151a and F152a), respectively. The nanowire F151a comprises silicon, has a radius of about 25 nm, and has a strong absorptance in blue wavelengths. The nanowire F152a comprises silicon, has a radius of about 40 nm and has a strong absorptance in cyan wavelengths. The nanowires F151a and F152a are about 200 nm apart but embedded in the same clad F140. Each of the pixels F150 can have more than two subpixels according to an embodiment. The nanowires can comprise other suitable materials such as mercury cadmium telluride. The nanowires can have other suitable radii from 10 nm to 250 nm.

Figure 42B:
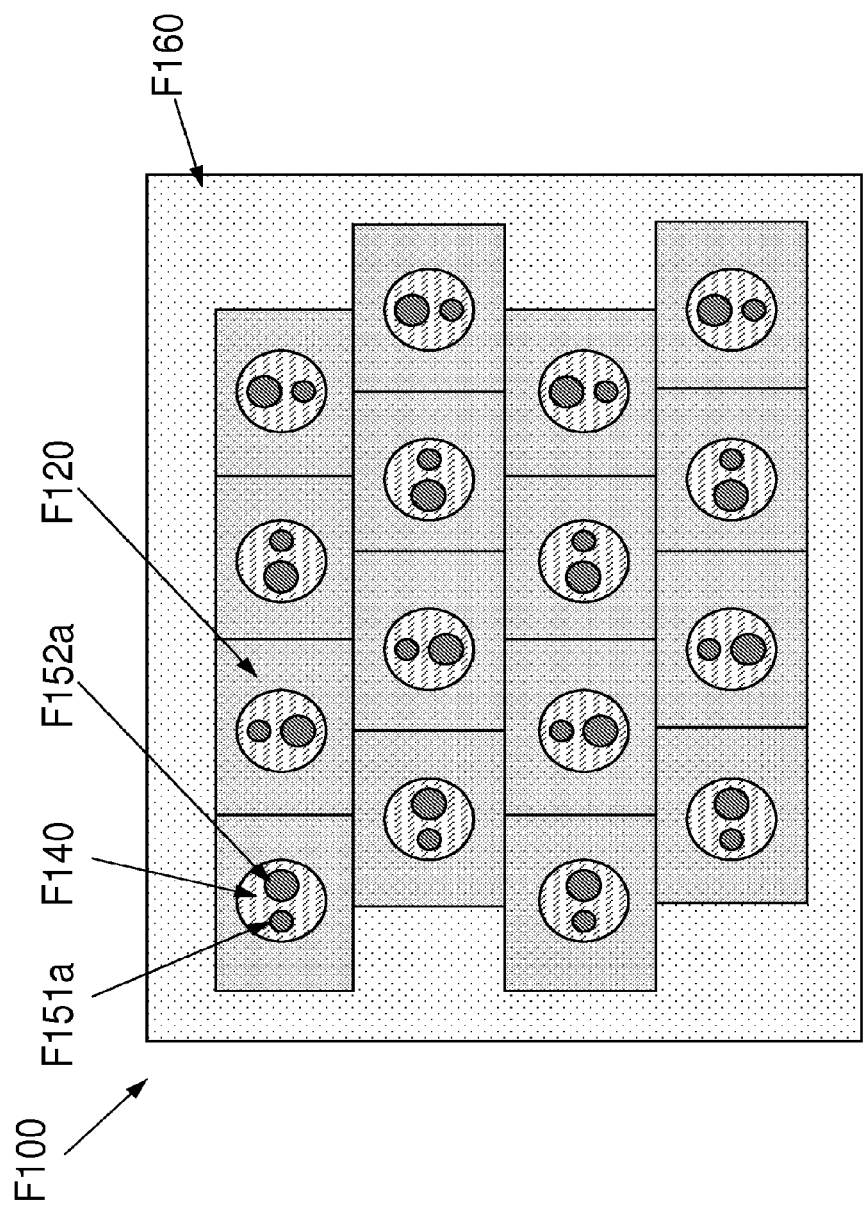
FIG. 42B shows a schematic top view of the image sensor of FIG. 42A.
Figure 42C:
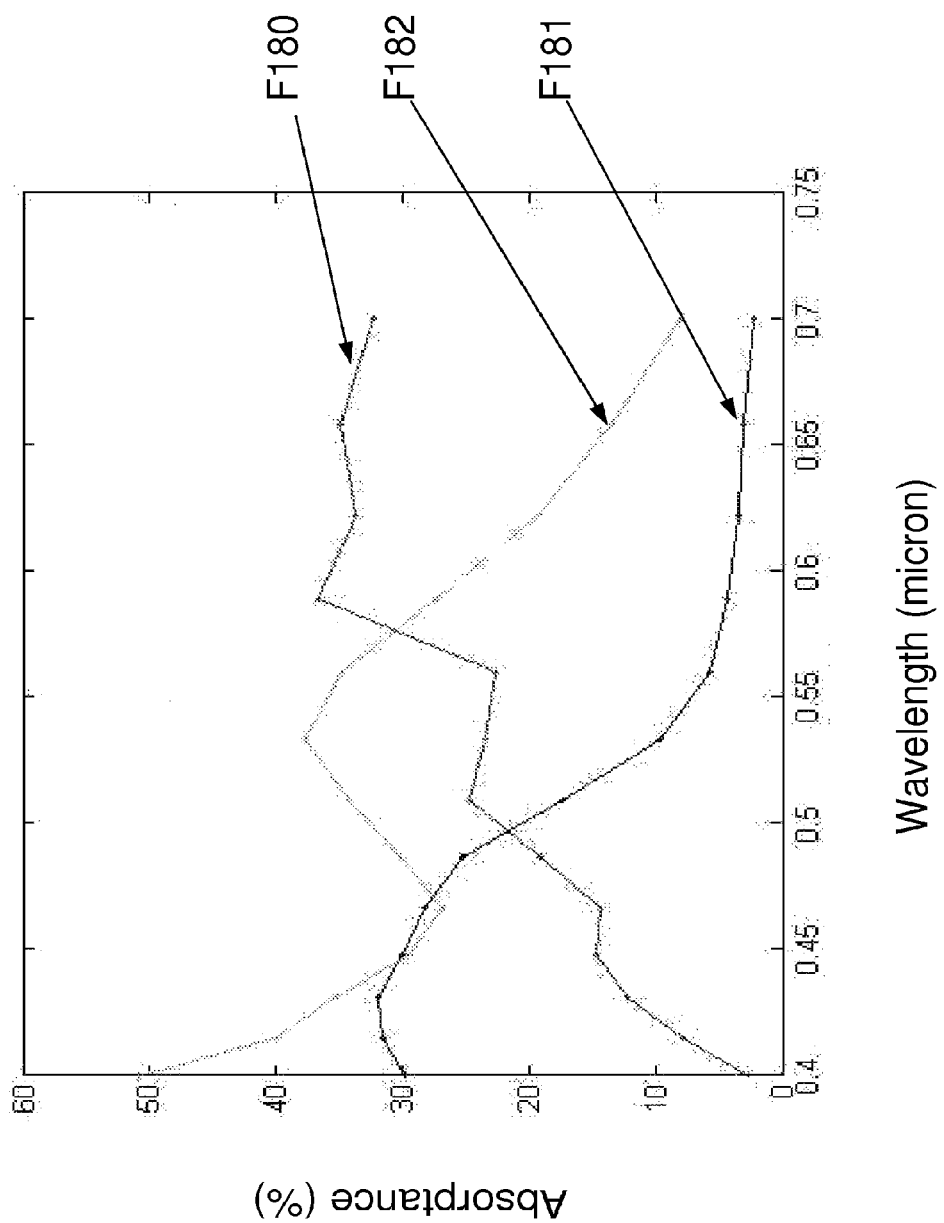
FIG. 42C shows exemplary absorption spectra of two nanowires in two subpixels in a pixel of the image sensor of FIG. 42A and a photodiode on the substrate of the image sensor of FIG. 42A.

FIG. 42B shows a schematic partial top view of the image sensor F100. As shown in exemplary FIG. 42B, the pixels F150 can have different orientations, which reduces or eliminates effects of directions of incident light.

In one embodiment, the subpixels F151 and F152 and the photodiode F120 in each pixel F150 of the image sensor F100 has color matching functions substantially the same as the color matching functions of the CIE 1931 2° Standard Observer or the CIE 1964 10° Standard Observer.

Figure 43A:
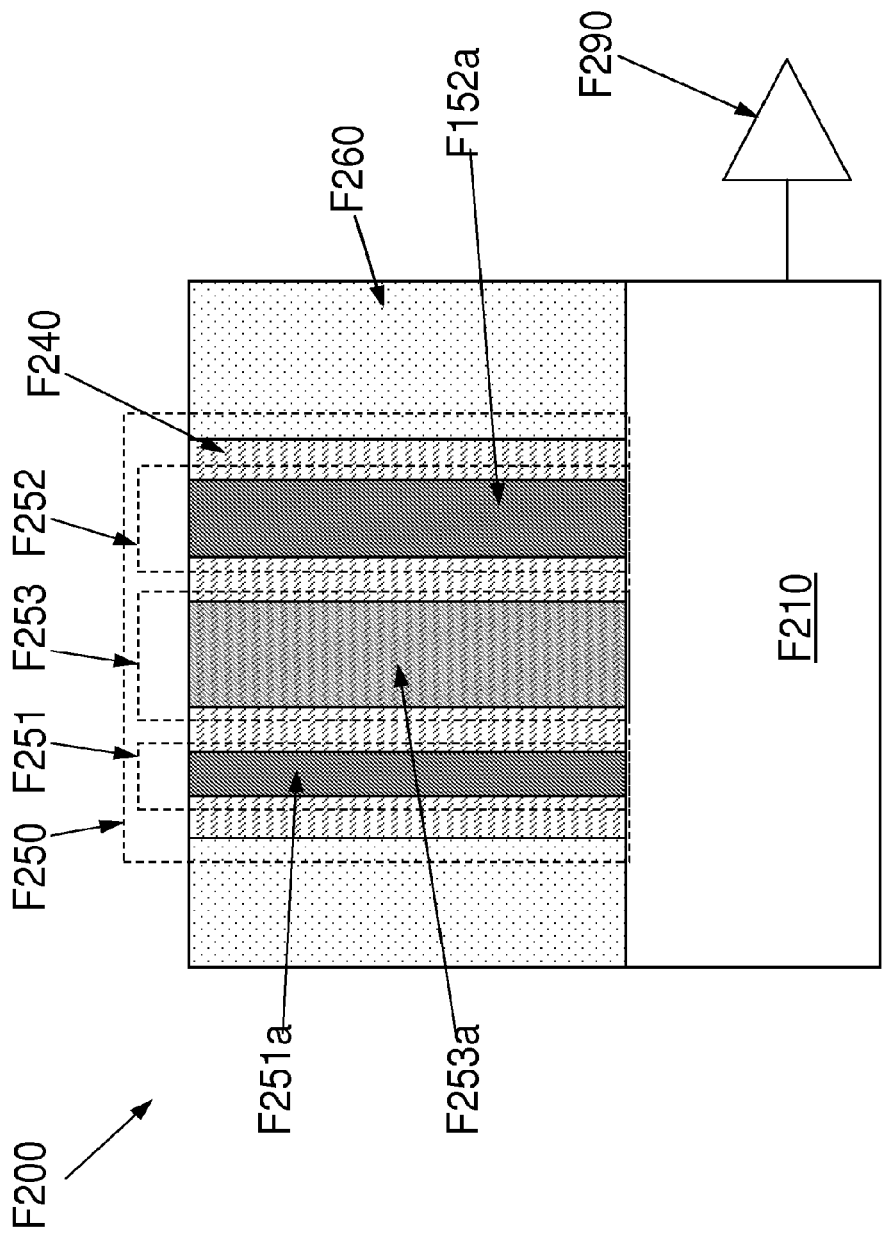
FIG. 43A shows a schematic cross-sectional view of an image sensor according to an embodiment.

FIG. 43A shows a schematic partial cross-sectional view of an image sensor F200, according to an embodiment. The image sensor F200 comprises a substrate F210, one or more pixels F250. The substrate F210 preferably does not comprise any photodiode therein. At least one pixel F250 comprises a clad F240 and a plurality of subpixels embedded in the clad F240. Three subpixels F251, F252 and F253 are shown in FIG. 43A as an example. Each of the subpixels comprises a nanostructure 1 (e.g. a nanowire F251a in the subpixel F251, a nanowire F252a in the subpixel F252 and a nanowire F253a in the subpixel F253) extending essentially perpendicularly from the substrate F210. Space between the pixels F250 is preferably filled with a material F260.

The substrate F210 can comprise any suitable material such as silicon, silicon oxide, silicon nitride, sapphire, diamond, silicon carbide, gallium nitride, germanium, indium gallium arsenide, lead sulfide and/or a combination thereof.

The clad F240 can comprise any suitable material, such as silicon nitride, silicon oxide, etc. The clad F240 is preferably substantially transparent to visible light, preferably with a transmittance of at least 50%, more preferably at least 70%, most preferably at least 90%. In one example, the clad F240 is silicon nitride and has a cylindrical shape with a diameter of about 300 nm.

The material F260 can comprise any suitable material such as silicon dioxide. A refractive index of the material F260 is preferably smaller than a refractive index of the clad F240.

The nanostructures 1 (e.g. nanowires 251a, 252a and 253a) in the subpixels (e.g. F251, F252 and F253) have refractive indexes equal to or greater than the refractive index of the clad F240. The nanowires and the substrate F210 have different absorption spectra. For example, the nanowire F251a has strong absorptance in blue wavelengths, as shown by an exemplary absorption spectrum F281 in FIG. 43C; the nanowire F252a has a strong absorptance in green wavelengths, as shown by an exemplary absorption spectrum F282 in FIG. 43C; the nanowire F253a has a strong absorptance across the entire visible spectrum, as shown by an exemplary absorption spectrum F283 in FIG. 43C; the substrate F210 has a strong absorptance in red wavelengths, as shown by an exemplary absorption spectrum F280 in FIG. 43C. The nanowires can have different diameters and/or different materials. Each nanowire in one pixel F250 preferably has a distance of at least 100 nm, preferable at least 200 nm, to a nearest neighboring nanowire in the same pixel. The nanowires in the clad F240 can be positioned at any suitable positions in the clad F240. The nanowires can have a surface passivation layer. The nanowires can comprise other suitable materials such as mercury cadmium telluride. The nanowires can have other suitable radii from 10 nm to 250 nm.

The nanostructures 1 (e.g. nanowires F251a, F252a and F253a) in the subpixels (e.g. F251, F252 and F253) are operable to generate electrical signals upon receiving light. One exemplary nanowire is a photodiode with a p-n or p-i-n junction therein, details of which can be found in U.S. patent application Publication Ser. Nos. 12/575,221 and 12/633,305, each of which is hereby incorporated by reference in its entirety. The electrical signals can comprise an electrical voltage, an electrical current, an electrical conductance or resistance, and/or a change thereof.

Substantially all visible light impinged on the image sensor F200 is absorbed by the subpixels (e.g. F251, F252 and F253). The subpixels absorb light with different wavelengths.

The image sensor F200 can further comprise electronic circuitry F290 operable to detect electrical signals from the subpixels.

In one specific example, each pixel F250 has three subpixels F 251, F252 and F253. Each subpixel F251, F252 and F253 has only one nanowire F251a, F252a and F253a, respectively. The nanowire F251a comprises silicon, has a radius of about 25 nm, and has a strong absorptance in blue wavelengths. The nanowire F252a comprises silicon, has a radius of about 40 nm and has a strong absorptance in green wavelengths. The nanowire F253a comprises silicon, has a radius of about 45 nm and has a strong absorptance across the entire visible spectrum. The nanowires F251a, F252a and F253a are about 200 nm apart but embedded in the same clad F240. The clad F240 is cylindrical in shape with a diameter of about 400 nm. Each of the pixels F250 can have more than three subpixels according to an embodiment.

In another specific example, each pixel F250 has four subpixels F251, F252, F253 and F254. Each subpixel F251, F252, F253 and F254 has only one nanostructure 1 (e.g., nanowire F251a, F252a, F253a and F254a respectively). The nanowire F251a comprises silicon, has a radius of about 25 nm, and has a strong absorptance in blue wavelengths. The nanowire F252a comprises silicon, has a radius of about 40 nm and has a strong absorptance in green wavelengths. The nanowire F253a comprises silicon, has a radius of about 45 nm and has a strong absorptance across the entire visible spectrum. The nanowire F254a comprises silicon, has a radius of about 35 nm and has a strong absorptance in blue green wavelength (e.g. 400 to 550 nm). The nanowires F251a, F252a, F253a and F254a are about 200 nm apart but embedded in the same clad F240. The clad F240 is cylindrical in shape with a diameter of about 400 nm. FIG. 43D shows exemplary absorption spectra F291, F292, F293 and F294 of the nanowires F251a, F252a, F253a and F254a, respectively.

Figure 43B:
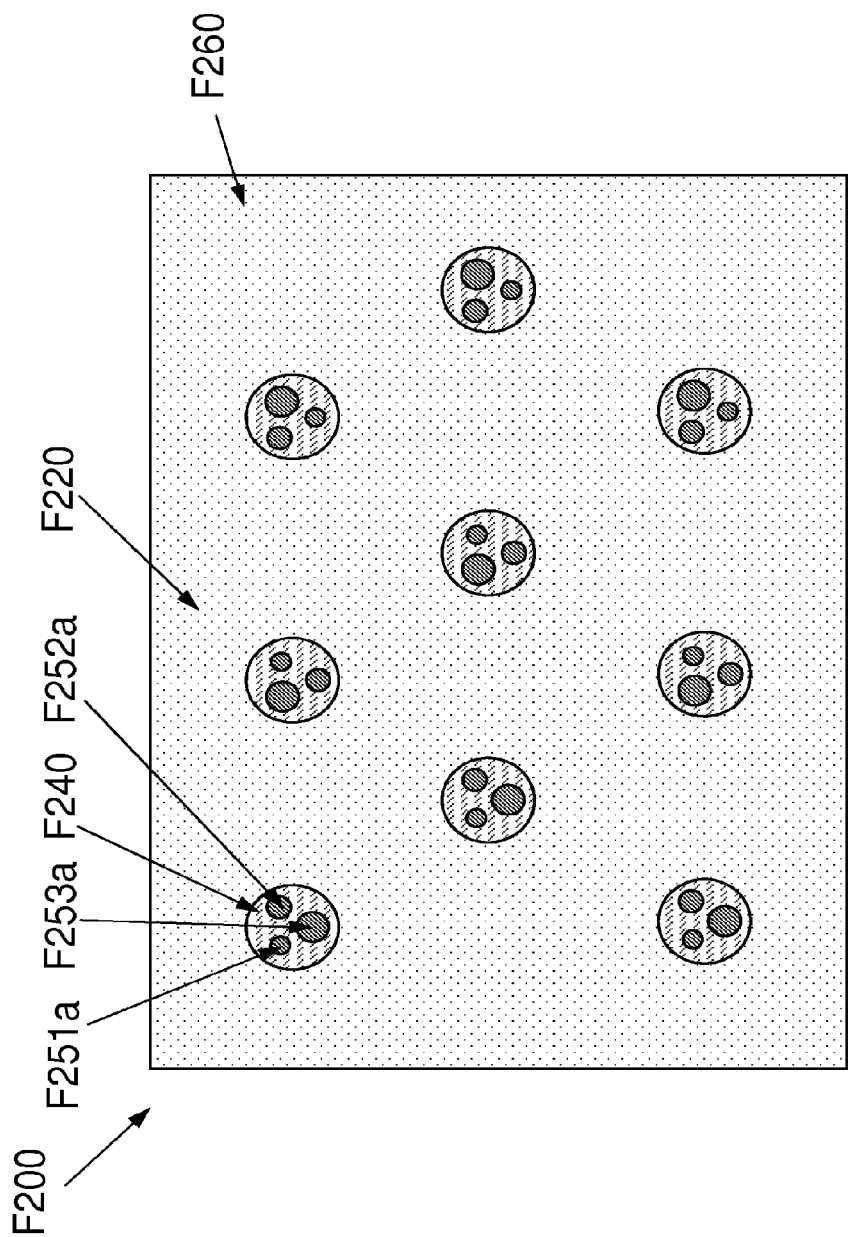
FIG. 43B shows a schematic top view of the image sensor of FIG. 43A.
Figure 43C:
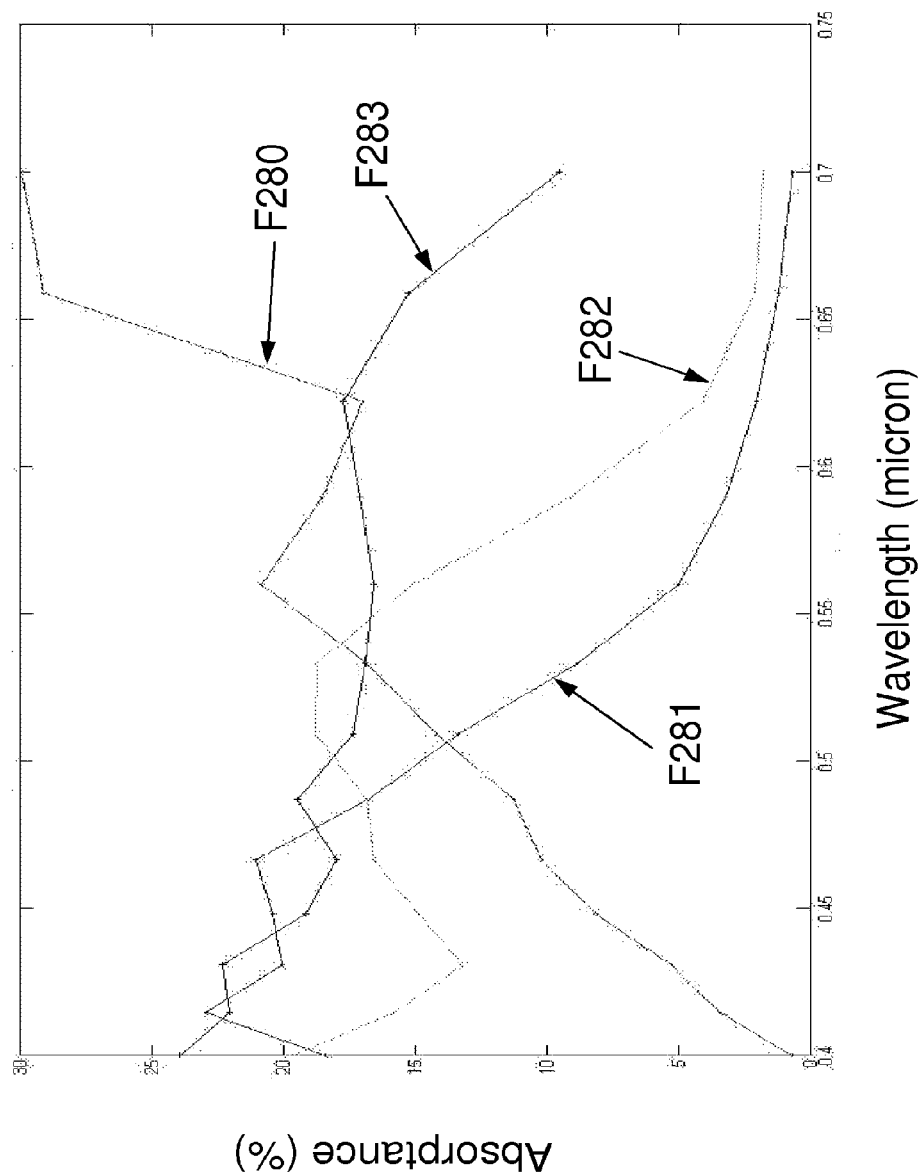
FIG. 43C shows exemplary absorption spectra of three nanowires in three subpixels in a pixel of the image sensor of FIG. 43A and the substrate of the image sensor of FIG. 43A.
Figure 43D:
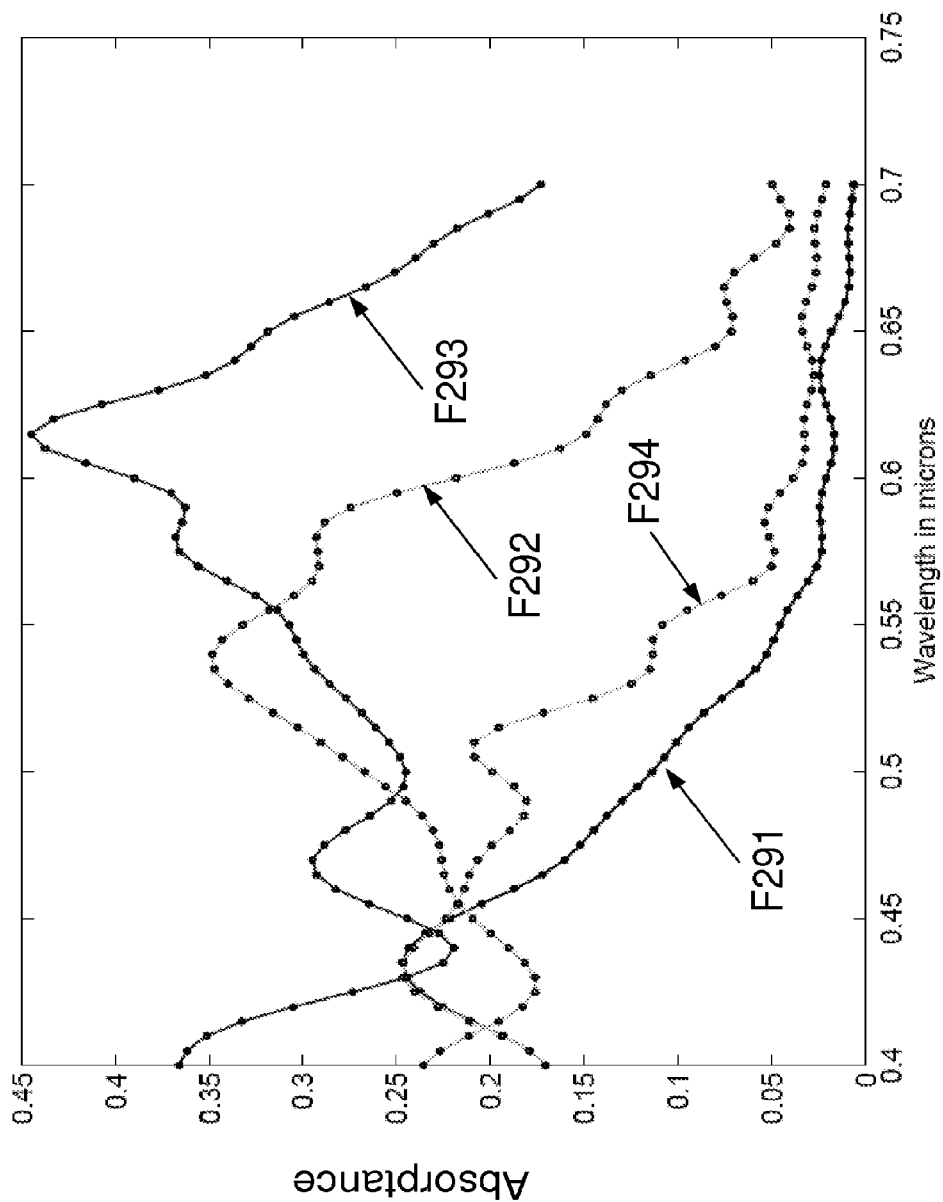
FIG. 43D shows exemplary absorption spectra of four nanowires in four subpixels in a pixel of the image sensor of FIG. 43A and the substrate of the image sensor of FIG. 43A.

FIG. 43B shows a schematic partial top view of the image sensor F200. As shown in exemplary FIG. 43B, the pixels F250 can have different orientations, which reduces or eliminates effects of directions of incident light.

Figure 44:
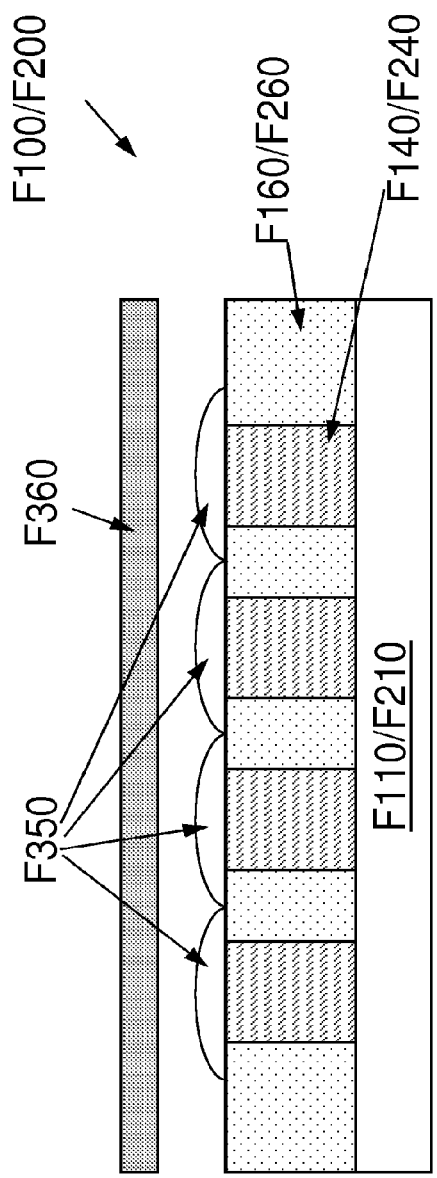
FIG. 44 shows a schematic of couplers and an infrared filter.

According to an embodiment, the image sensor F100 or F200 can further comprise couplers F350 above each pixel F150 or F250, as shown in FIG. 44. Each of the couplers F350 preferably has substantially the same footprint as the pixel underneath and has a convex surface. The coupler F350 is effective to focus substantially all visible light impinged thereon into the clad F140 or F240.

According to an embodiment, as shown in FIG. 44, the image sensor F100 or F200 can further comprise an infrared filter F360, which is operable to prevent infrared light, such as light with wavelengths above 650 nm, from reaching the pixels. According to an embodiment, the image sensor F100 or F200 does not comprise an infrared filter.

According an embodiment, the nanowires can be made by a dry etching process or a Vapor Liquid Solid (VLS) growth method. Of course, it will be appreciated that other materials and/or fabrication techniques may also be used for fabricating the nanowires in keeping with the scope of the invention. For instance, nanowires fabricated from an indium arsenide (InAs) wafer or related materials could be used for IR applications.

The nanowires can also be made to have a strong absorption in wavelengths not in the visible spectrum, such as in the ultraviolet (UV) or infrared (IR) spectra. In an embodiment, each nanowire can have transistor therein or thereon.

In one embodiment, the subpixels F251, F252 and F253 in each pixel F250 of the image sensor F200 has color matching functions substantially the same as the color matching functions of the CIE 1931 2° Standard Observer or the CIE 1964 10° Standard Observer.

Figure 45:
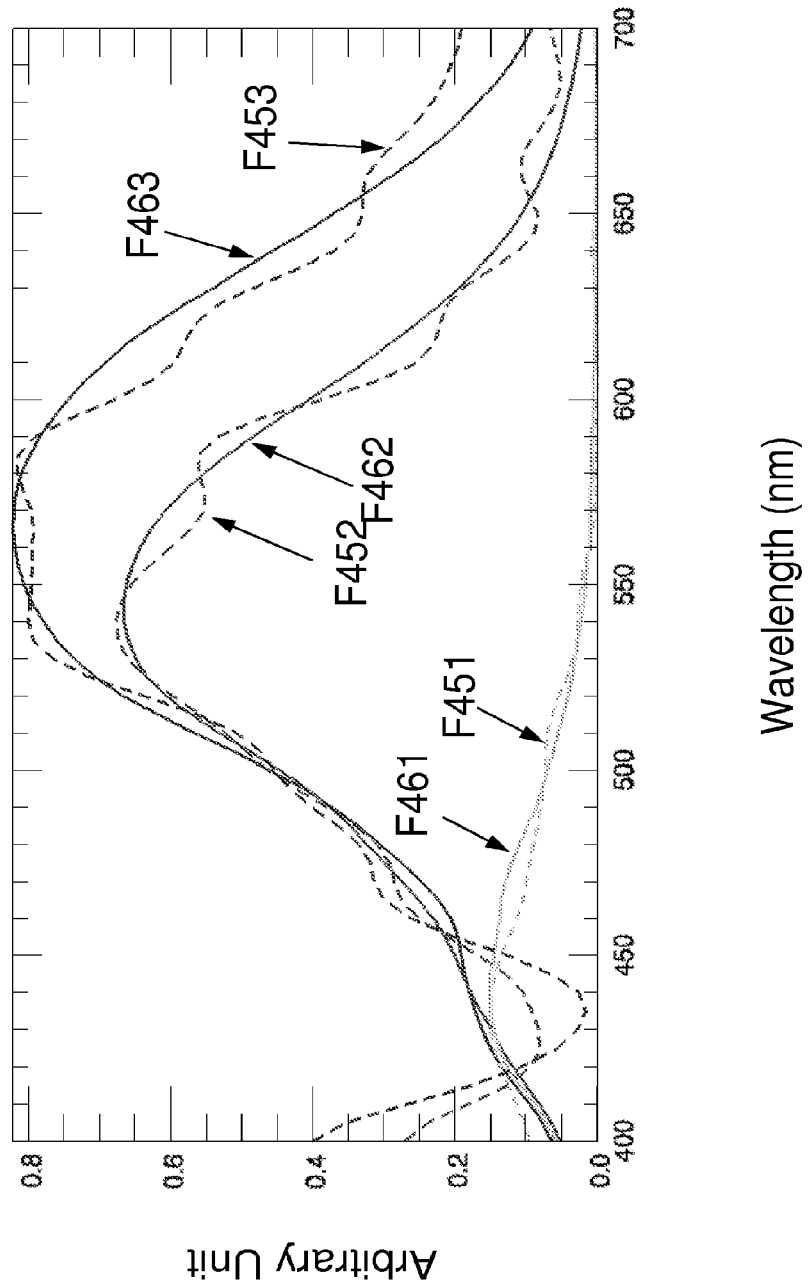
FIG. 45 shows exemplary color-matching functions of three subpixels in the image sensor, and color-matching functions the CIE standard observer.

FIG. 45 shows exemplary color-matching functions F451, F452 and F453 of the subpixels F251, F252 and F253, respectively. The color-matching functions F461, F462 and F463 are the $\bar{x}(\lambda)$, $\bar{y}(\lambda)$, and $\bar{z}(\lambda)$ of the CIE standard observer.

The image sensor F100 or F200 can be used to sense and capture images. A method of sensing an image comprises projecting the image onto the image sensor FS100 or F200 using any suitable optics such as lenses and/or mirrors; detecting an electrical signal from the nanowire in each subpixel in each pixel using suitable circuitry; calculating a color of each pixel from the electrical signals of the subpixels therein.

Figure 46:
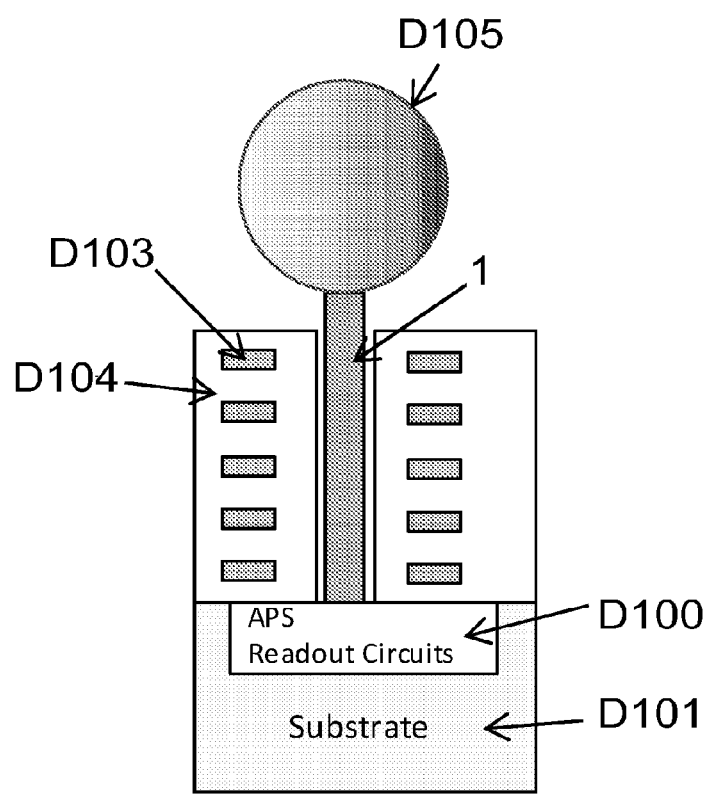
FIG. 46 illustrates a simplified cross sectional view of an embodiment of a pixel with a nanowire structured photodetector with front side illumination.
Figure 47:
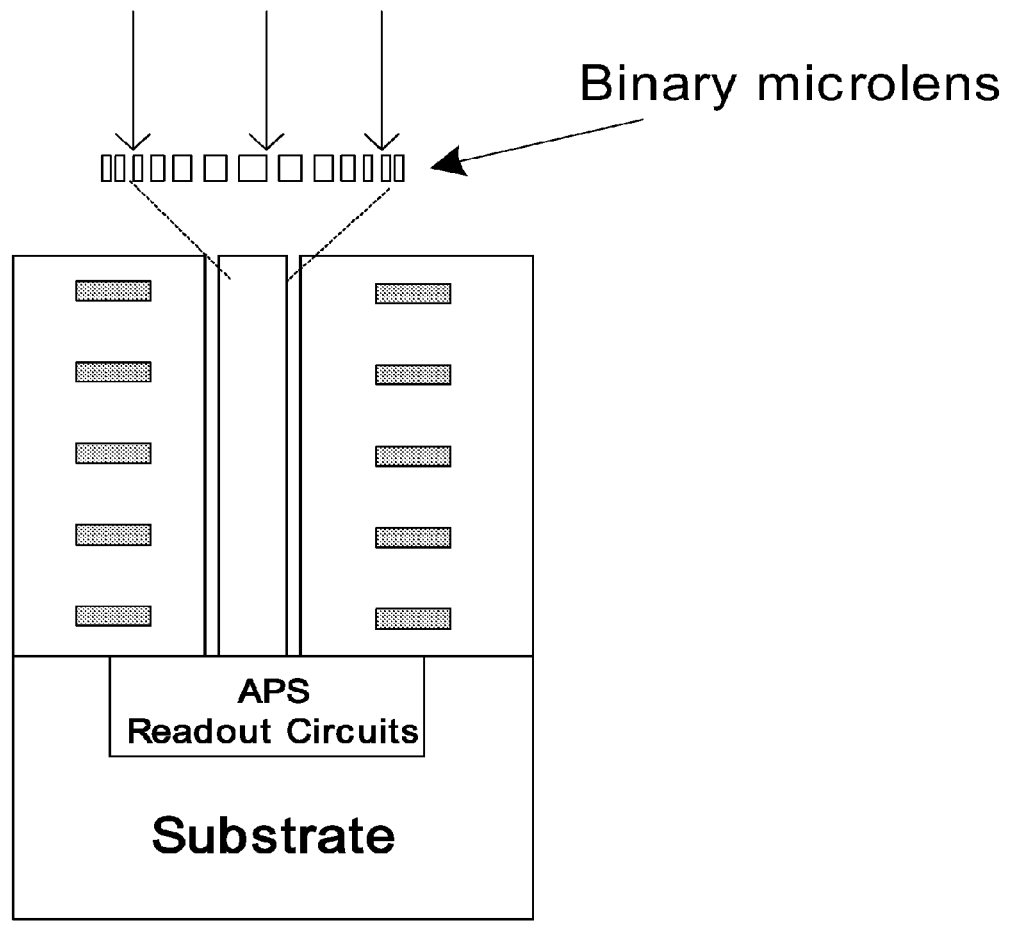
FIG. 47 illustrates an aspect of the embodiment illustrated in FIG. 46 with a binary microlens on the NW structured photodetector.

FIG. 46 shows a simplified cross section view of a pixel in an imaging device. Each pixel includes a readout circuit D100 formed on a semiconductor substrate D101 with metal lines D103 above the substrate. As a photosensitive element, a nanostructure 1 is formed standing up from the substrate. Photo absorption takes place along the length of the nanostructure 1. The output of the nanostructure 1 can be connected to the readout circuit D100 located in the substrate. Since the footprint of the nanostructure 1 is small, more than one nanostructure 1 can be formed in a pixel. The role of the long vertical structure of the nanostructure 1 is to absorb a certain bandwidth of light energy and generate a corresponding electrical signal and/or to guide the unabsorbed light energy to the substrate diode with minimum loss, thus performing as a waveguide. At the top end of the nanostructure 1, an optical coupler (e.g., a lens) D105 could be formed to couple the incident light into the nanostructure 1 with minimum energy loss or reflections. In this embodiment, a micro lens may be used as a coupler. The microlens may be, but not limited to, a spherical ball lens. The coupling efficiency of a spherical ball lens is typically higher than 90%. In another aspect, a binary microlens may be used as shown in FIG. 47.

Figure 48:
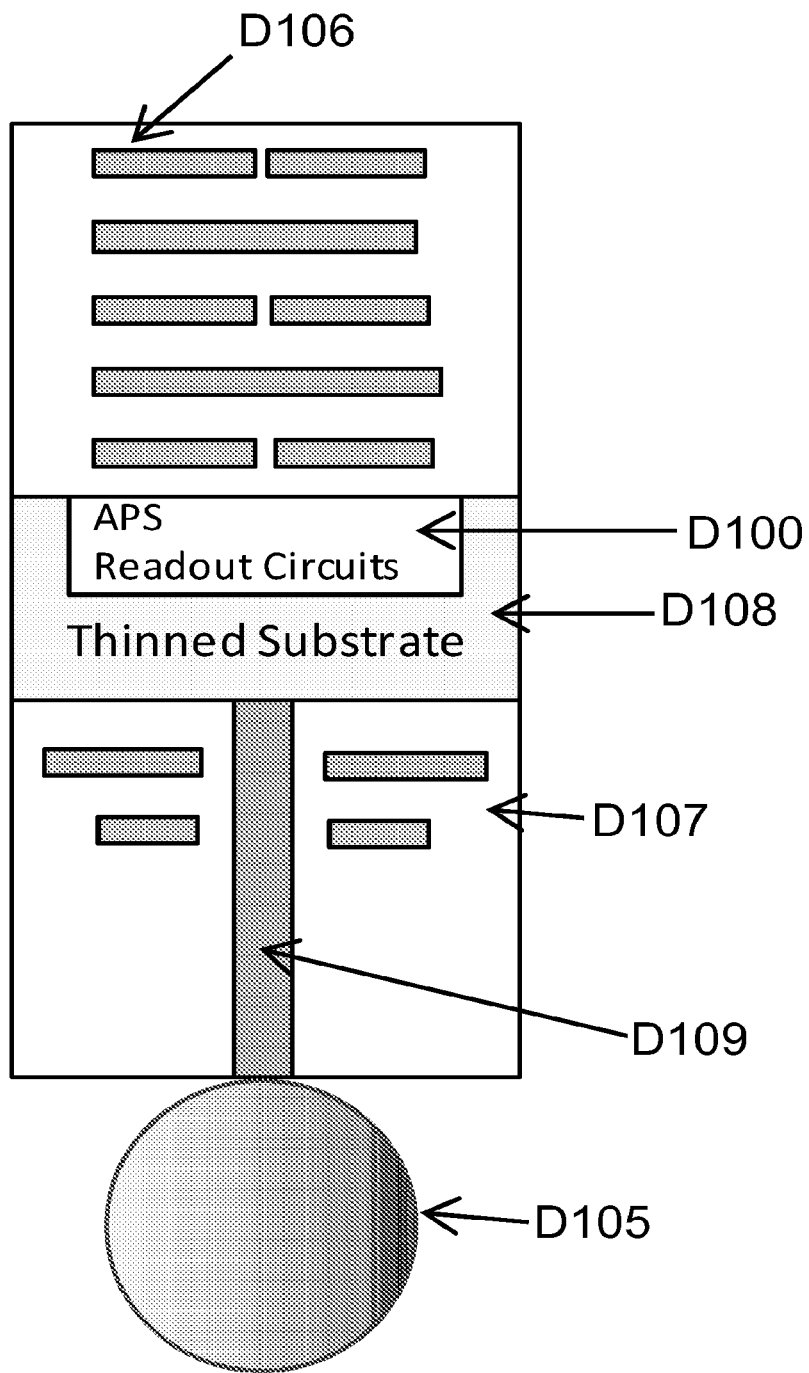
FIG. 48 illustrates simplified cross section view of an embodiment of a pixel with a nanowire structured photodetector with backside illumination.

FIG. 48 shows a simplified cross section view of a pixel which has a nanostructure 1 at the back side of a thinned semiconductor substrate. The nanostructure 1 generates photo charges by absorbing light energy in a certain bandwidth and dumping the charges into the thinned substrate. The charges are then collected by readout circuits D100 in the thinned substrate using an electrical field. Also, the nanowire guides and couples unabsorbed light into the substrate D108. An advantage of employing a nanostructure 1 at the back side of the substrate D108 is the ease of fabricating the nanowires. When forming nanowires at the front side, it is necessary to remove the thick dielectric layers D104 illustrated in FIG. 46 in a region where the nanostructure 1 is supposed to be constructed. In contrast, the embodiment disclosed in FIG. 48 could be made without this removal step. Further, the nanostructure 1 may fabricated without modifying front side structure of the CMOS devices. This embodiment includes both front side metal and insulating layers D106 and backside metal and insulating layers D107. Further, as in the front side embodiment, a micro lens of an optical coupler D105 may be coupled to the nanostructure 1.

A nanostructure 1 could be configured in a variety of photodetector configurations. These configurations include: a photo conductor, a photodiode, or a photogate device. A photo conductor is a photo sensitive device whose resistivity varies as a function of incident light. A photodiode is a p-n diode or a p-i-n diode which generates electron-hole pairs as a photo charge. A photogate device is a MOS (metal-oxide-semiconductor) device with a biased gate that creates a potential well in the semiconductor and accumulates photo charge in the potential well. In the following embodiments, various configurations of photodiodes, photogate devices, or combinations of a photodiode and a photogate detector are implemented as photo detecting elements.

Figure 49:
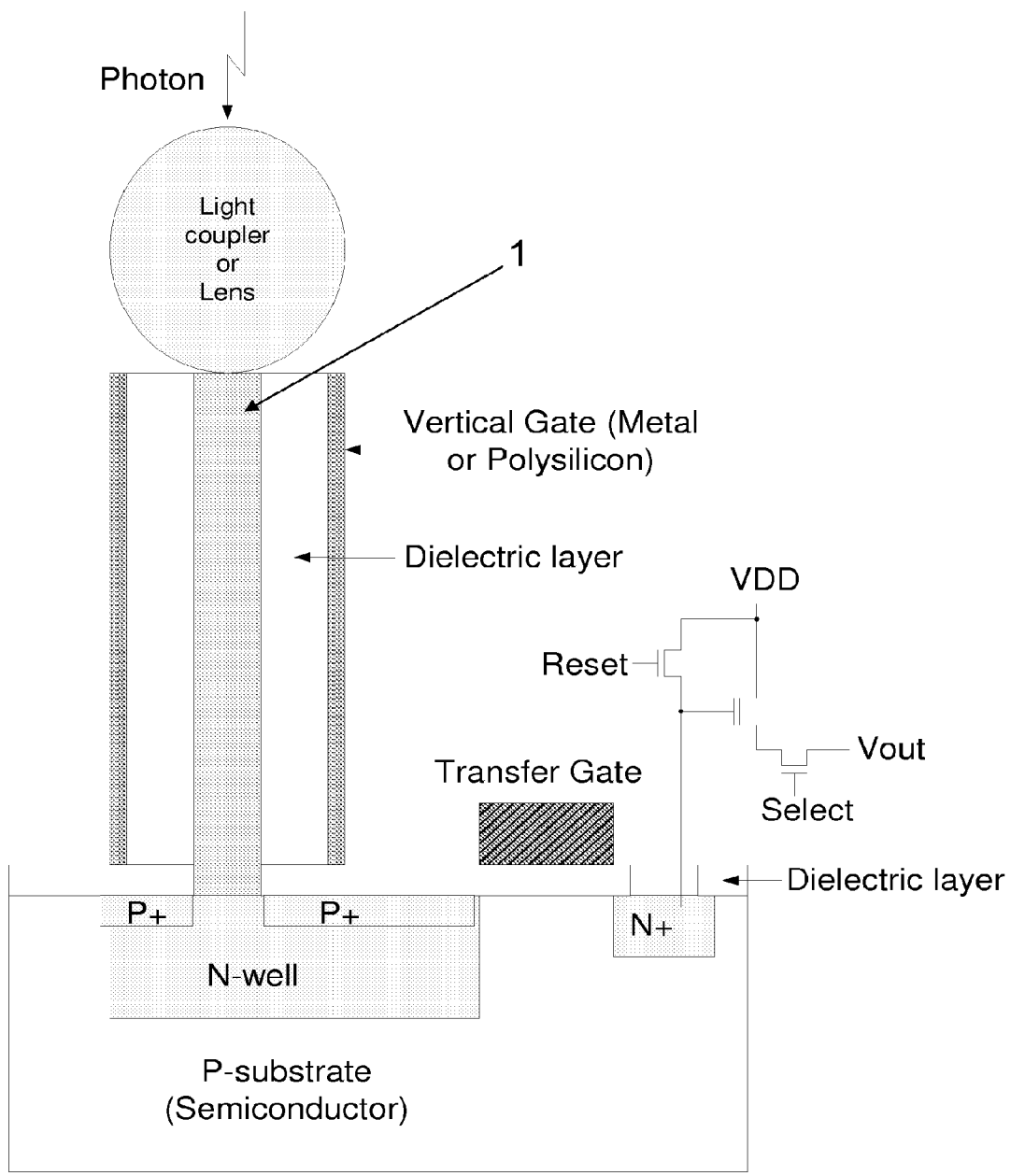
FIG. 49 illustrates an embodiment having a CMOS pixel with a nanowire and a vertical photogate (VPG).
Figure 50:
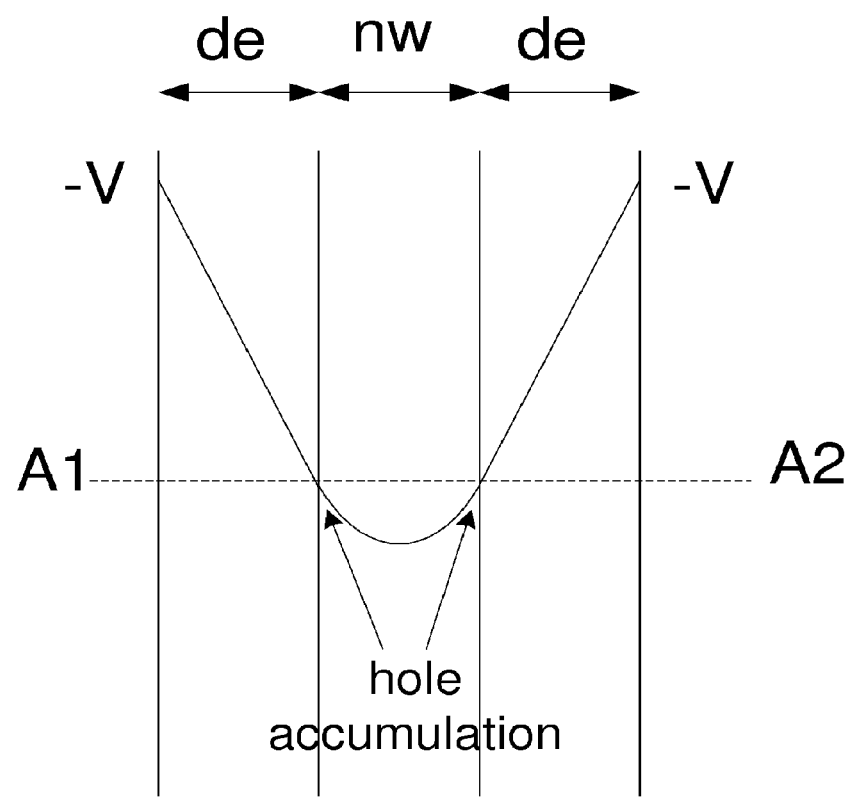
FIG. 50, illustrates a potential profile of an embodiment.

FIG. 49 shows a cross sectional view of a CMOS pixel with a nanostructure 1 configured as photogate device. In this embodiment, there are two photodetectors per pixel, the nanostructure 1 and a substrate diode. The nanostructure 1 with a dielectric cladding layer and a vertical gate. The role of the vertical gate surrounding the nanostructure 1 is to deplete the nanostructure 1 and create a potential well at the nanostructure 1 as shown in FIG. 50 by applying a slight bias voltage to the vertical gate. Further increase of the bias voltage would invert the surface region of the nanostructure 1. As a result, the nanostructure 1 acts similarly to a pinned photodiode, however, without impurity doping.

The electrical potential of the nanostructure 1 is not constant along the axial direction C1-C2 of the nanostructure 1. This is because the top end of the nanostructure 1 is open and influenced most by the gate bias while the bottom end of the nanostructure 1 is connected to the N-well that has positive bias voltage during reset and holds the bias after reset.

In the substrate, a p-n junction diode may be formed between the p-type substrate and n-well region. A p+ layer covers the n-well surface except the nanostructure 1 junction. This p+ shape allows receiving the photo charges coming from the nanostructure 1 and suppress the dark current due to the surface states of the substrate. Since light passing through the nanostructure 1 can illuminate the substrate diode, photo charges are generated in the substrate diode and collected in the potential well. Consequently, the potential well collects the charges both from the NW and the substrate diode. Compared to conventional CMOS pixels which utilize only a fraction of incident photons, this embodiment can enhance the quantum efficiency by utilizing most of the incident photons.

The n-well of the substrate photo diode is lightly doped so that the n-region can be easily depleted with a low bias voltage. The depleted n-well is preferred for a complete charge transfer from the substrate diode to the sense node when the transfer gate is turned on. Complete charge transfer allows for a low noise readout of the photo charges similar to CCD devices.

Figure 51:
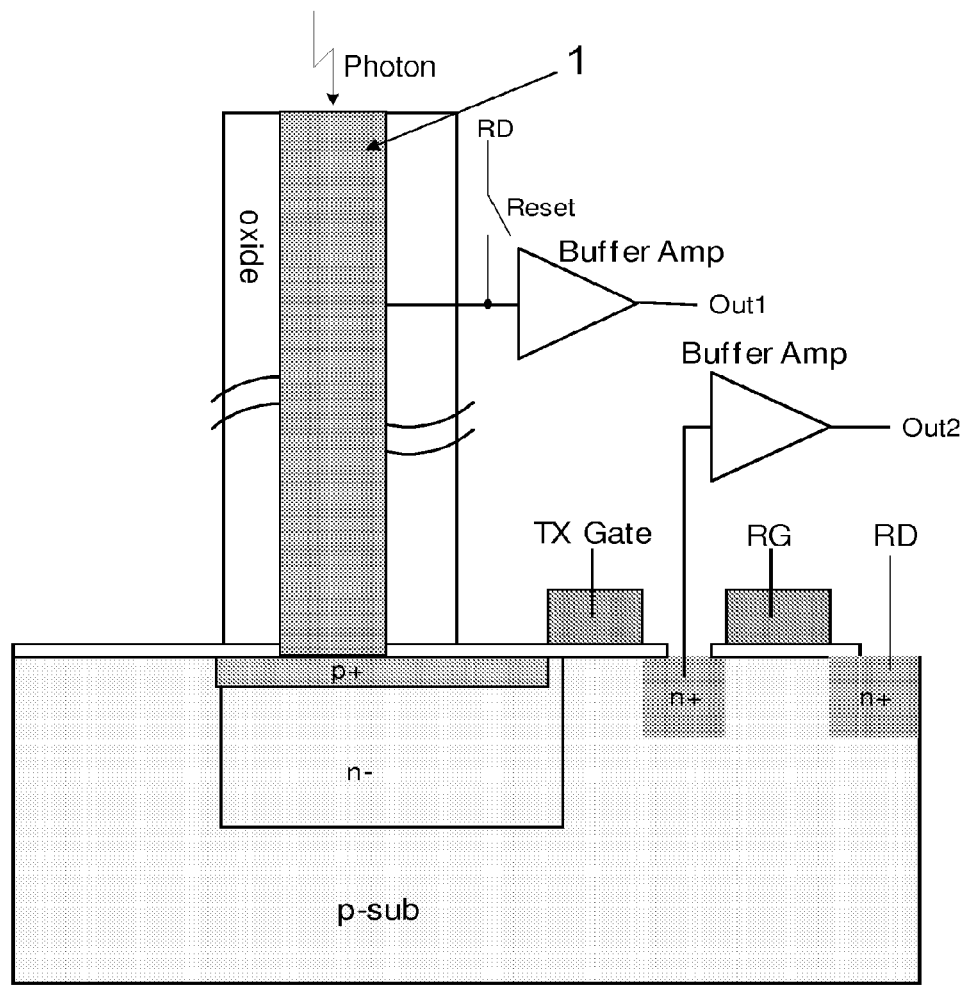
FIG. 51 illustrates a cross section view of an embodiment with a dual photodiode structure in which the p doped NW is coated with an n+ epitaxial layer to form a p-n junction.

The sense node is formed with n+ diffusion in the substrate. The sense node is connected to an amplifying transistor, e.g., a transistor configured as a source follower transistor. A select switch transistor may be used to control the connection of the amplifier output to an output node. A reset transistor may also be connected to the sense node so that sense node is biased to VDD when the reset gate is activated. When the transfer gate is activated, the n-well is electrically connected to the sense node. Then, the n-well becomes positively biased and a potential gradient in the nanostructure 1 is established between the n-well potential and the vertical photogate bias voltage. FIG. 51 shows a cross section view of a dual photodiode structure.

Figure 52:
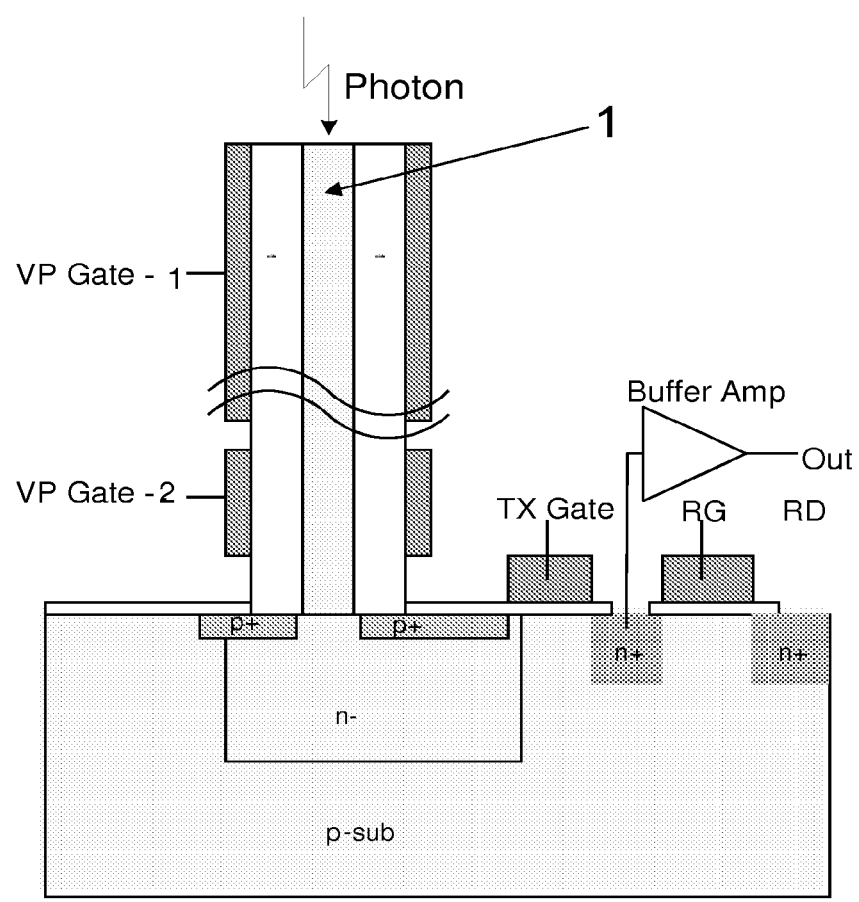
FIG. 52 illustrates an embodiment of a CMOS pixel with a nanowire structured photogate detector.

FIG. 52 shows an embodiment of a CMOS pixel with a nanostructure 1. This embodiment includes two vertical photogates (VP Gate1, VP Gate 2) around the NW, a substrate photodiode, and a readout circuit. The readout circuit includes a transfer gate (TX), a reset gate (RG), a source follower transistor, and a pixel select switch. The buffer amplifier in FIG. 52 represents the source follower transistor and the pixel select switch for simplification. In this embodiment, an upstanding nanowire is formed with an n−, i.e. lightly doped n-type or an intrinsic semiconductor so that the nanostructure 1 can be easily depleted with a low negative bias voltage from VP Gate 1. Preferably, a negative bias voltage from the vertical photogate VP Gate 1 could cause accumulation of holes at the surface of the nanostructure 1 to suppress dark current due to the surface states of the nanostructure 1 as illustrated in the FIG. 50.

The second vertical photogate VP Gate 2 could be an on/off switch. This switch could be configured to separate the photo charges generated in the nanostructure 1 from the photo charges integrated in the substrate photodiode. Photo charges are integrated in both the nanostructure 1 and substrate photodiode at the same time. The photo charges, however, are integrated in separate potential wells because the off-state of the second photogate VP Gate 2 forms a potential barrier between the NW and substrate photodiode. In this manner, signal from the nanostructure 1 and the substrate photodiodes do not mix together. These two photodiodes can be used to collect charges created by radiations of different wavelengths.

The vertical photogates implemented in this embodiment allow the ability to easily modify the potential profile in the nanostructure 1 without using a complicated ion implantation process. The conventional photogate pixel suffers from very poor quantum efficiency and poor blue response. The conventional photogate is normally made of polysilicon which covers the top surface of the substrate photodiode and absorbs short wavelengths near the blue light, thereby reducing the blue light reaching the photodiode. The vertical photogate, in contrast, does not block the light path. This is because the vertical photogate (VPG) does not lie laterally across the photodiode to control the potential profile in the semiconductor.

Additionally, as the pixel size of the image sensors scales down, the aperture size of the image sensor becomes comparable to the wavelength of light propagated. For a conventional planar type photodiode, this results in poor quantum efficiency (QE). The combination of a VPG structure with nanostructure 1, however, allows for an ultra small pixel with good QE.

The pixel of the present embodiment uses a two step process to read out the signals separately between the nanostructure 1 and substrate photodiodes. In the first step, the signal charges in the substrate photodiodes are read out. Then, the n− region in the substrate is depleted. In the second step, the second photogate VP Gate 2 may be first turned on. Next, the signal charges in the nanostructure 1 are read out.

A device of this embodiment may be operated in a "snapshot" operation. In a "snapshot" operation, preferably all of the photogates VP gate 2 in the pixel array are turned on or off at the same time. The same could be true for the transfer gate TX. To accomplish this, the second photogate VP Gates 2 are all connected with a global connection. Further, all the transfer gates TX are connected with a second global connection.

Generally, global operation of the reset gate RG should be avoided for practical reasons. In a pixel array, it is a common practice to globally reset the array row by row. If the snapshot operation is not used, individual pixel operation is possible. In this case, it is not necessary to have global connections.

Figure 53:
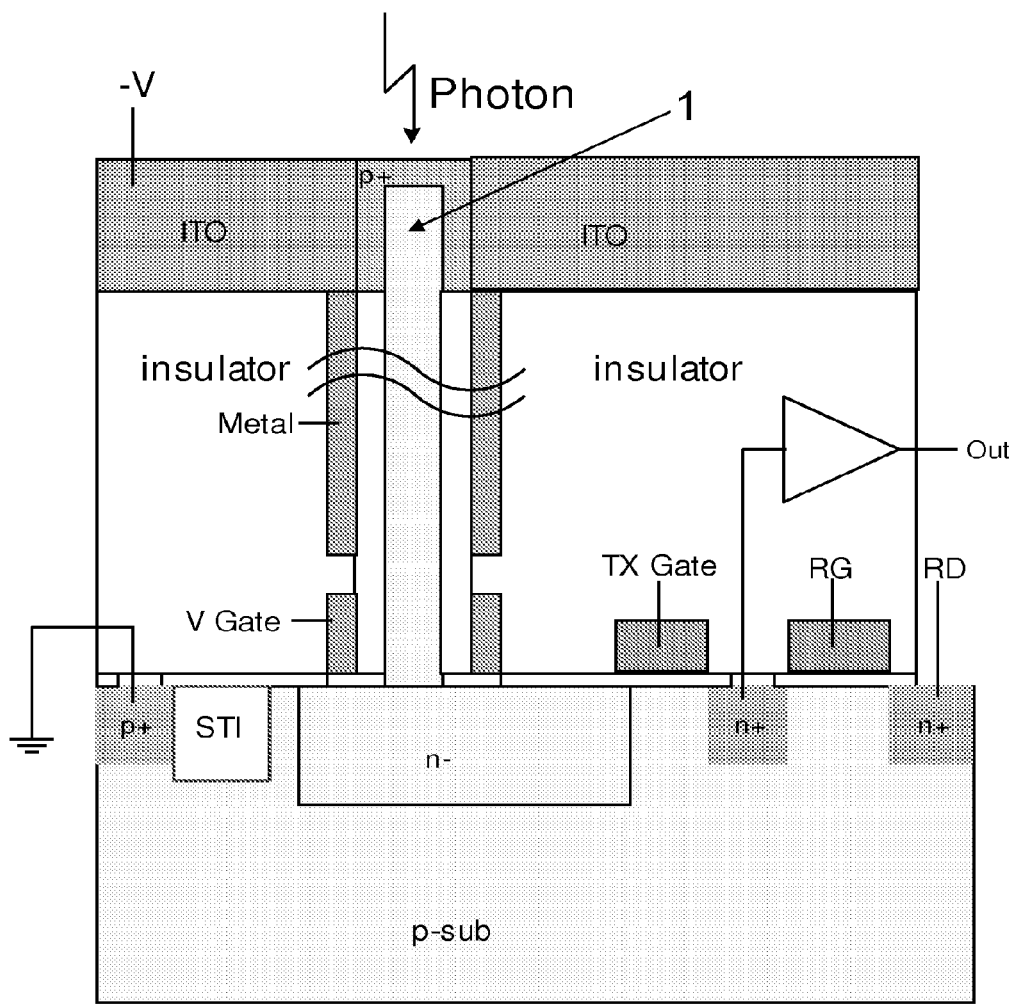
FIG. 53 illustrates an embodiment of a CMOS active pixel with nanowire structured p-i-n photodiodes and vertical photogates around the NR.
Figure 54:
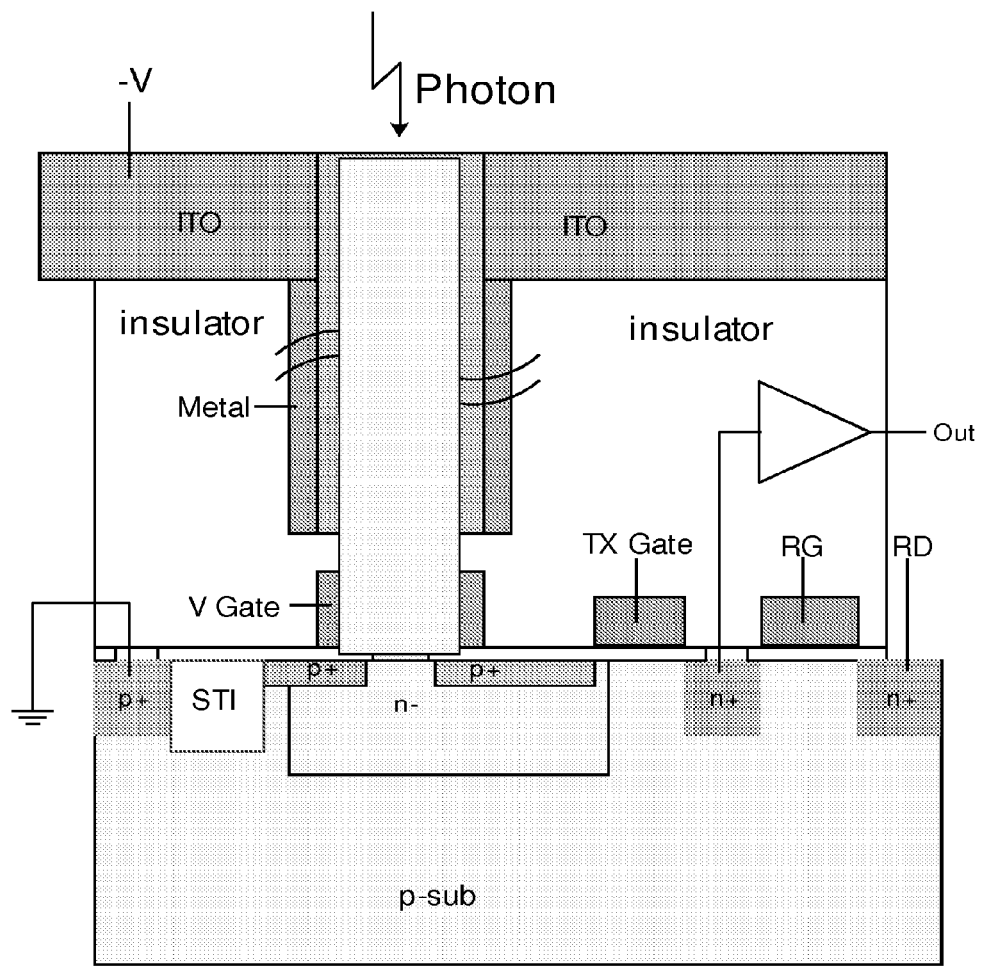
FIG. 54 illustrates another embodiment of a CMOS active pixel with nanowire structured p-i-n photodiodes and vertical photogates around the NR.

FIG. 53 and FIG. 54 show embodiments of CMOS active pixels with nanowire structured p-i-n photodiodes and vertical photogates around the nanostructure 1. The nanostructure 1 can have one or more vertical photogates comprising epitaxially grown layers such as conductive layers and metal layers.

In one embodiment such as that shown in FIG. 53, the pixel could include two photodiodes, a nanostructure 1 photodiode and a substrate photodiode. This embodiment also includes two vertical photogates (VP Gate1, VP Gate 2), a transfer gate (TX) and a reset gate (RG). Preferably, both of the photodiodes are lightly doped. This is because a lightly doped region can be easily depleted with a low bias voltage.

The surface region of the substrate photodiode could be prone to defects due to process induced damage caused during fabrication and to lattice stress associated with the nanostructure 1. These defects may serve as a source for dark current.

Preferably, the substrate is connected to ground, that is, zero voltage. In this embodiment, the reset drain is preferably doped n+ and is positively biased. When the transfer gate TX and reset gate are on, the n− region in the substrate becomes positively biased. This reset operation results in the n− region being depleted due to a reverse bias condition between the p substrate and n− region. When the transfer gate TX and reset gate RG are off, the n− region retains its positive bias, forming a floating capacitor with respect to the p-sub region.

The first vertical photogate VP Gate 1 could be configured to control the potential in the nanostructure 1 so that a potential gradient can be formed between the NW photodiode and the substrate photodiode. In this way, photo charges in the nanostructure 1 can drift quickly to the n− region of the substrate during readout. The second vertical photogate VP Gate 2 could be an on/off switch.

Figure 55:
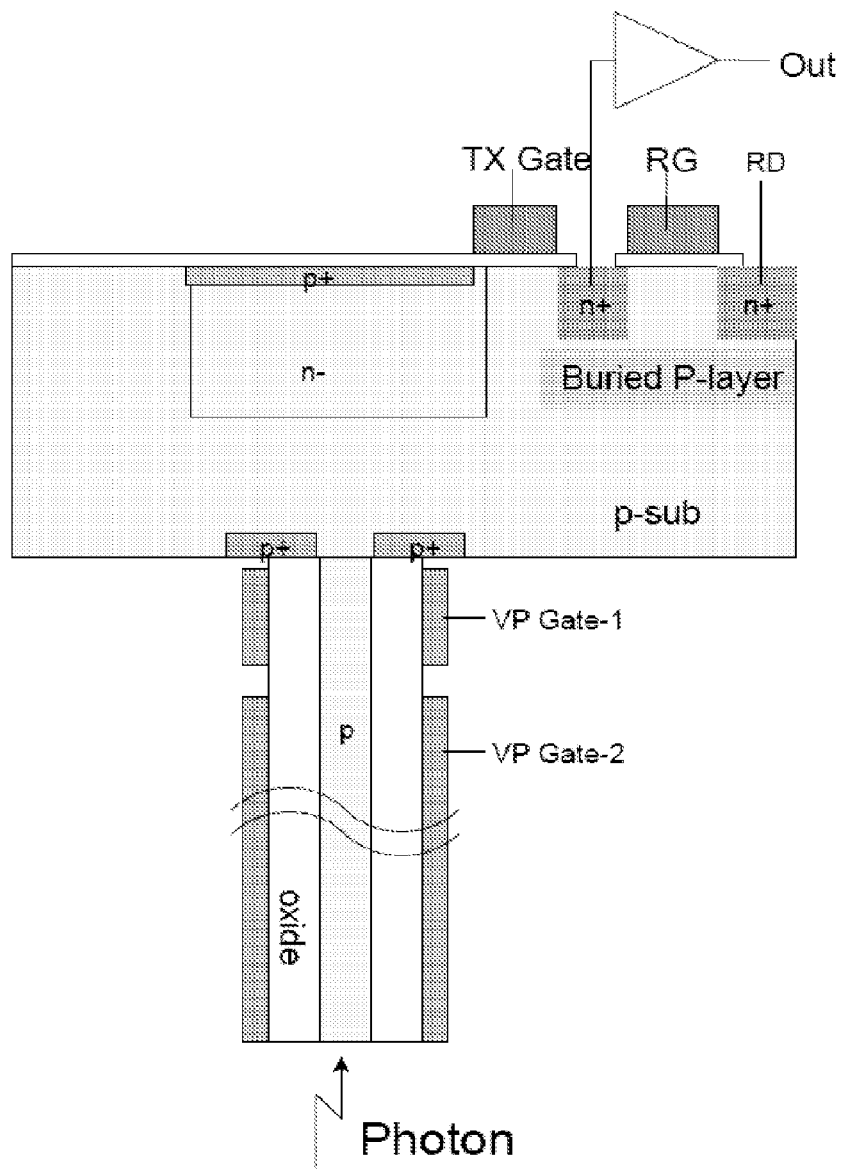
FIG. 55 illustrates an embodiments of a back-side illuminated image sensor.
Figure 56:
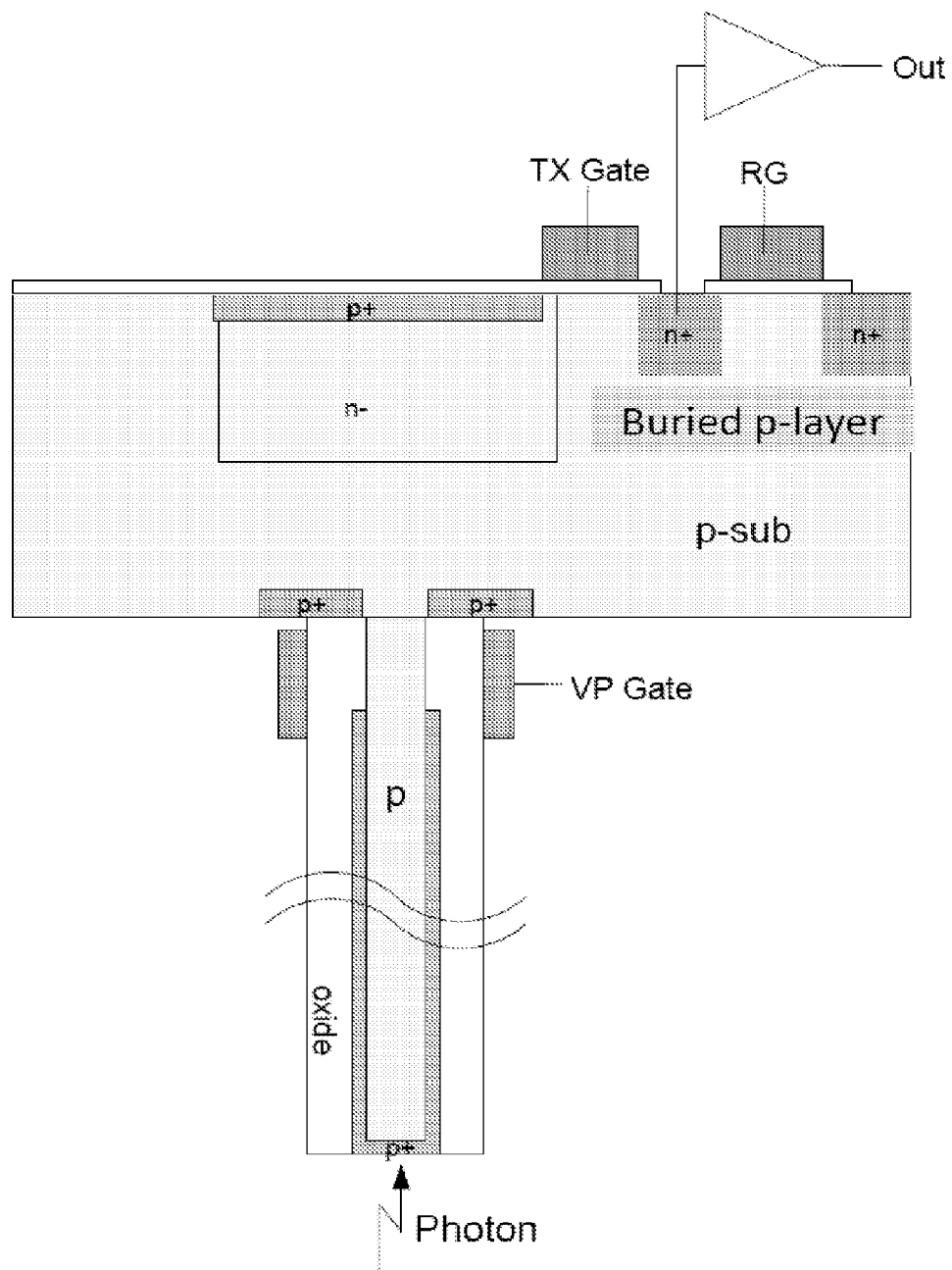
FIG. 56 illustrates an embodiments of another back-side illuminated image sensor.

FIG. 55 and FIG. 56 show embodiments of back-side illuminated image sensors. The nanostructure 1 could be formed at the back side of a p-substrate. The substrate may be thinned by removing semiconductor substrate material over the area containing the pixel array. For example, a p-substrate can be thinned to a thickness between 3 and 50 microns, more preferably, between 6 and 20 microns. The substrate photodiode could now get all of its light from the back-side and not from the side containing all the metal lines as in conventional image sensors.

The front side could include a 4-T readout circuit including a transfer gate TX, a reset switch with a reset gate RG, a source follower amplifier, and a select switch. The readout circuits also could be configured as a 3-T pixel circuit including, a reset switch with a reset gate RG, a source follower amplifier, and a select switch. In the front side, a substrate photodiode may be formed with a shallow p+ layer as shown in FIG. 55 and FIG. 56. The purpose of having p+ at both sides of the substrate is to suppress dark current. A buried p layer could be placed underneath the n+ diffusion layer to block incoming charge flow from the backside and deflect the charges toward the n− region. Preferably, doping of the buried p layer is higher than that of the p− substrate, but not as high as that of the p+ layer. The front side photodiode is not for photo absorption, but rather for collecting the charges coming from the nanostructure 1 and from the backside p− substrate where photon absorption takes place. The nanostructure 1 could have a dielectric layer (cladding layer) surrounding the NW and two vertical photogates, one for the switch and the other for controlling the potential in the NW.

Typically, in the embodiments of FIG. 55 and FIG. 56, a two step process is used to read out the signal charges separately from each of the photodiodes. The first step would be to read out the charges from the substrate diode at the front side. Immediately after this, by turning on the VP Gate 1, the charges from the nanostructure 1 would be read out.

Preferably, the embodiments of FIG. 55 and FIG. 56 should have a shallow p+ layer at the backside substrate with a hole in the center so that the p+ layer does not block the charges coming from the backside nanostructure 1. Also, preferably, at the front side there should be a lightly doped n-well or n− layer underneath the shallow p+ layer so that n-well could be easily depleted.

FIG. 56 shows an alternative embodiment of a backside illuminated CMOS pixel. In this embodiment, instead of having vertical photogate for the nanostructure 1, the p+ layer could be coated at the outer shell of the NW to help create a built-in electric field in the nanostructure 1. With this configuration, photo charges can easily drift in the upward direction. The features of the back-side illumination CMOS pixel are similar to those of the pixel of FIG. 55.

Figure 57A:
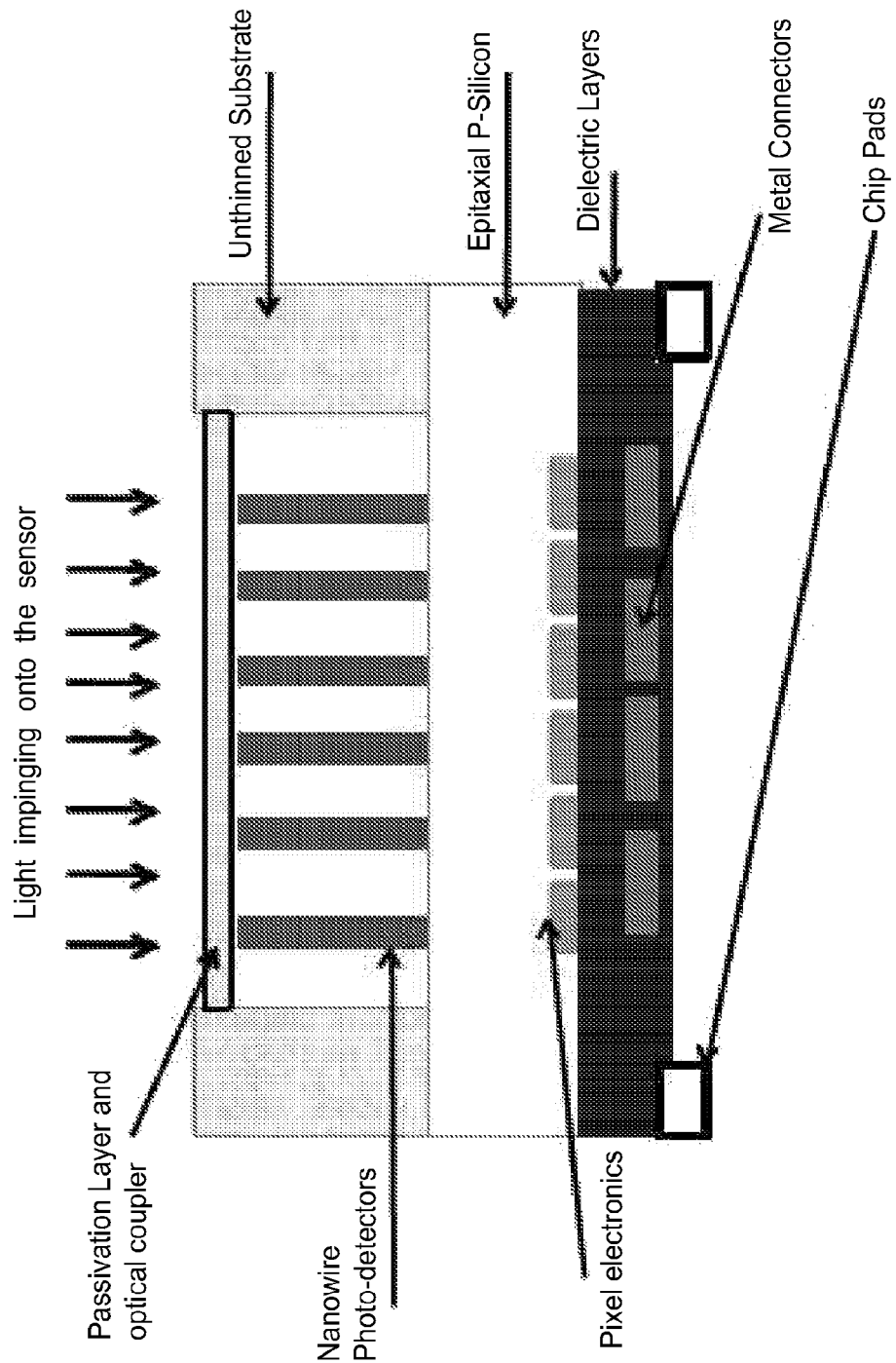
FIG. 57A and FIG. 57B show illustrative embodiments of a cross-sectional view of a waveguide structure, such as a nanowire, containing backside-illuminated image sensor with nanowires located on the backside of the image sensor.
Figure 57B:
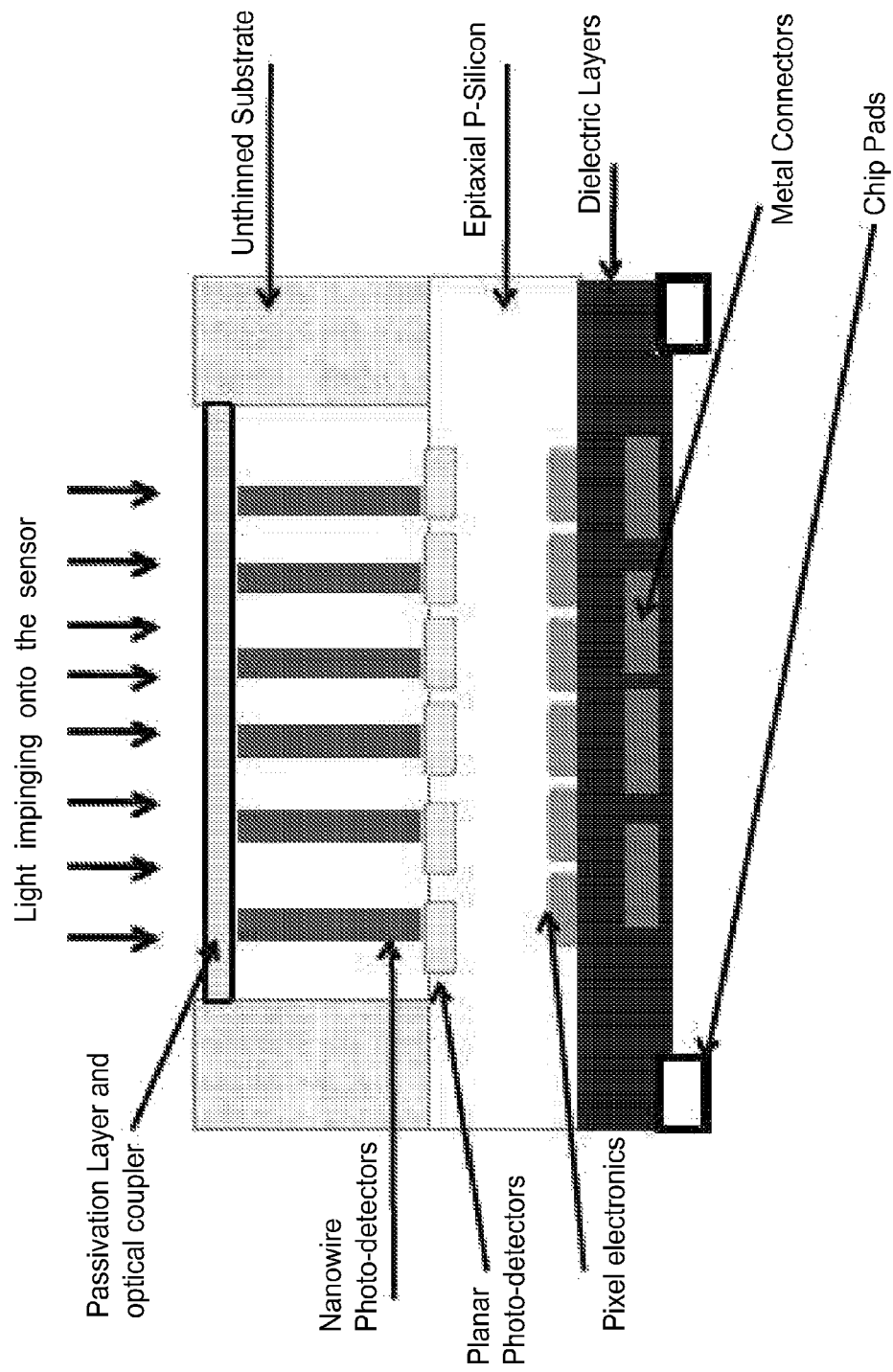
Figure 58A:
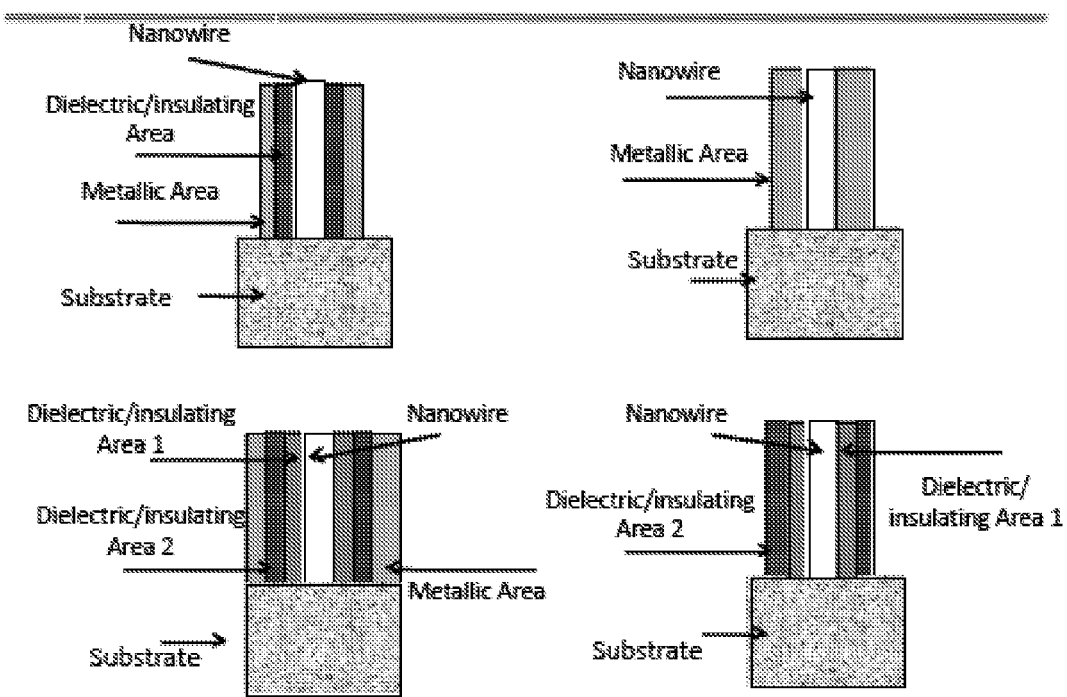
FIG. 58A and 58B show illustrative embodiments of different back side illuminated image sensors having photodiodes therein.
Figure 58B:
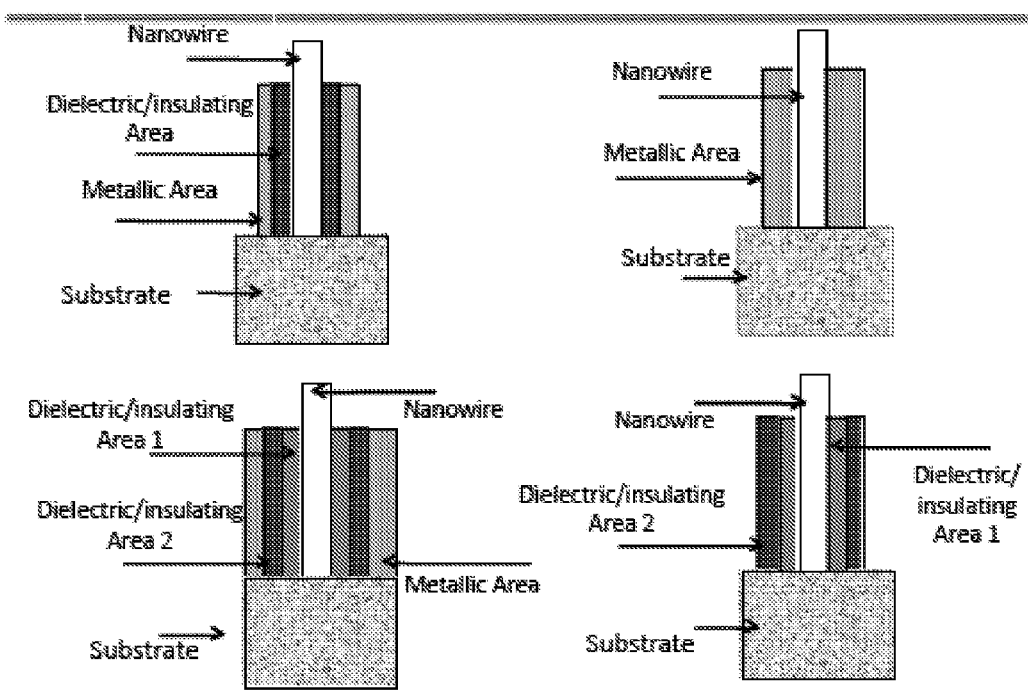

FIG. 57A is an embodiment showing nanostructures 1 on the back-side of a fully processed wafer containing substrate photodiodes. FIG. 57B is an embodiment showing nanostructures 1 on the back-side of a fully processed wafer containing substrate photodiodes. The substrate photodiodes absorb the radiation that was not allowed to propagate in the nanowires. Examples of the structures of the backside thinned image sensor having photodiodes therein are shown in FIGS. 58A and 58B.

The foregoing detailed description has set forth various embodiments of the devices and/or processes by the use of diagrams, flowcharts, and/or examples. Insofar as such diagrams, flowcharts, and/or examples contain one or more functions and/or operations, it will be understood by those within the art that each function and/or operation within such diagrams, flowcharts, or examples can be implemented, individually and/or collectively, by a wide range of hardware, software, firmware, or virtually any combination thereof.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation.

The subject matter described herein sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

All references, including but not limited to patents, patent applications, and non-patent literature are hereby incorporated by reference herein in their entirety.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

We claim:

1. A device comprising:
a substrate;
one or more of a nanostructure extending essentially perpendicularly from the substrate;
wherein the nanostructure comprises a core of a doped semiconductor of a first type, a first layer comprising a lightly doped amorphous semiconductor or an intrinsic amorphous semiconductor, and a second layer comprising a heavily doped amorphous semiconductor layer of a second type opposite from the first type, wherein the first layer is disposed on the core and the second layer is disposed on the first layer;
wherein the first layer passivates at least a surface of the core;
wherein the first layer is disposed on an end surface of the core away from the substrate;
wherein an entirety of the first layer and an entirety of the second layer are coextensive with the core in at least a direction parallel to the substrate.

2. The device of claim 1, wherein sidewalls of the core are at least partially covered by an electrically insulating layer.

3. The device of claim 1, wherein the core comprises one or more doped semiconductor material selected from the group consisting of doped silicon, doped germanium, doped III-V group compound semiconductor, doped II-VI group compound semiconductor, and doped quaternary semiconductor; wherein the first layer comprises one or more intrinsic amorphous semiconductor material selected from the group consisting intrinsic amorphous silicon, intrinsic amorphous germanium, intrinsic amorphous III-V group compound semiconductor and intrinsic amorphous II-VI group compound semiconductor; and wherein the second layer comprises one or more heavily doped amorphous semiconductor material selected from the group consisting heavily doped amorphous silicon, heavily doped amorphous germanium, heavily doped amorphous III-V group compound semiconductor and heavily doped amorphous II-VI group compound semiconductor.

4. The device of claim 1, wherein the core is lightly doped.

5. The device of claim 1, wherein the first layer has a thickness of about 2 nm to about 100 nm.

6. The device of claim 1, wherein the second layer has a thickness of at least about 10 nm.

7. The device of claim 1, wherein the second layer, the first layer and the core form a p-i-n junction.

8. The device of claim 1, wherein the nanostructure is a nanowire or a nanoslab.

9. A method of manufacturing the device of claim 1, comprising depositing the first layer on the core by atomic layer deposition (ALD) or chemical vapor deposition (CVD); and depositing the second layer on the first layer by ALD or CVD.

10. The device of claim 1, wherein the heavily doped amorphous semiconductor layer has doping levels merged into an impurity band.

11. The device of claim 1, wherein the heavily doped amorphous semiconductor layer does not show an increase in conductivity with temperature.

12. The device of claim 1, wherein the first layer eliminates dangling bonds on the at least surface of the core.

* * * * *